(12) United States Patent
Sasaki et al.

(10) Patent No.: US 7,482,699 B2
(45) Date of Patent: Jan. 27, 2009

(54) SEMICONDUCTOR DEVICE

(75) Inventors: Toshio Sasaki, Mizuho (JP); Fujio Ito, Hanno (JP); Hiromichi Suzuki, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 556 days.

(21) Appl. No.: 10/516,417

(22) PCT Filed: May 16, 2003

(86) PCT No.: PCT/JP03/06151

§ 371 (c)(1),
(2), (4) Date: Jul. 22, 2005

(87) PCT Pub. No.: WO03/105226

PCT Pub. Date: Dec. 18, 2003

(65) Prior Publication Data
US 2006/0186528 A1 Aug. 24, 2006

(30) Foreign Application Priority Data
Jun. 5, 2002 (JP) ............................. 2002-163743

(51) Int. Cl.
H01L 23/48 (2006.01)
H01L 23/52 (2006.01)
H01L 29/40 (2006.01)

(52) U.S. Cl. .................... 257/784; 257/670; 257/672; 257/734; 257/690; 257/779; 257/780; 257/E23.092; 257/E23.01; 257/E23.011

(58) Field of Classification Search .............. 257/666, 257/670, 672, 673, 690, 734, 779, 780, 781, 257/784, 694, 695, E23.042, E23.01, E23.011, 257/E33.066

See application file for complete search history.

(56) References Cited

U.S. PATENT DOCUMENTS

| 6,265,760 B1 * | 7/2001 | Inaba et al. ................. 257/666 |
| 6,396,142 B1 | 5/2002 | Ito et al. ..................... 257/712 |
| 6,476,506 B1 * | 11/2002 | O'Connor et al. ........... 257/786 |
| 2002/0053729 A1 | 5/2002 | Takikawa et al. ............ 257/690 |

FOREIGN PATENT DOCUMENTS

| JP | 5-243472 | 9/1993 |
| JP | 6-37131 | 2/1994 |
| JP | 6-252328 | 9/1994 |
| JP | 9-252072 | 9/1997 |
| JP | 11-54658 | 2/1999 |
| JP | 11-168169 | 6/1999 |
| JP | 2002-190488 | 7/2002 |
| JP | 2002-270723 | 9/2002 |

* cited by examiner

*Primary Examiner*—Phuc T Dang
*Assistant Examiner*—Thanh Y Tran
(74) *Attorney, Agent, or Firm*—Miles & Stockbridge P.C.

(57) ABSTRACT

The present invention can supply power for each circuit section by separating and connecting bus-bar (21d) for each circuit section inside the semiconductor chip (22), and, in addition, can increase the number of pads (22a) for power supply or can use the lead (21a) conventionally used for power supply for signals by further making the best of the characteristics that enable the connection to bus-bar (21d) irrespective of the inner lead (21b) pitch, by making the pitch of the pad (22a) smaller than the pitch of the inner lead (21b), or by forming the pad (22a) in a zigzag arrangement.

12 Claims, 73 Drawing Sheets

FIG. 52

| CONNECTION | | CONNECTION | | CONNECTION | | CONNECTION | |
|---|---|---|---|---|---|---|---|
| PRIMARY SIDE | SECON-DARY SIDE | PRIMARY SIDE | SECON-DARY SIDE | PRIMARY SIDE | SECON-DARY SIDE | | |
| (1) | 1 | (21) | 97 | (40) | 33 | | |
| (2) | 2 | 97 | 17 | (41) | 34 | | |
| (3) | 3 | (22) | 18 | (42) | 35 | · · · | · · · |
| (4) | 4 | (23) | 19 | (43) | 98 | | |
| (5) | 5 | (24) | 20 | (44) | 25 | | |
| (6) | 6 | (25) | 21 | 98 | 36 | | |
| (7) | 97 | (26) | 22 | (45) | 37 | | |
| (8) | 1 | (27) | 23 | (46) | 38 | | |
| (9) | 7 | (28) | 97 | (47) | 39 | | |
| (10) | 8 | (29) | 1 | (48) | 40 | | |
| (11) | 9 | (30) | 25 | (49) | 98 | | |
| (12) | 10 | (31) | 26 | (50) | 25 | | |
| (13) | 11 | (32) | 27 | (51) | 41 | | |
| (14) | 97 | (33) | 28 | (52) | 42 | | |
| (15) | 1 | (34) | 29 | (53) | 43 | | |
| (16) | 12 | (35) | 30 | (54) | 44 | | |
| (17) | 13 | (36) | 98 | (55) | 45 | | |
| (18) | 14 | (37) | 25 | (56) | 98 | | |
| (19) | 15 | (38) | 31 | (57) | 25 | | |
| (20) | 16 | (39) | 32 | (58) | | | |

SEMICONDUCTOR DEVICE

TECHNICAL FIELD

The present invention relates to a semiconductor device using a bus-bar or ring-form bus-bar, and specifically to the layout of a semiconductor chip and arrangement of the bus-bar or ring-form bus-bar.

BACKGROUND ART

With respect to a BGA (Ball Grid Array) type semiconductor device using a multilayer wiring circuit board, in, for example, Japanese Patent Application Laid-Open Publication No. 2002-190488 or Japanese Patent Application Laid-Open Publication No. 2002-270723, such semiconductor device is mentioned, and has been adopted as a multi-pin semiconductor device having 100 pins or more, but the multilayer wiring circuit board with the fine processing provided costs high and provides low total cost performance.

In addition, a CSP (Chip Size Package) type semiconductor device using a tape wiring circuit board that has single-layer wiring is mentioned in, for example, Japanese Patent Application Laid-Open Publication No. 11-54658, and has been adopted as a small-size semiconductor device nearly equal to the conventional chip sizes, but since it has a configuration difficult to form common electrodes for power supply/GND, etc., it has a problem that the number of external terminals increases as the number of electrodes of the semiconductor chip increases. Consequently, the increase of the number of chip electrodes traded off for an increased size of the package dimensions as a result of increased number of pins, causing a large restriction to the number of chip electrodes and a low total cost performance.

The inventors investigated the construction of a semiconductor device which provides higher total cost performance than that of these conventional BGA/CSPs.

In addition, the present applicant made investigations with the first viewpoint "head ends of a plurality of leads are connected" and with the second viewpoint "a bar that connects to the power supply or GND is installed between a plurality of leads and chips" on the basis of the invented results. As a result, the inventors found Japanese Patent Application Laid-Open Publication No. 9-252072 (Paragraph 20, FIG. 8 and FIG. 9) for the first viewpoint as well as Japanese Patent Application Laid-Open Publication No. 11-168169 (Paragraph 61, FIG. 3) for the second viewpoint. However, in these documents, today, it is said that BGA and CSP are suited for increased pins of external terminals associated with increased sophistication of the current IC (Integrated Circuit), but nothing is discussed about the problem that the present application is to solve, that is, to cope with many pins at low cost and high quality. In addition, nothing is investigated about the problem of power supply drop of extended wiring of the internal power voltage and the combination of packages, either.

It is an object of the present invention to provide a semiconductor device which improves the cost performance.

It is the other object of the present invention to provide a semiconductor device which can miniaturize the product.

It is another object of the present invention to provide a semiconductor device which can shorten the time (TAT: Turn Around Time) required before product shipment.

It is still another object of the present invention to provide a semiconductor device which can achieve an increased number of pins.

Other new features and advantages of the invention will be apparent from the following description taken in connection with the accompanying drawings.

DISCLOSURE OF THE INVENTION

The present invention comprises a semiconductor chip which has a main surface, a rear surface, and a plurality of electrodes formed on the main surface, a plurality of inner leads arranged around the semiconductor chip, a plurality of outer leads formed integral with the plurality of inner leads, respectively, a plurality of bonding wires which connect the plurality of electrodes and the plurality of inner leads, respectively, and a resin encapsulated material which encapsulates the semiconductor chip, the plurality of inner leads, and the plurality of bonding wires, wherein the portion in which the plurality of inner leads and the plurality of bonding wires are connected are arranged in a zigzag pattern, and the portion in which the plurality of inner leads and the plurality of bonding wires are connected is fixed to the substrate encapsulated inside the resin encapsulated material via an adhesive layer.

In addition, the present invention comprises a first circuit section formed to be including a transistor which has a current passage between the first potential and the second potential, a second circuit section formed to be including a transistor which has a current passage between the third potential and the fourth potential, a first pad that supplies the first potential to the first circuit section, a second pad that supplies the second potential to the first circuit section, a third pad that supplies the third potential to the second circuit section, a fourth pad that supplies the fourth potential to the second circuit section, a chip that contains the first and the second circuit portions, and a first lead which is arranged between a plurality of inner leads and supplies the first potential to the first circuit section.

BRIEF DESCRIPTION OF THE DRAWINGS

FIG. 52 is a table showing wire connection correspondence indicating one example of the connection condition when the lead frame shown in FIG. 51 is used;

BEST MODE FOR CARRYING OUT THE INVENTION

Figure 1:
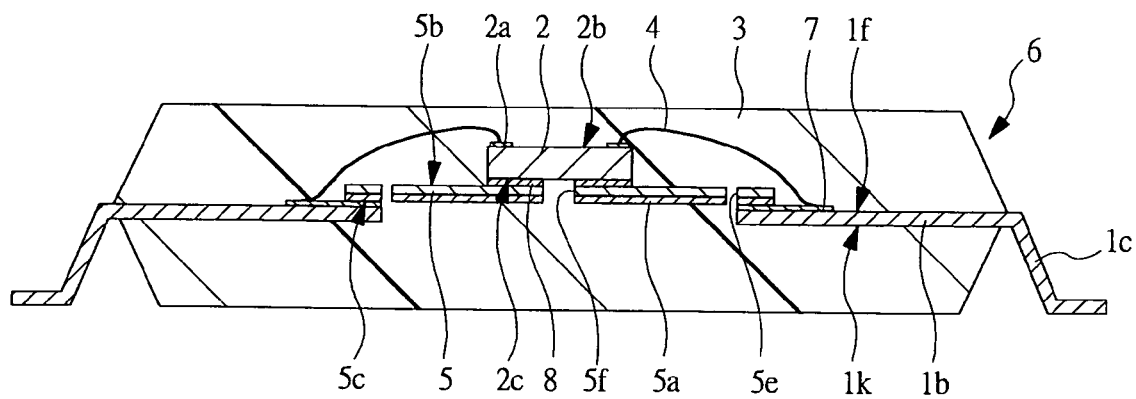
FIG. 1 is a cross-sectional view indicating one example of the minimum-size chip mounted construction in a semiconductor device (QFP) of embodiment 1 according to the present invention.

Referring now to the drawings, embodiments according to the present invention will be described in detail hereinafter.

In the following embodiments, description will be made by dividing multiple sections or embodiments, if required for convenience, but unless otherwise specified, they are not unconnected one another but one is the others' part or whole modified example, detail, supplementary explanation, and others.

In addition, in the following embodiments, when the number of elements, etc. (including the quantity, numerical value, amount, range, and others) is referred, except for the cases in which it is particularly specified or in principle, it is apparently restricted to a specific number, it shall not be restricted to the specific number and may be greater than and smaller than the specific number.

Furthermore, in the following embodiments, it is needless to say that the component elements (including element step, and others) are not always mandatory except for the case when it is particularly specified and when it is apparently mandatory, in principle.

Similarly, in the following embodiments, when the shape, positional relationship, and others of component elements, etc. are referred, unless otherwise specified or except for the case in which they are apparently not related in principle, component elements practically similar to or analogous to the shape and others shall be included. This same applies to the numerical value and the range mentioned above.

In addition in all the drawings for explaining the embodiment, like reference characters designate like or corresponding parts throughout and the repetitive explanation will be omitted.

Embodiment 1

A semiconductor device according to embodiment 1 is of a resin encapsulated type and is assembled by the use of lead frame 1, and in the present embodiment 1, as one of the examples of this semiconductor device, QFP (Quad Flat Package) 6 with a relatively large number of pins is taken up and explained.

First of all, explanation is made on the configuration of QFP 6 shown in FIG. 1. QFP 6 comprises a plurality of inner leads 1b extending to the vicinity of a semiconductor chip 2 and semiconductor chip 2; a tape member 5 bonded to the leading end section of relevant inner leads 1b; bonding wire 4 for electrically connecting a pad 2a which is a surface electrode formed on the main surface 2b of the semiconductor chip 2 and a inner lead 1b corresponding to this; an encapsulated section (also called a resin encapsulated material) 3 formed by encapsulating the semiconductor chip 2 and a plurality of wires 4, and the tape member 5 with resin; and a plurality of outer leads 1c which is connected to the inner lead 1b and is an external terminal protruded from the encapsulated section 3 to the outside in four directions, and this outer lead 1c is bent in a form of gull-wing.

Furthermore, in QFP 6, the tape member 5 is bonded to a wire connected surface 1f which is the main surface of each inner lead 1b, and on the upper side of the inner lead 1b, the tape member 5 is arranged. This tape member 5 has a shape corresponding to the inner lead 1b row and consequently, in QFP 6, the tape member 5 is formed in a quadrangle.

In addition, the tape member 5 is of insulative, and is bonded to the leading end section of each inner lead 1b via an adhesive layer 5a formed on this tape member 5. The adhesive layer 5a is formed, for example, by acrylic adhesive and others.

In addition, the tape member 5 has a chip mounting function, and the semiconductor chip 2 is fixed via silver paste 8 to the chip bearing surface 5b of a region surrounded by the leading end section of each inner lead 1b.

Consequently, the semiconductor chip 2 is mounted via the silver paste 8 on the chip bearing surface 5b which is the surface opposite to the bonded surface 5c to the inner lead 1b in the tape member 5.

Figure 14:
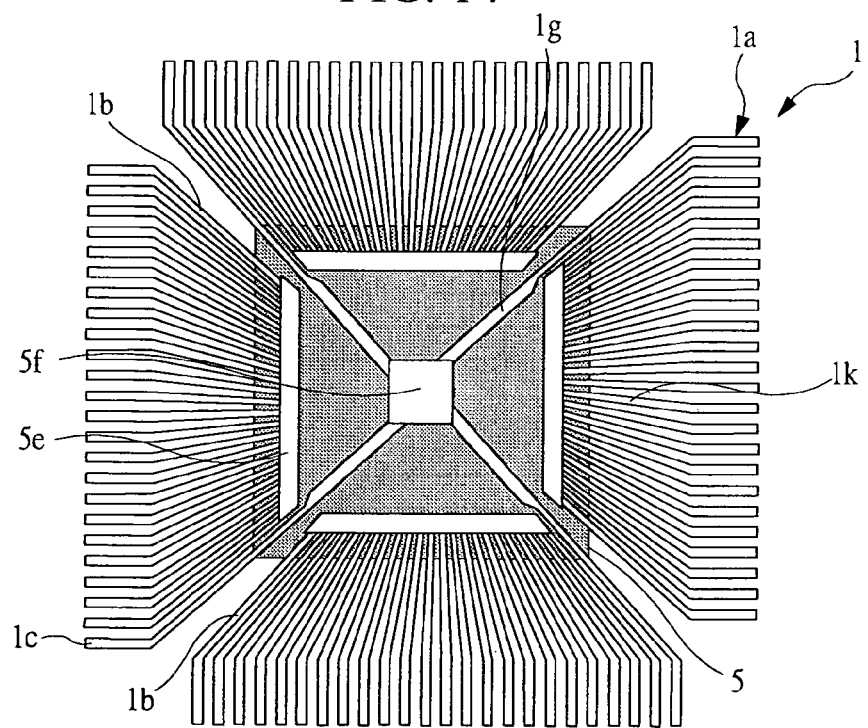
FIG. 14 is a rear view of the lead frame shown in FIG. 13.

By the way, of a plurality of inner leads 1b, to each of the four corners corresponding to corners of the semiconductor chip 2, a corner lead 1g extending to the vicinity of the center of the tape member 5 as shown in FIG. 14 is provided. That is, at the place corresponding to the corner of the semiconductor chip 2, the corner lead 1g is arranged adjacent to a plurality of inner leads 1b group coupled by the first coupling section 1 to match with each side of the semiconductor chip 2.

Consequently, the tape member 5 is supported by these four pieces of corner lead 1g and the semiconductor 2 is mounted on the four pieces of corner lead 1g via the tape member 5 and the silver paste 8.

In addition, to the tape member 5, a first through-hole 5e and a second through-hole 5f are formed as shown in FIG. 1 and FIG. 14. The first through-hole 5e is formed along the direction in row of the inner lead 1b adjacent to the leading end section of each inner lead 1b. Consequently, four pieces of the first through-hole 5e are formed in correspondence to each side of the quadrangular tape member 5.

On the other hand, the second through-hole 5f is formed nearly around the center of QFP 6 and is arranged to a rear surface 2c of the semiconductor chip 2 as shown in FIG. 1.

Further, in the wire connected surface 1f of each inner lead 1b, the region from the leading end section on the inner side to the outside is covered with silver plating 7 for connecting gold wire and other wire 4. Consequently, the silver plating 7 must be plated from the tape member 5 to the outside region, and is plated to the range in which wire-bonding is possible.

By this, in QFP 6 according to the present embodiment 1, the wire 4 is connected to the region covered with the silver plating 7 outside the tape member 5 in the wire connected surface 1f of each inner lead 1b.

Figure 15:
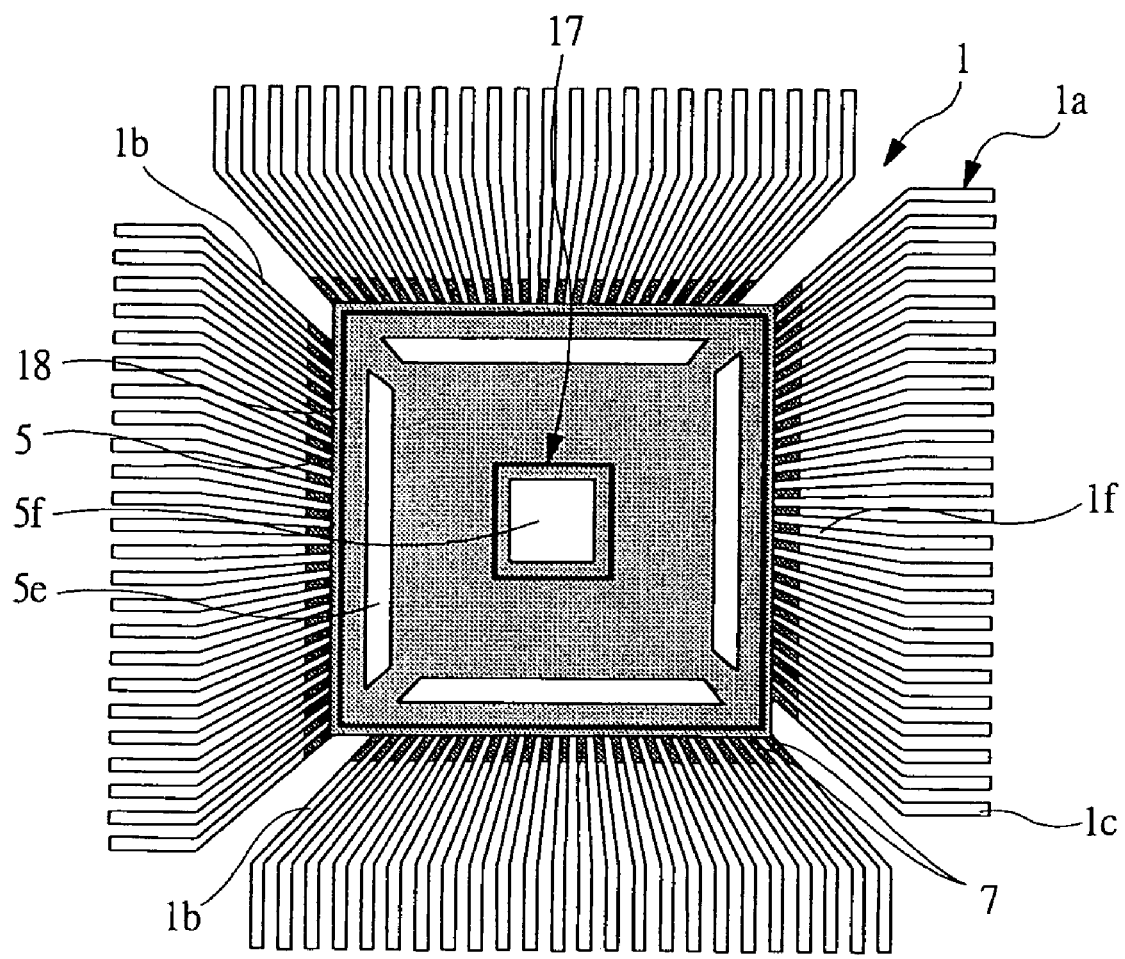
FIG. 15 is a fragmentary plan view indicating the minimum mountable chip size and the maximum mountable chip size of the lead frame shown in FIG. 13.

Meanwhile, in QFP 6, the semiconductor chips 2 of various sizes are able to be mounted on the tape member 5, and the semiconductor ships 2 of various sizes can be mounted in the range as shown in FIG. 15.

Figure 2:
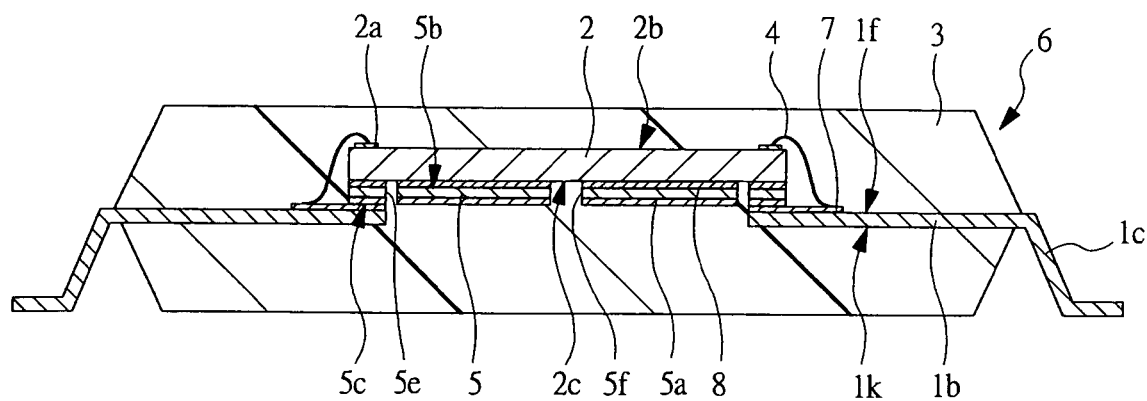
FIG. 2 is a cross-sectional view indicating one example of the maximum-size chip mounted construction in QFP.

Therefore, FIG. 1 is the case in which the minimum mountable size semiconductor chip 2 is mounted, and FIG. 2 is the case in which the maximum mountable size semiconductor chip 2 is mounted.

In this way, in QFP 6 according to the present embodiment 1, semiconductor chips 2 of various sizes can be mounted, thereby improving the versatility of the lead frame 1 shown in FIG. 14.

Then, FIG. 3 through FIG. 6 show the construction of QFP 6, a modified example of the present embodiment 1.

Figure 3:
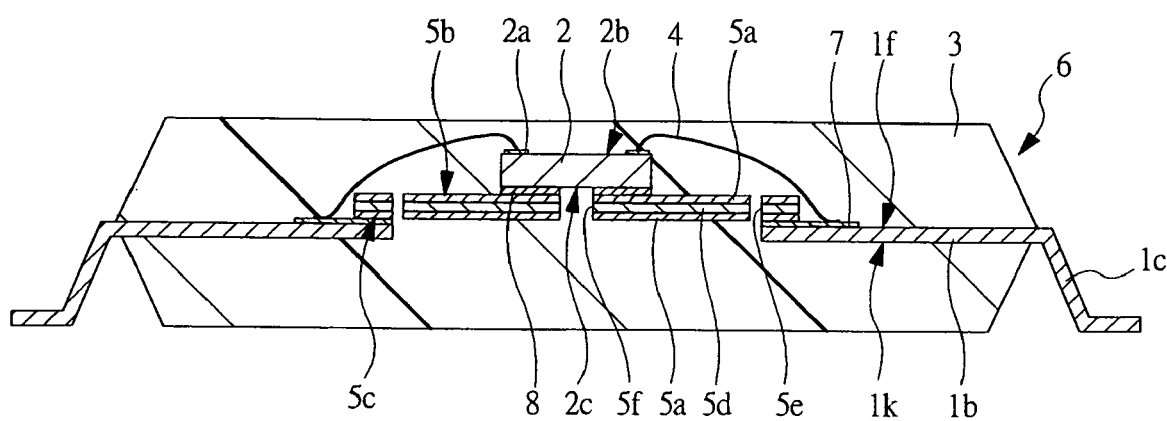
FIG. 3 through FIG. 6 are cross-sectional views respectively indicating a QFP construction of modified examples of embodiment 1 according to the present invention.
Figure 4:
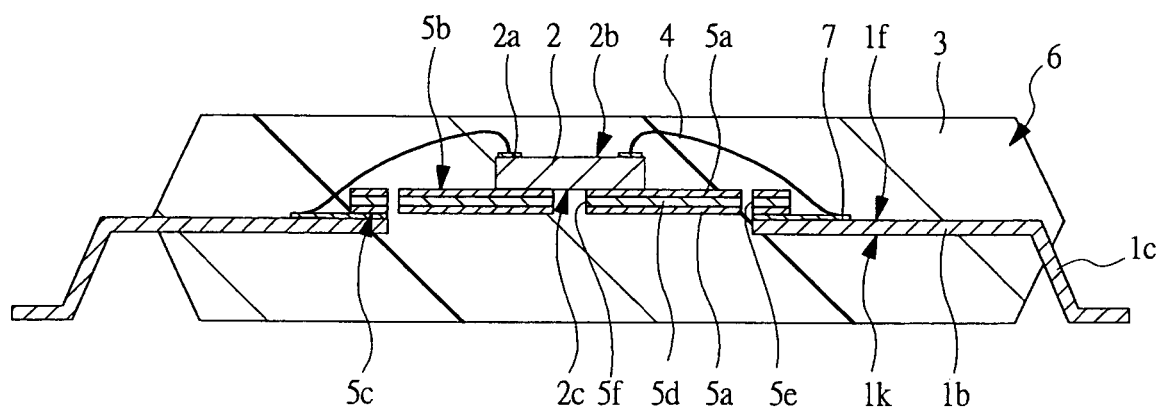

FIG. 3 and FIG. 4 show QFP 6 of a construction with heat spreader 5d mounted in place of the tape member 5 of FIG. 1, and by mounting the heat spreader 5d, heat dissipation capability is improved.

Meanwhile, in QFP 6 shown in FIG. 3, an adhesive layer 5a is installed on both front and rear surfaces of the heat spreader 5d, and the inner lead 1b and the heat spreader 5d are affixed via this adhesive layer 5a, and the semiconductor chip 2 is fixed via the silver paste 8.

As against this, QFP 6 shown in FIG. 4 has the semiconductor chip 2 fixed via the adhesive layer 5a mounted to the heat spreader 5d without using the die-bonding material such as the silver paste 8. That is, via the adhesive layer 5a mounted on one surface of the heat spreader 5d, the inner lead 1b and the heat spreader 5d are bonded, and further, the semiconductor chip 2 is fixed via the adhesive layer 5a provided on the other surface.

Figure 5:
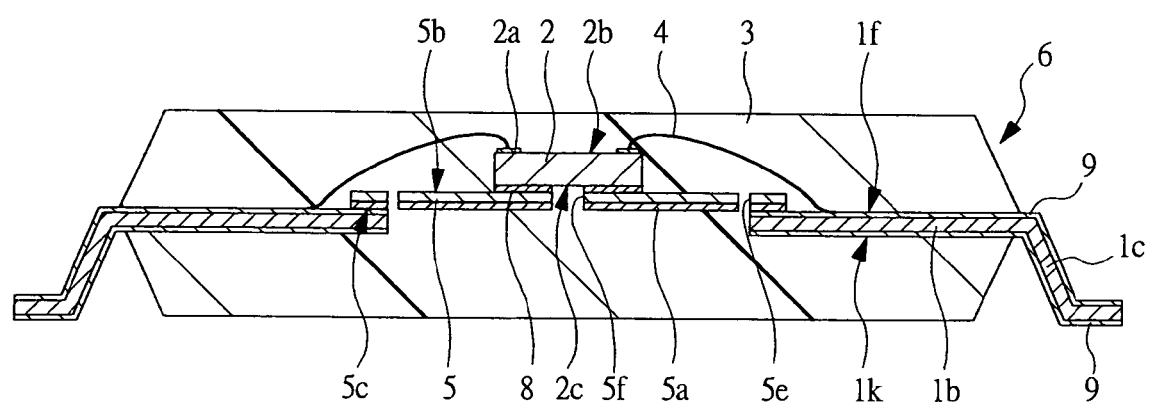

In addition, FIG. 5 is QFP 6 on the surface of which is covered with palladium plating 9 except the cut surfaces of each inner lead 1b or each outer lead 1c.

Figure 6:
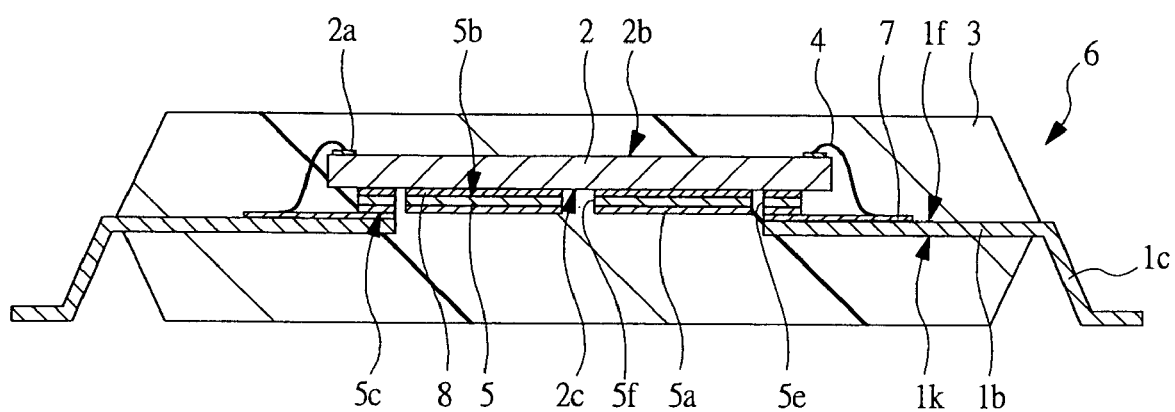

In addition, FIG. 6 indicates a construction in which the semiconductor 2 is mounted protrudably from the tape member 5 in QFP 6 shown in FIG. 2. That is, because the tape member 5 is arranged on the upper side of the inner lead 1b, the semiconductor chip 2 which is mounted still above the tape member 5 can be mounted even if it is bigger than the tape member 5, and a construction in which the semiconductor chip 2 with the main surface 2b bigger than the tape member 5 is shown.

Next discussed is a manufacturing method of QFP 6 according to the present embodiment 1 and a manufacturing method of the lead frame used for QFP 6 together.

Figure 7:
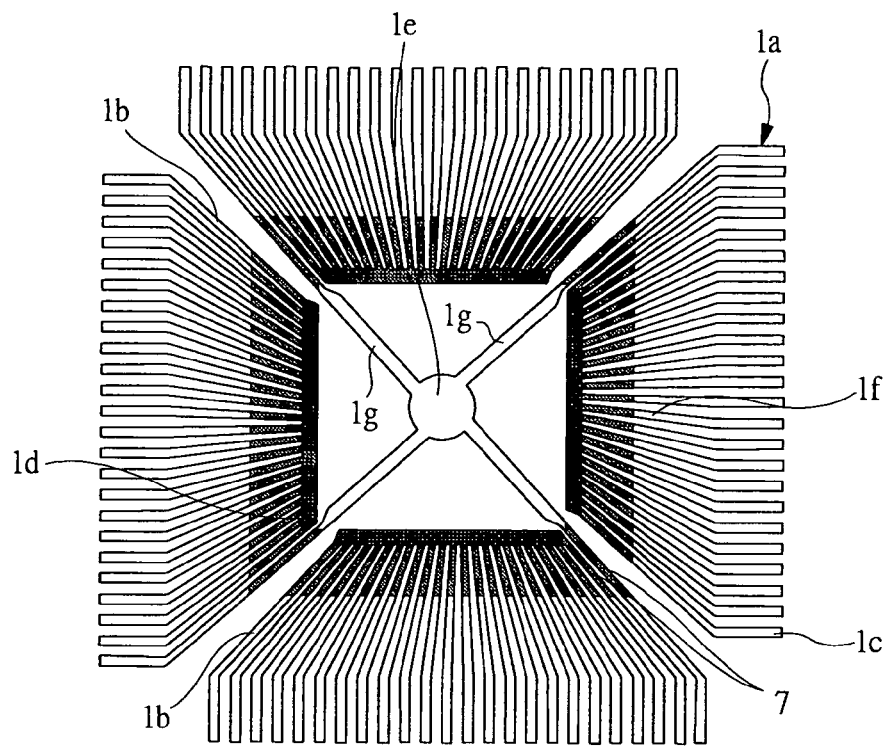
FIG. 7 is a fragmentary plan view indicating one example of a frame material construction of a lead frame used for assembly of QFP shown in FIG. 1.

First of all, a frame material 1a as shown in FIG. 7 is prepared.

This frame material 1a is a thin-sheet-form metal member and couples integrally one another a plurality of inner leads 1b arranged in correspondence with a pad 2a row of the semiconductor chip 2 to be mounted; a plurality of outer leads 1c formed integral to the inner leads 1b; a first coupling section 1d for coupling the leading end sections of a plurality of inner leads 1b integrally one another; and a second coupling section 1e for coupling other plural inner leads 1b integrally one another except the inner lead 1b coupled by the first coupling section 1d but including at least the inner leads 1b (corner lead 1g) arranged at corners of QFP 6, and the second coupling section 1e is arranged at the inner side for the first coupling section 1d.

That is, the frame material 1a comprises the first coupling section 1d which couples the leading end sections of a plurality of inner leads 1b which correspond to one side of the semiconductor chip 2 and the second coupling section 1e which couples corner leads 1g which are four pieces of inner lead 1b arranged at corners nearly at the center of the package within the first coupling section 1d, in addition to a plurality of inner leads 1b and outer leads 1c.

Meanwhile, the frame material 1a is formed by, for example, copper, etc., and in the wire connected surface 1f of each inner lead 1b, the region from relevant leading end sections to the portion where connection with wire 4 is carried out is coated by the silver plating 7. In such event, the first coupling section 1d is coated by the silver plating 7.

Figure 8:
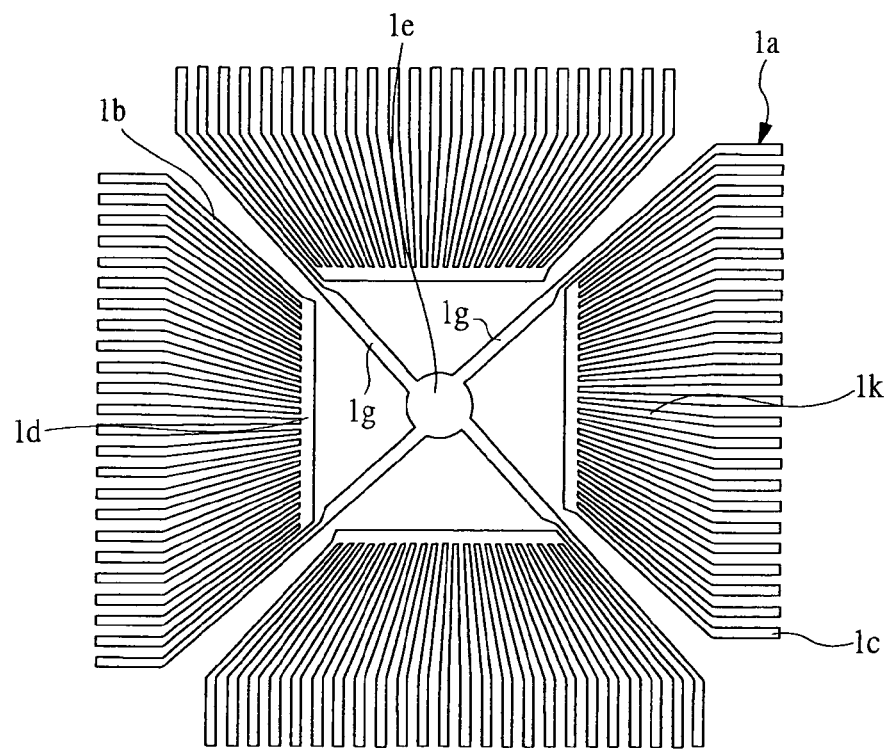
FIG. 8 is a rear view of the frame material shown in FIG. 7.

In addition, as shown in FIG. 8, on the surface opposite to the wire connected surface 1f of the frame material 1a (hereinafter called this surface the rear surface 1k), no silver plating 7 as shown in FIG. 7 is provided.

Figure 9:
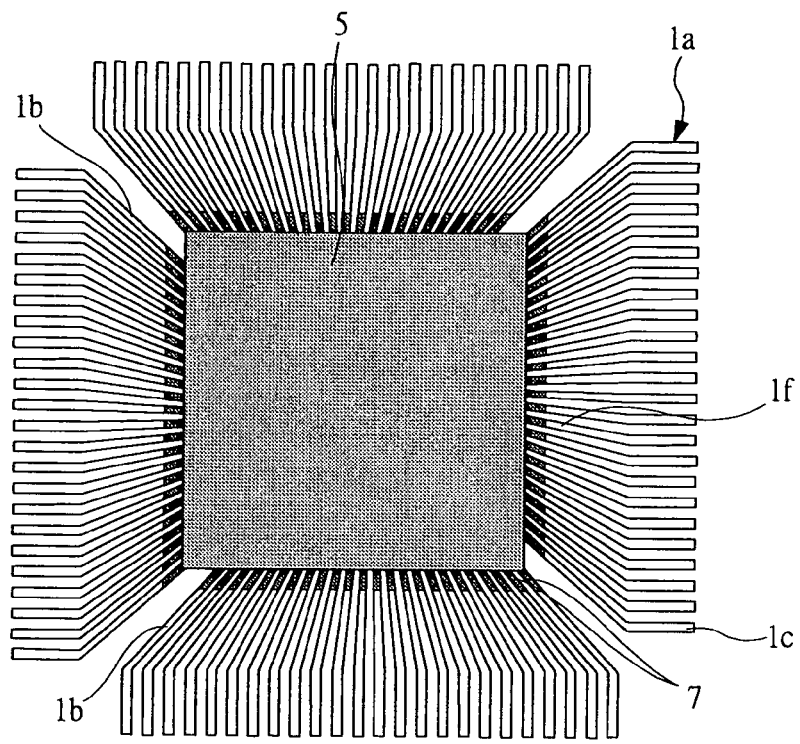
FIG. 9 is a fragmentary plan view indicating a construction of a lead frame manufactured by affixing a tape member to the frame material shown in FIG. 7.

Thereafter, as shown in FIG. 9, to the wire connected surface 1f of the plurality of inner leads 1b, the leading end sections of the plurality of inner leads 1b, and further the first coupling section 1d and the second coupling section 1e, and the tape member 5 are affixed.

That is, the tape member 5 is affixed to the leading end section of the wire connected surface 1f of the inner lead 1b and the first coupling section 1d and the second coupling section 1e.

Figure 10:
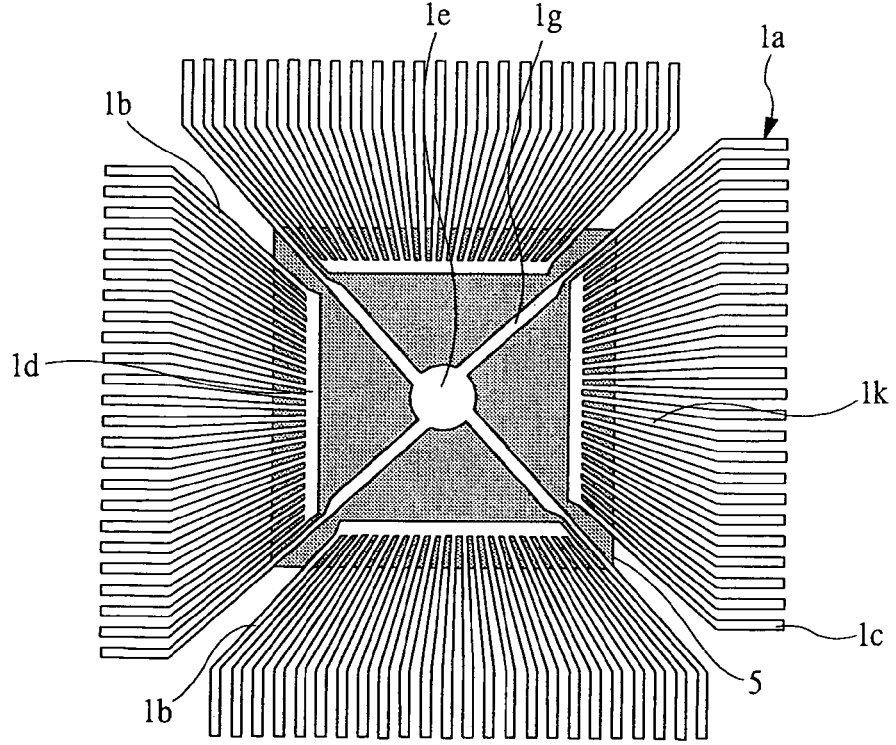
FIG. 10 is a rear view of the lead frame shown in FIG. 9.

In such event, for example, the tape member 5 is affixed to the frame material 1a, for example, via an adhesive layer 5a installed in advance to the tape member 5. The construction in which the frame material 1a is viewed from the rear surface 1k side is shown in FIG. 10.

Thereafter, the first coupling section 1d is cut along the leading end section of the plurality of inner leads 1b and at the same time the second coupling section 1e is cut.

Cutting the head end of each inner lead 1b after the tape member 5 is affixed to the frame material 1a can prevent the occurrence of problems in that the lead head end is bent to cause the lead pitch misaligned in the lead frame manufacturing process to affect wire-bonding so that the yield in the lead frame manufacturing process is lowered.

Figure 11:
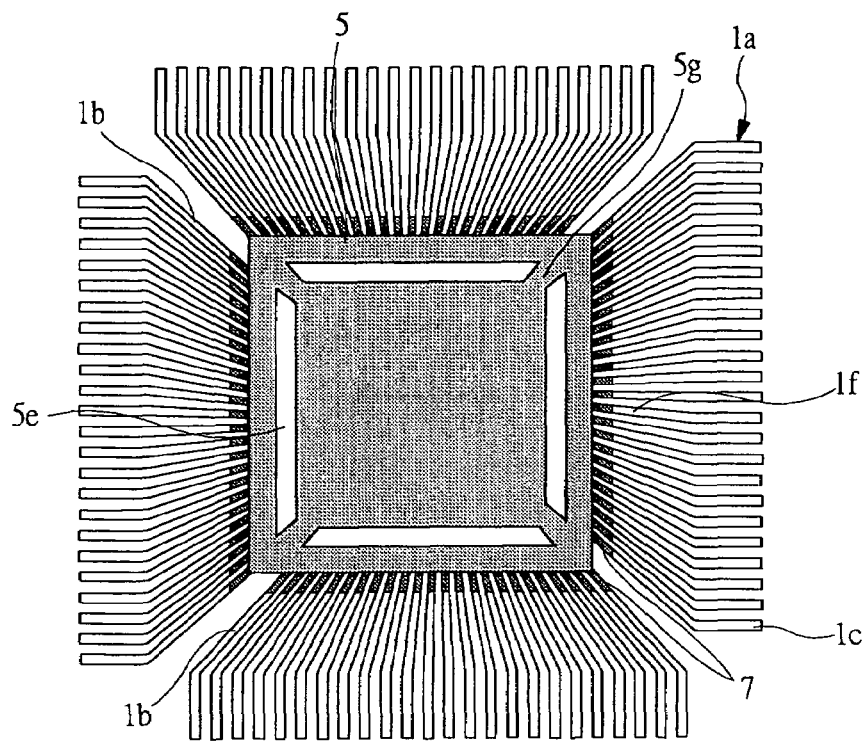
FIG. 11 is a fragmentary plan view indicating a construction after cutting a first coupled portion of the lead frame shown in FIG. 9.

Meanwhile, the cutting related to the first coupling section 1d and the cutting related to the second coupling section 1e are carried out separately. In this process, as shown in FIG. 11, first of all, the first coupling section 1d shown in FIG. 10 is cut, and this first coupling section 1d is removed from the frame material 1a and four first through-holes 5e are formed so that they are made independent at the leading end section of relevant inner leads 1b as shown in FIG. 12.

Figure 12:
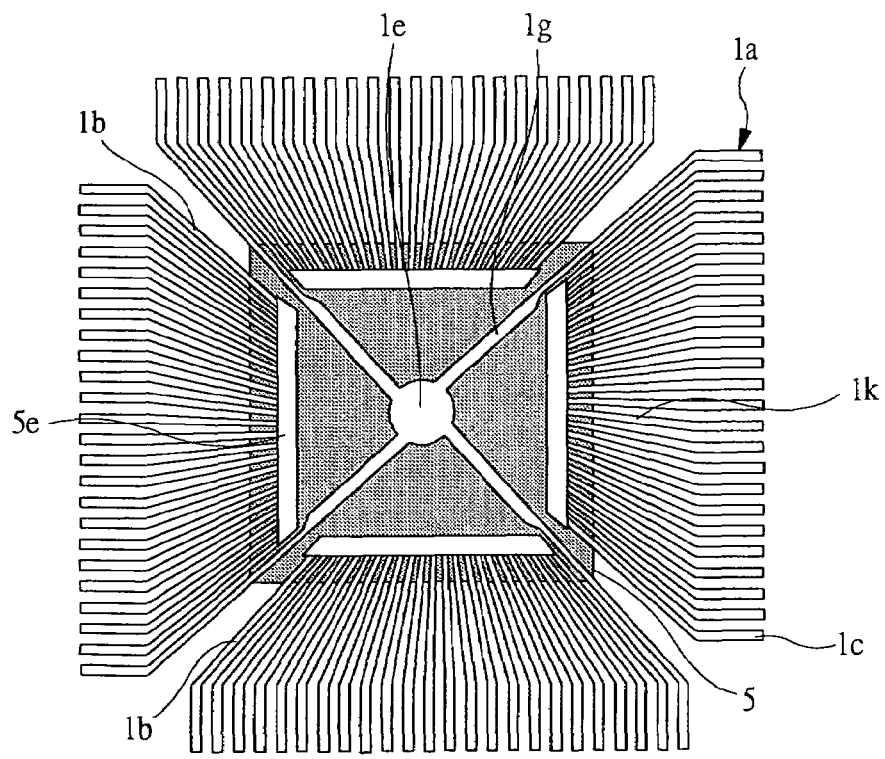
FIG. 12 is a rear view of the lead frame shown in FIG. 11.
Figure 13:
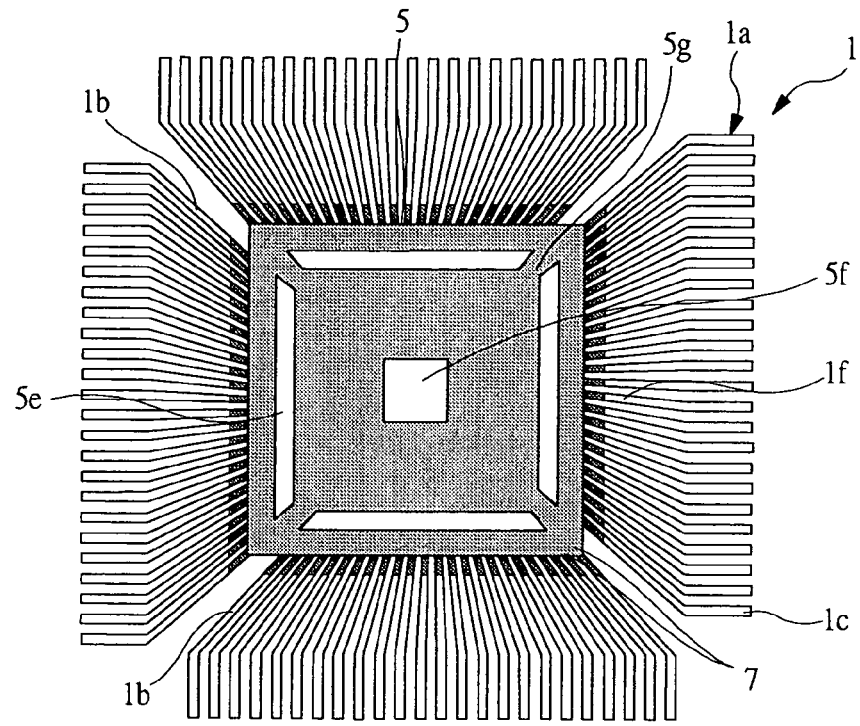
FIG. 13 is a fragmentary plan view indicating a construction after cutting a second coupled portion of the lead frame shown in FIG. 9.

Then, as shown in FIG. 13, the second coupling section 1e shown in FIG. 12 is cut and the second coupling section 1e is removed from the frame material 1a and the second through-hole 5f is formed, thereby making relevant corner leads 1g independent as shown in FIG. 14.

Then, with respect to the cutting of the first coupling section 1d and the second coupling section 1e, the second coupling section 1e may be cut first to remove, and then, the first coupled 1d may be cut, or the first coupling section 1d and the second coupling section 1e may be cut simultaneously. Simultaneously cutting the coupling sections can achieve efficient cutting.

Because in the lead frame 1 according to the present embodiment 1, the corner leads 1g arranged at four corners extend to the vicinity of the center of the tape member 5, the strength of the tape hanging section 5g can be increased, and at the same time, the rigidity of the whole tape member 5 can be increased, too. By this, the occurrence of undulation of the tape member 5 at the time of cutting the second coupling section 1e can be prevented, and the yield in manufacturing lead frame 1 can be improved.

By this, it becomes possible to manufacture the lead frame 1 without lowering the yield even if the tape member 5 material is of soft.

Thereafter, die-bonding is carried out to mount the semiconductor chip 2 on the surface opposite to the bonded surface 5c of the inner lead 1b of the tape member 5.

In such event, as shown in FIG. 1 or FIG. 2, for example, silver paste 8 is applied to the tape member 5 and with this silver paste 8, the semiconductor chip 2 is fixed.

Thereafter, wire-bonding is carried out to connect the pad 2a of the semiconductor chip 2 to the corresponding inner lead 1b by the wire 4.

In this event, in wire-connection, that is, the second bonding of the wire 4 to the inner lead 1b, as shown in FIG. 1, the silver plating 7 formed portion of the outside portion of the tape member 5 of the wire connection surface 1f of the inner lead 1b is connected to the wire 4.

In such event, because in the method of manufacturing the semiconductor device according to the present embodiment 1, the tape member 5 is affixed to the wire connected surface 1f side of each inner lead 1b and the tape member 5 is arranged on the upper side of each inner lead 1b, each inner lead 1b can be directly arranged on the bonding stage when wire-bonding is carried out.

By this, ultrasonic waves and heat can be sufficiently applied to each inner lead 1b at the time of wire-bonding.

As a result, the second bonding can be reliably carried out and defective second bonding can be reduced.

By this, the yield in the manufacture of QFP 6 can be improved.

Since each inner lead 1b can be directly arranged on the bonding stage and the second bonding can be infallibly carried out, a adhesive layer 5a of relatively soft acrylic, polyimide, epoxy, rubber, and other adhesives may be formed, and even in such event, the second bonding can be reliably carried out. Since the acrylic adhesive is inexpensive, the lead frame 1 cost can be reduced.

After completing wire-bonding, the semiconductor chip 2 and a plurality of wires 4 are encapsulated with resin using the resin for encapsulating to form an encapsulated section 3.

Then, a plurality of outer leads 1c are cut, respectively, to separate from the lead frame 1 and at the same time, the outer lead 1c is bent and formed to complete the assembly of QFP 6.

Figure 16:
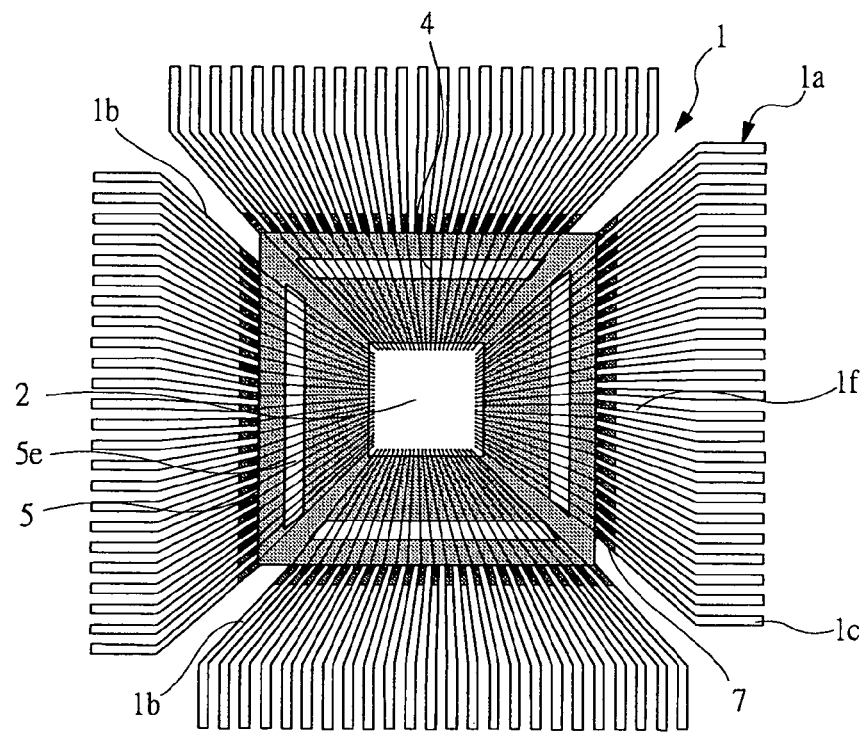
FIG. 16 is a fragmentary plan view indicating one example of a construction after wire-bonding when a minimum-size semiconductor chip is mounted to the lead frame shown in FIG. 13.
Figure 17:
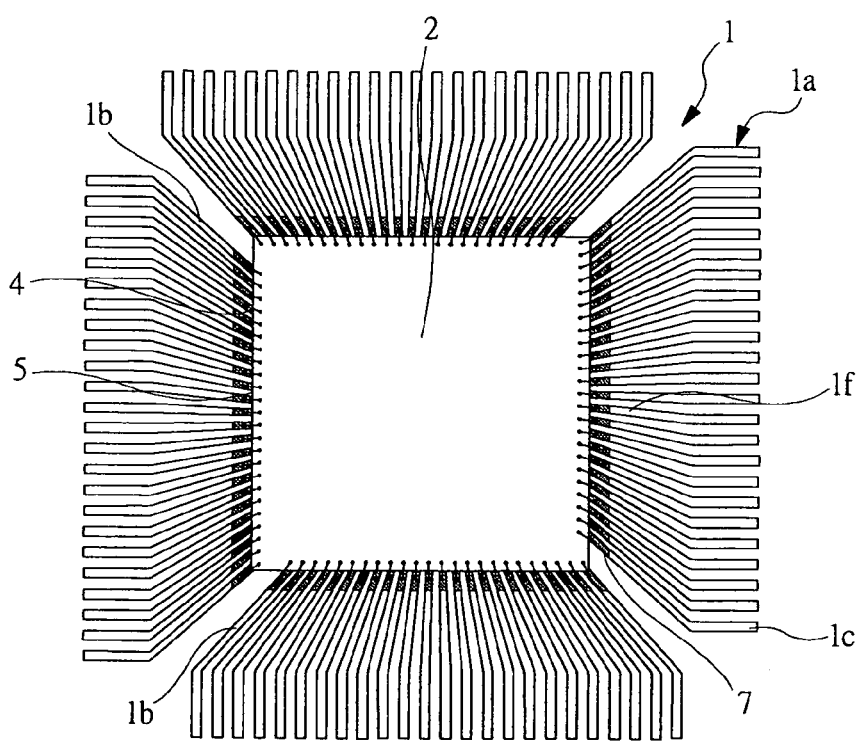
FIG. 17 is a fragmentary plan view indicating one example of a construction after wire-bonding when a maximum-size semiconductor chip is mounted to the lead frame shown in FIG. 13.

Meanwhile, FIG. 15 shows the minimum chip mounted area 17 and the maximum chip mounted area 18 in the lead frame 1 shown in FIG. 13, and furthermore, FIG. 16 shows a construction in which the minimum semiconductor chip 2 is mounted and wire-bonded, and FIG. 17 shows a construction in which the maximum semiconductor chip 2 is mounted and wire-bonded.

The lead frame 1 used for the present embodiment 1 in this way can mount the semiconductor chip 2 of various sizes, and the versatility of the lead frame 1 can be increased.

In addition, because the tape member 5 is arranged to the upper side of the inner lead 1b, as shown in QFP 6 of FIG. 6, it becomes possible to mount the semiconductor chip 2 larger than the tape member 5 by allowing it to protrude from the tape member 5, and furthermore, the versatility of the lead frame 1 can be increased.

Now, a method for manufacturing a lead frame of a modified example of the present embodiment 1 shown in FIG. 18 through FIG. 25 is described.

Figure 18:
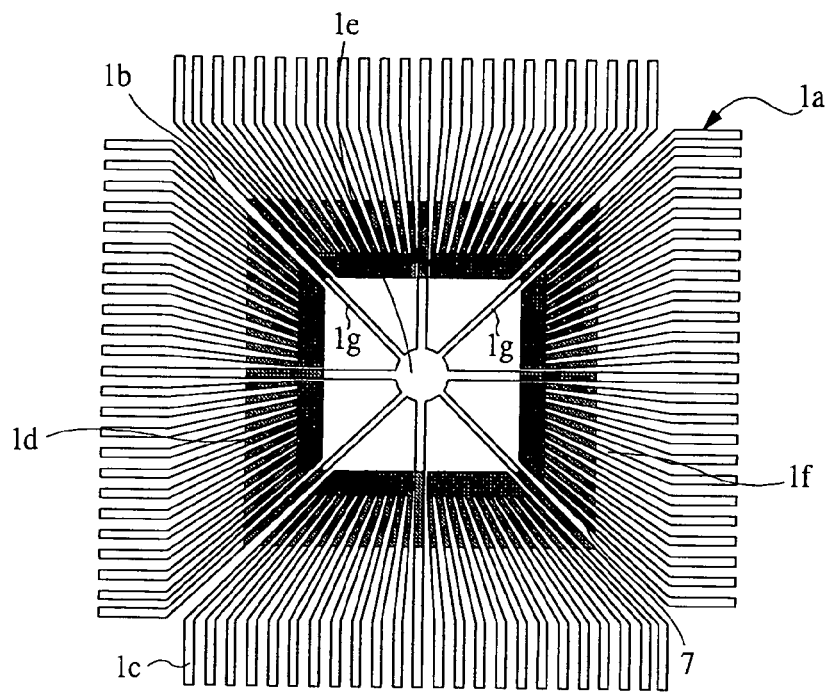
FIG. 18 is a fragmentary plan view indicating a frame material construction of a lead frame of a modified example of embodiment 1 according to the present invention.
Figure 19:
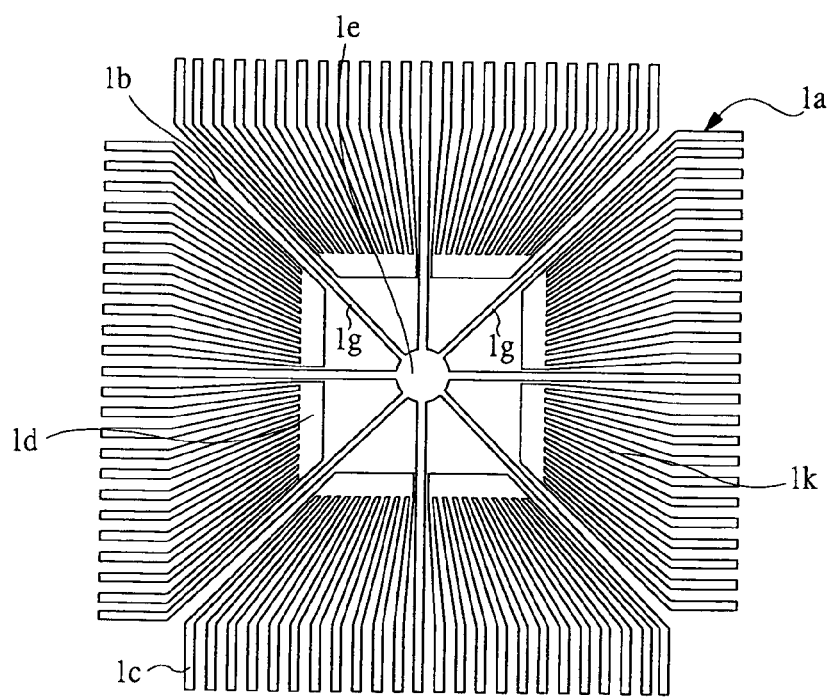
FIG. 19 is a rear view of the frame material shown in FIG. 18.

FIG. 18 and FIG. 19 show the frame material 1a of a modified example, with the number of inner leads 1b coupled by the second coupling section 1e increased to 8. In addition to 4 pieces of inner lead 1b (corner lead 1g) arranged at corners, four pieces of inner lead 1b at the position 45° theta-rotated, respectively, from these are coupled, and a total of 8 pieces of inner lead 1b are coupled by the second coupling section 1e.

In addition, the first coupling section 1d is of a construction divided into both side by the inner lead 1b arranged near the center between two corners, and a total of 8 first coupling sections 1d are formed.

Meanwhile, on the wire connected surface 1f side of the inner lead 1b, silver plating 7 is provided as is the case of FIG. 7.

Figure 20:
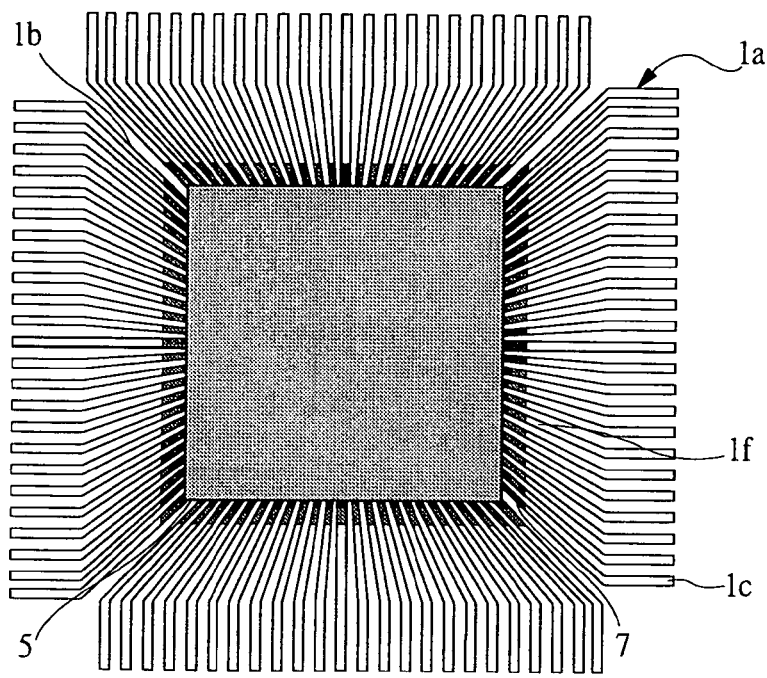
FIG. 20 is a fragmentary plan view indicating a construction of a lead frame manufactured by affixing a tape member to the frame material shown in FIG. 18.
Figure 21:
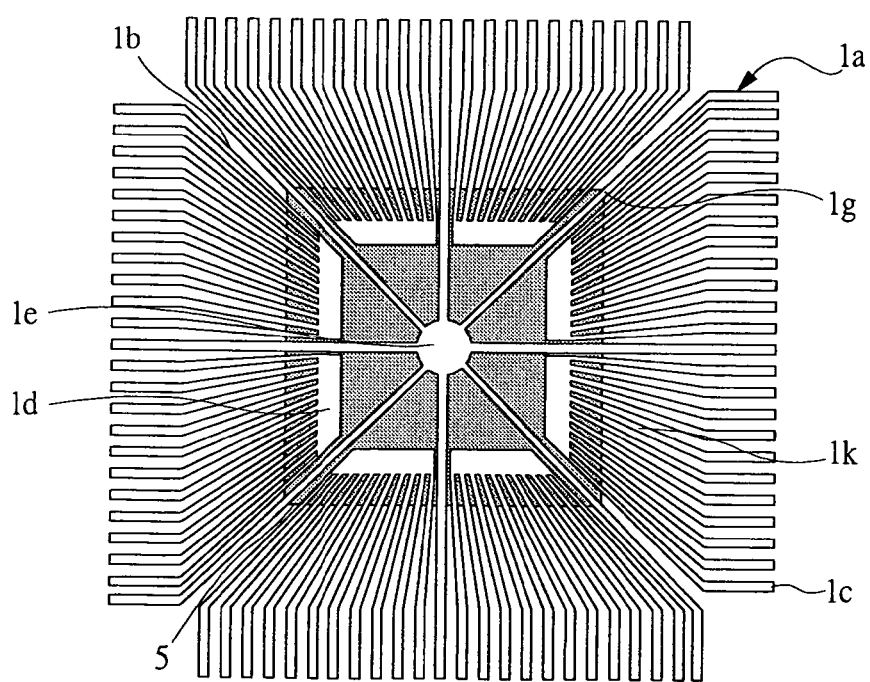
FIG. 21 is a rear view of the lead frame shown in FIG. 20.

FIG. 20 and FIG. 21 indicate the condition with the tape member 5 affixed.

Figure 22:
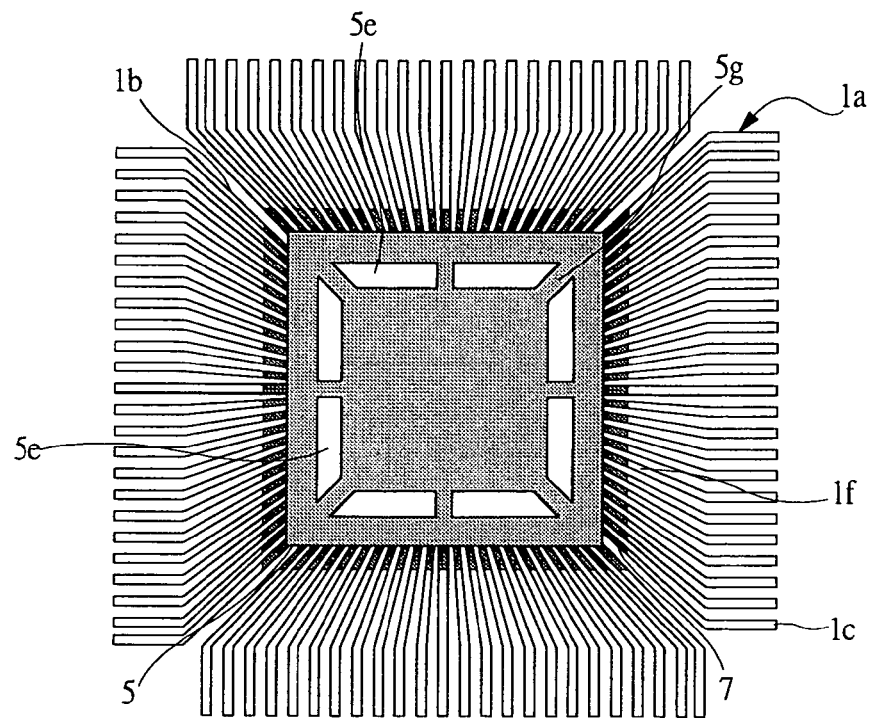
FIG. 22 is a fragmentary plan view indicating a construction after cutting a first coupled portion of the lead frame shown in FIG. 20.
Figure 23:
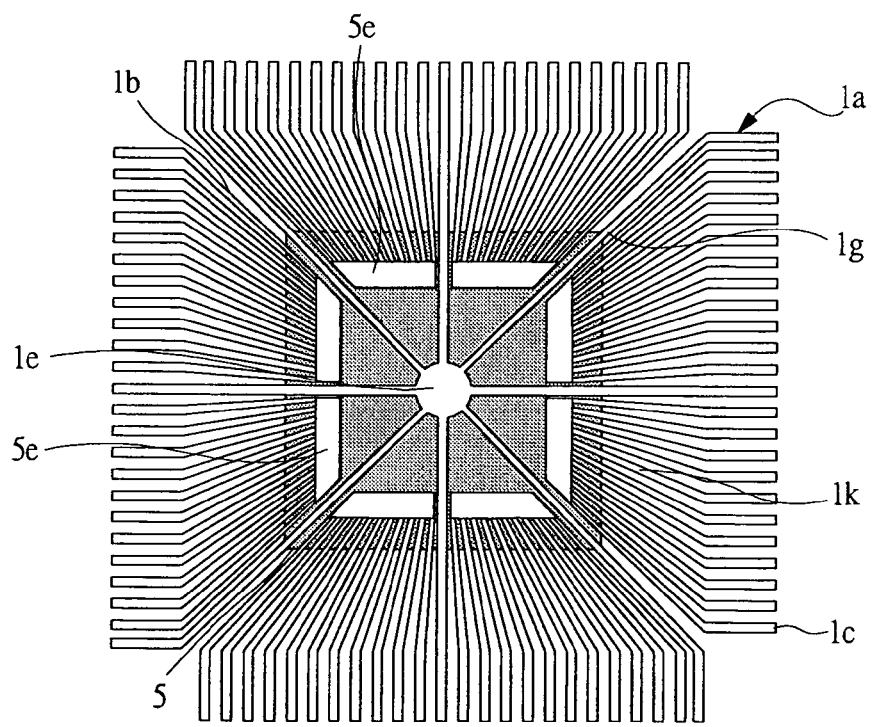
FIG. 23 is a rear view of the lead frame shown in FIG. 22.

Furthermore, FIG. 22 indicates the condition in which the first coupling section 1d is cut and 8 first through-holes 5e are formed, and FIG. 23 is the rear view.

Figure 24:
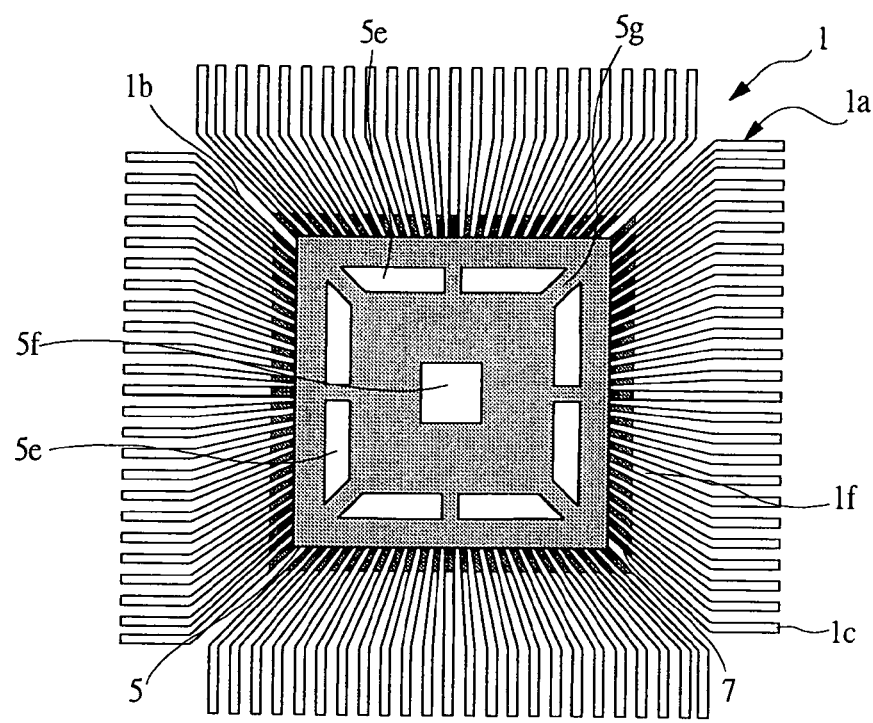
FIG. 24 is a fragmentary plan view indicating a construction after cutting a second coupled portion of the lead frame shown in FIG. 20.
Figure 25:
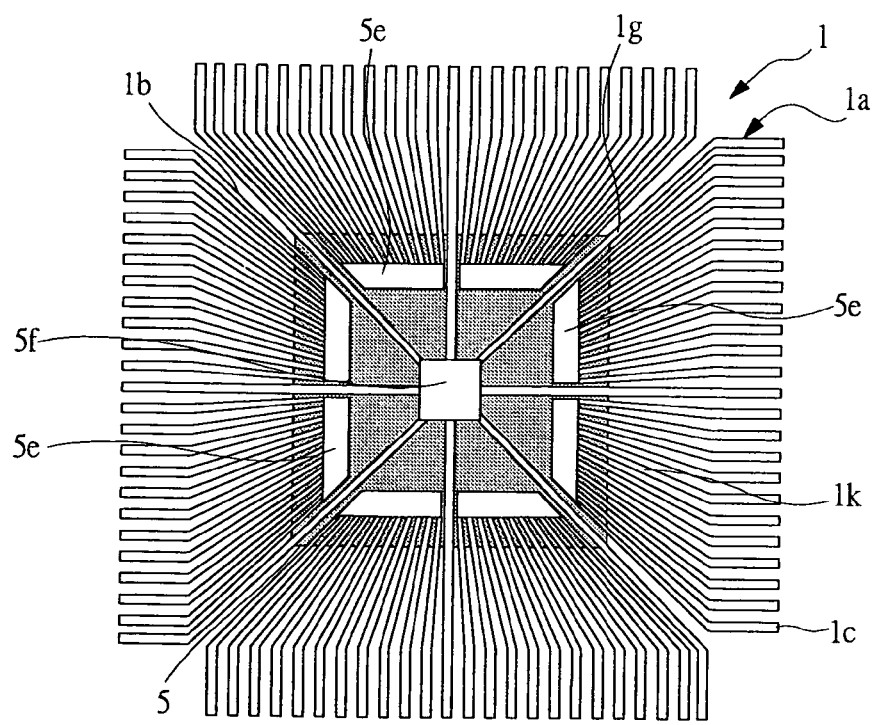
FIG. 25 is a rear view of the lead frame shown in FIG. 24.

In addition, FIG. 24 indicates the condition in which the second coupling section 1e is cut and one second through-holes 5f is formed, and FIG. 25 is the rear view.

In the lead frame 1 shown in FIG. 24, too, the first coupling section 1d and the second coupling section 1e shown in FIG. 21 may be simultaneously cut or either one may be cut first and the other may be cut later.

Figure 26:
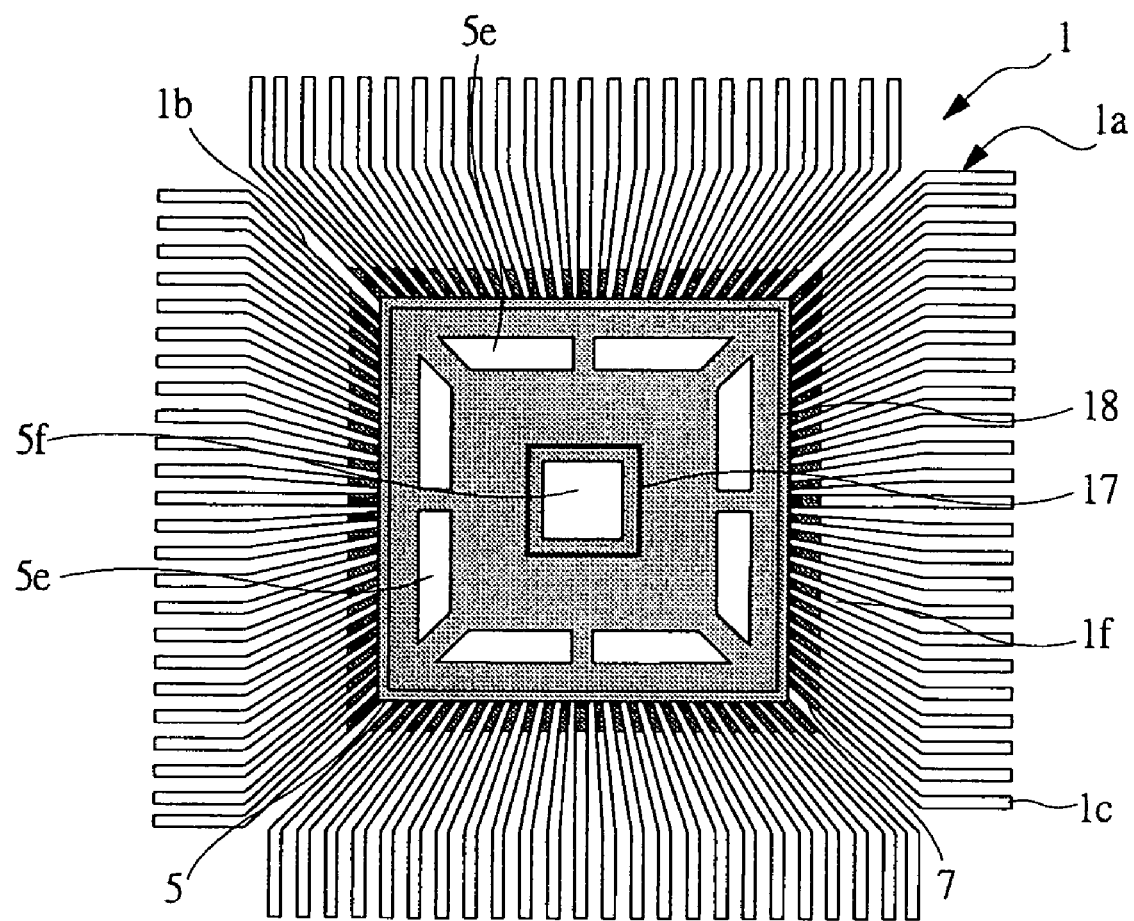
FIG. 26 is a fragmentary plan view indicating the minimum mountable chip size and the maximum mountable chip size of the lead frame shown in FIG. 24.
Figure 27:
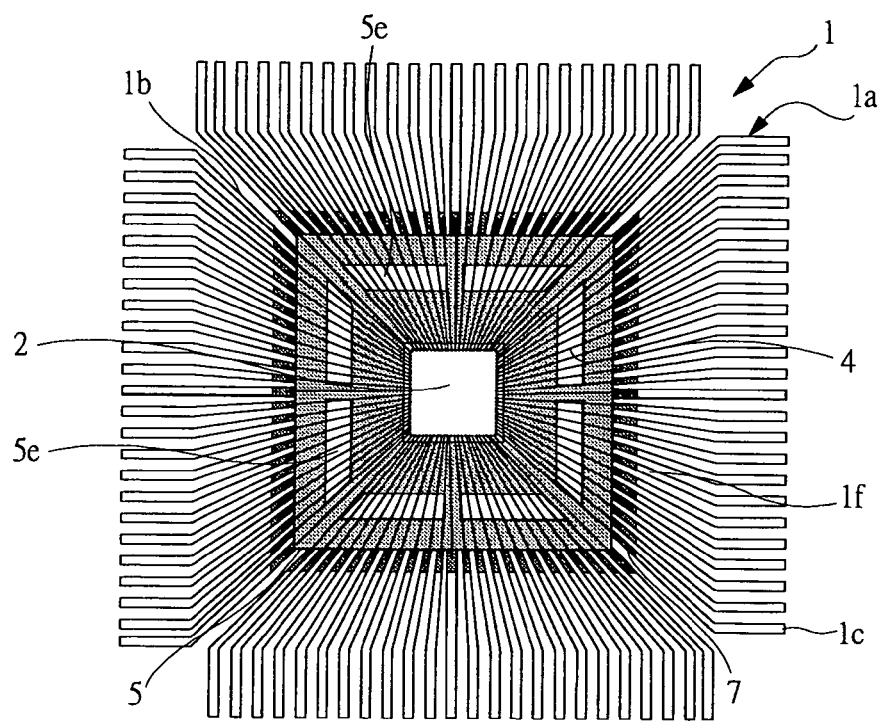
FIG. 27 is a fragmentary plan view indicating one example of a construction after wire-bonding when a minimum-size semiconductor chip is mounted to the lead frame shown in FIG. 24.
Figure 28:
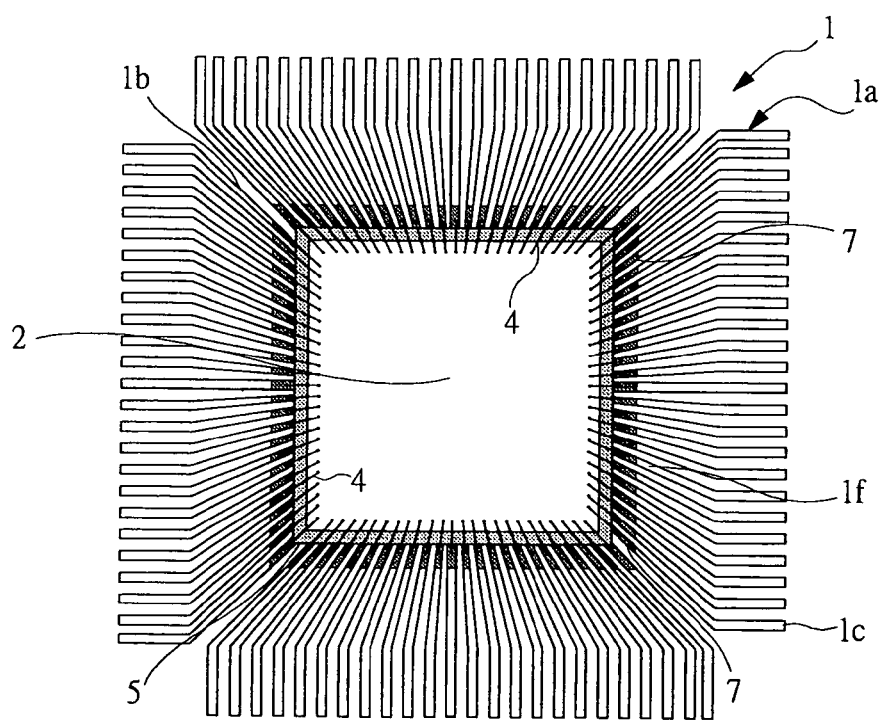
FIG. 28 is a fragmentary plan view indicating one example of a construction after wire-bonding when a maximum-size semiconductor chip is mounted to the lead frame shown in FIG. 24.

In addition, FIG. 26 through FIG. 28 indicate the chip mountable range and the wire-bonding condition. FIG. 26 shows the minimum chip mounted area 17 and the maximum chip mounted area 18 in the lead frame 1 shown in FIG. 24, and furthermore, FIG. 27 indicates a construction in which the minimum semiconductor chip 2 is mounted and wire-bonded, while FIG. 28 indicates a construction in which the maximum semiconductor chip 2 is mounted and wire-bonded.

In this way, even the lead frame 1 of the modified example shown in FIG. 24, the semiconductor chip 2 of various sizes can be mounted and the versatility of the lead frame 1 can be increased.

Furthermore, since a total of 8 pieces of inner lead 1b including 4 pieces of corner lead 1g extend to the vicinity of the center of the tape member 5, the rigidity of the tape member 5 can be increased.

Next discussion will be made on the lead frame 1 of a modified example shown in FIG. 29 through FIG. 31.

Figure 29:
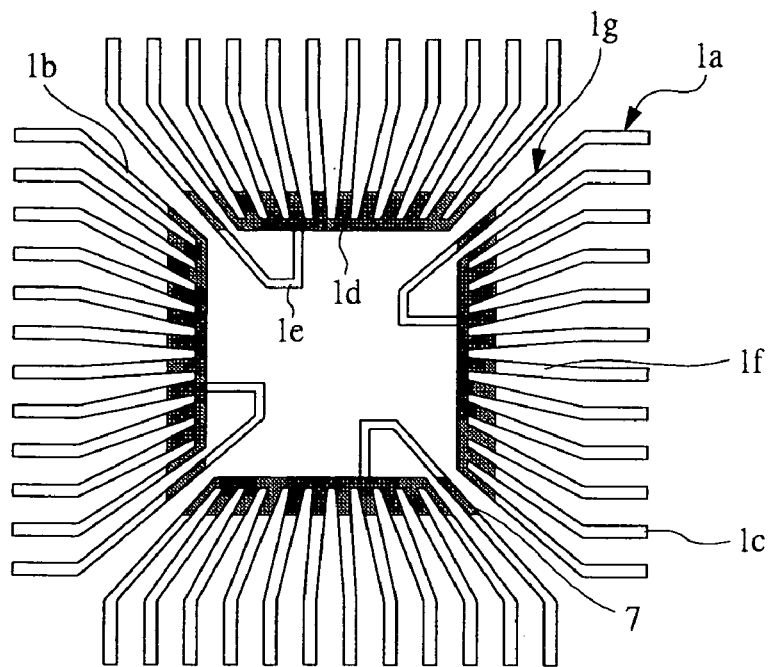
FIG. 29 is a fragmentary plan view indicating a frame material construction of a lead frame of a modified example of embodiment 1 according to the present invention.
Figure 31:
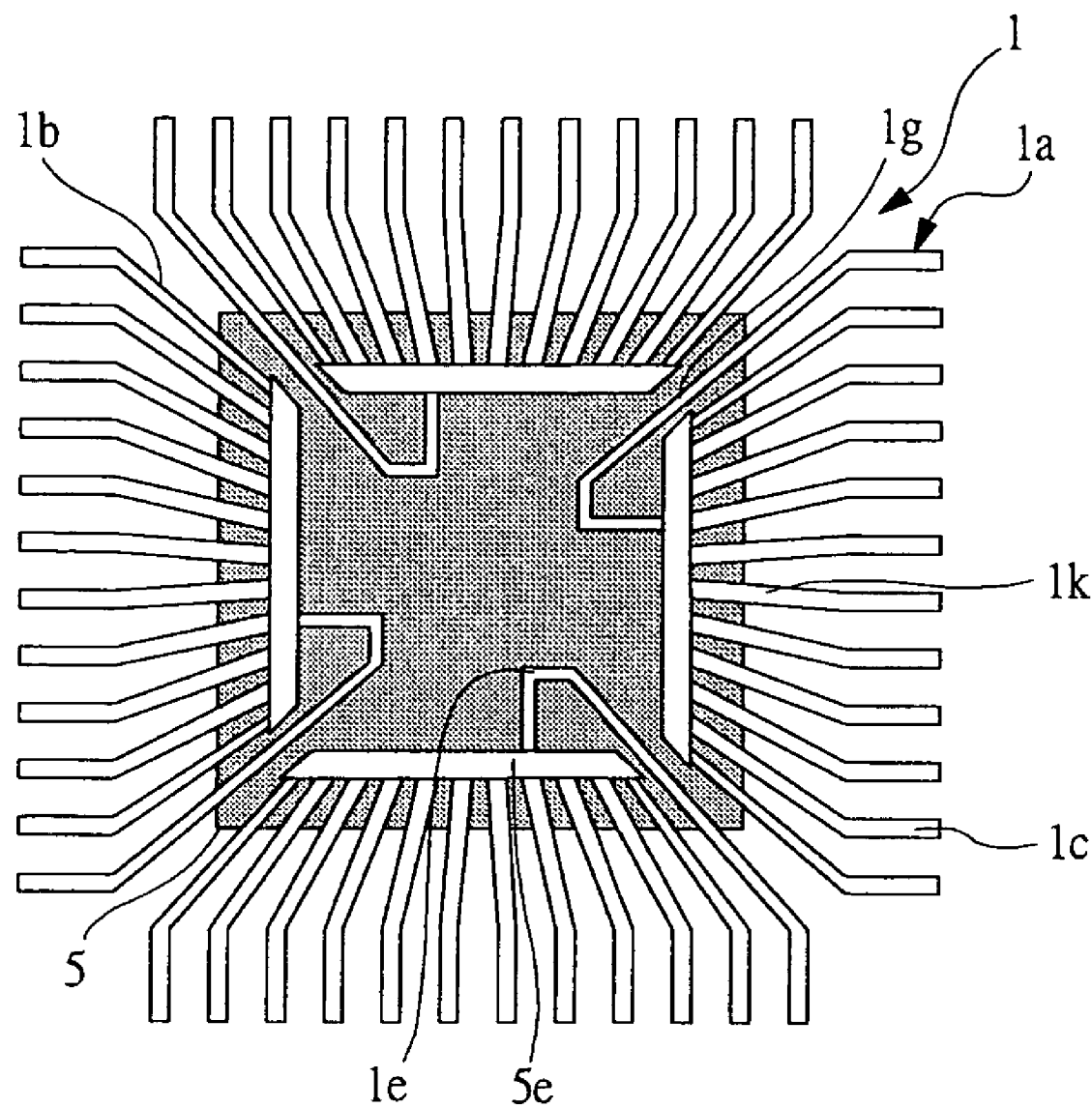
FIG. 31 is a fragmentary rear view indicating a construction after cutting a first coupled portion of the lead frame shown in FIG. 30.

FIG. 29 is a frame material 1a to form the lead frame 1 of the modified example shown in FIG. 31, which comprises a plurality of inner leads 1b; outer leads 1c formed integral to the inner leads 1b; the first coupling section 1d for coupling the leading end sections of a plurality of inner leads 1b integrally one another; and a plurality of second coupling sections 1e to connect inner leads 1b (corner leads 1g), which is arranged at the package corners adjacent to the plurality of inner leads 1b group connected by the first coupling section 1d, to the first coupling section 1d and arranged inside of the first coupling sections 1d.

That is, the corner leads 1g provided at four corners are not coupled to each other but coupled to the first coupling section 1d adjacent to each other via the second coupling section 1e, and in such event, the second coupling section 1e is arranged extending in a U-letter shape inwards to the center from the first coupling section 1d.

Figure 30:
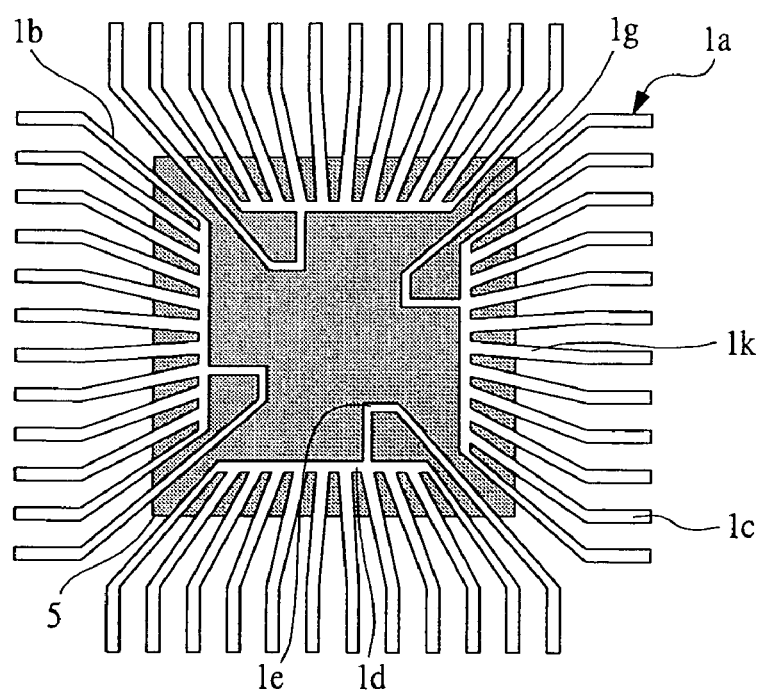
FIG. 30 is a fragmentary rear view indicating a construction of a lead frame manufactured by affixing the tape member to the frame material shown in FIG. 29.

Using the frame material 1a shown in FIG. 29, the leading end sections on the wire connected surface side of the plurality of inner leads 1b, the first coupling section 1d and the second coupling section 1e, and the tape member 5 are affixed as shown in FIG. 30.

After affixing, the first coupling section 1d is cut along the leading end sections of the plurality of inner leads 1b to remove the first coupling section 1d from the frame material 1a and by this, four first through-holes 5e shown in FIG. 31 are formed and the lead frame 1 is manufactured.

That is, by cutting four first coupling sections 1d in the frame material 1a, each of the plurality of inner leads 1b including the corner leads 1g are separated at the head end side of them as shown in FIG. 30.

Thereafter, same as the assembly using the lead frame 1 shown in FIG. 13, the semiconductor chip 2 is mounted on the chip bearing surface side (the side opposite to the surface with each inner lead 1b arranged) of the tape member 5 using the lead frame 1 of the modified example shown in FIG. 31, and wire-bonding, resin-encapsulating, and cutting and forming the outer lead 1c are carried out to assemble the semiconductor device same as QFP 6 (see FIG. 1) of the present embodiment 1.

In manufacturing the lead frame 1 of the modified example shown in FIG. 31, cutting of the first coupling section 1d only is carried out and cutting of the second coupling section 1e is not carried out, so that the process of cutting the coupling section can be simplified, and the lead frame 1 manufacturing process can be simplified.

In addition, the lead frame 1 of the modified example shown in FIG. 31 can increase the strength of the tape hanging section 5g, but since the extension amount of the second coupling section 1e to the vicinity of inner center is comparatively small, so that this is effective when high-strength tape member 5 comprising glass-epoxy resin and others is used.

Figure 32:
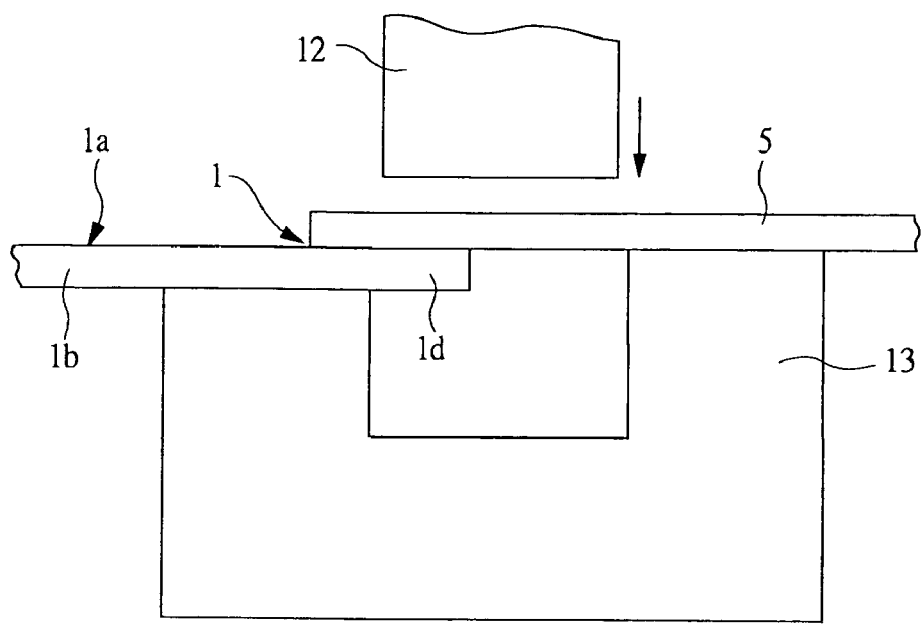
FIG. 32 is a fragmentary side view indicating one example of a punching method using a punch when the lead frame shown in FIG. 13 is manufactured.
Figure 33:
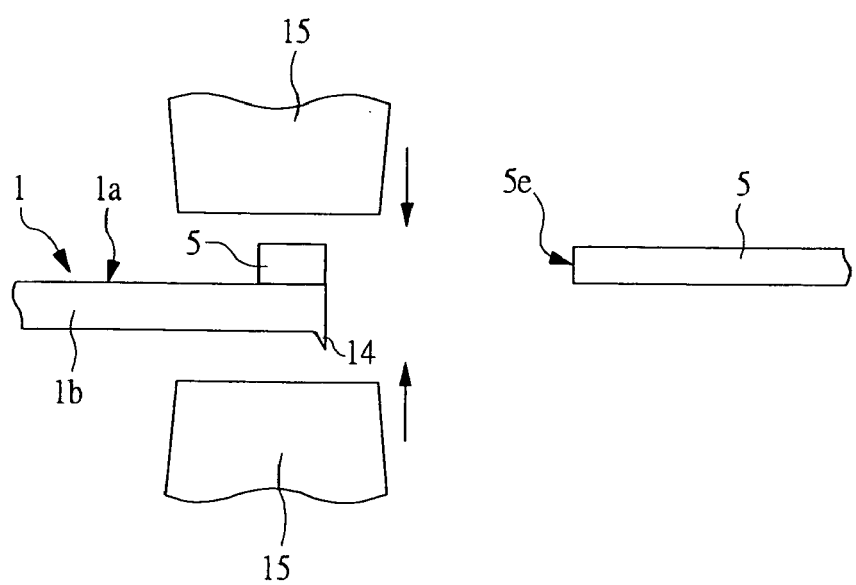
FIG. 33 is a fragmentary side view indicating one example of coining method after punching shown in FIG. 32.
Figure 34:
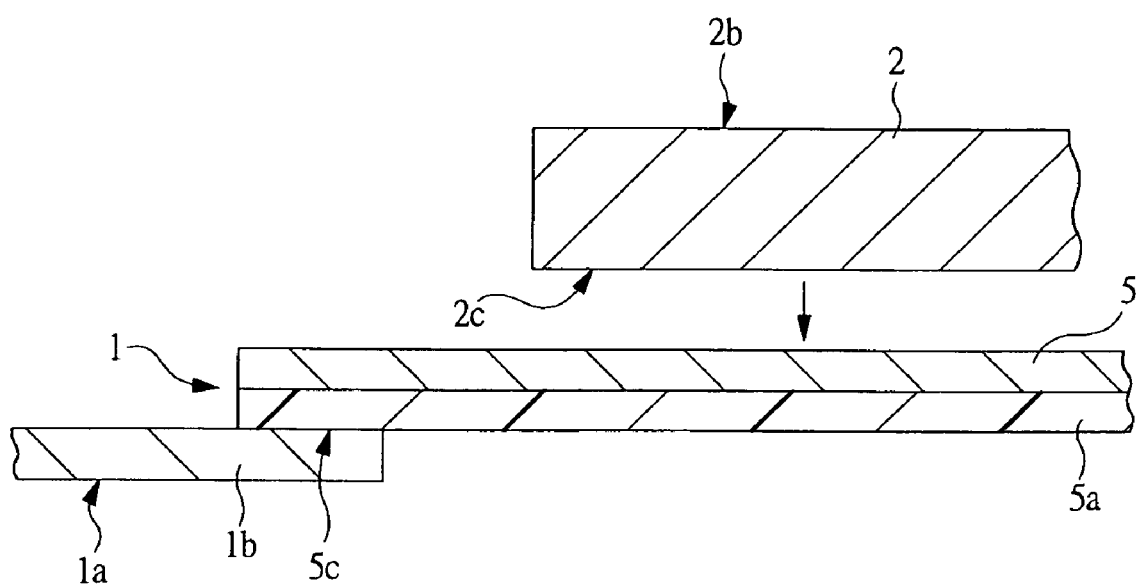
FIG. 34 is a fragmentary cross-sectional view indicating a construction of a lead frame of a modified example of embodiment 1 according to the present invention.

Now, a modified example of the manufacturing method of lead frame of the present embodiment 1 shown in FIG. 32 through FIG. 34 is described.

FIG. 32 shows the punching direction when the first coupling section 1d or the second coupling section 1e are punched out in manufacturing the lead frame 1, and the frame material 1a with the leading end sections of the plurality of inner leads 1b formed one another integrally by the first coupling section 1d is prepared, and after affixing the tape member 5 to this, the flame material 1a is arranged on a die 13, and then, using a punch 12 for punching out, the first coupling section 1d is punched out from the chip-mounted side along the leading end sections of the plurality of inner leads 1b and the first coupling section 1d is cut and removed from the frame material 1a.

By this, as shown in FIG. 33, the cut burr 14 can be protruded to the surface opposite to the frame material 1a or the chip-mounted side of the tape member 5, so that the occurrence of adverse effect of entry of the cut burr 14 between the tape member 5 and the semiconductor chip 2 at the time of die-bonding can be prevented.

Furthermore, after punching, it is preferable to coin the bonded section between the inner lead 1b and the tape member 5 using a block 15, etc. as shown in FIG. 33, and by this, the cut burr 14 formed by cutting can be crushed to flatten the cut section.

Further, FIG. 34 is to use the tape member 5 with the thermoplastic adhesive layer 5a formed in advance and to affix this tape member 5 to the frame material 1a, and bonding of the inner lead 1b and the tape member 5 and bonding of the semiconductor chip 2 and the tape member 5 are performed via the thermoplastic adhesive layer 5a. The QFP 6 assembled by the use of this kind of lead frame 1 is shown in the modified example of FIG. 4.

By the thermoplastic adhesive layer 5a formed in advance on the tape member 5, no die-bonding material is required, and the cost can be reduced and the die-bonding process can be simplified.

The base material of the tape member 5 in such event comprises, for example, highly heat-resistant polyimide resin and others.

In addition, when die-bonding is carried out by the use of the lead frame 1 with the thermoplastic adhesive layer 5a formed in advance on the tape member 5 as shown in FIG. 34, it is preferable to fix the leading end sections of a plurality of inner leads 1b by a special-purpose jig and to carry out die-bonding.

This is to prevent occurrence of nonconformity in which the thermoplastic adhesive is softened by heat at the time of die-bonding and each inner lead 1b moves to make the lead position changed.

In addition, at the time of die-bonding, it is preferable to locally heat the chip-mounted region only in the tape member 5 using, for example, laser and others and to perform die-bonding.

By this, the vicinity of the leading end section of each inner lead 1b does not have to be heated, and the occurrence of nonconformity in that each inner lead 1b moves to make the lead position changed can be prevented.

In addition, the lead frame 1 may be manufactured by the use of the frame material 1a with palladium plating 9 (see FIG. 5) provided throughout the whole surface in advance and using this lead frame 1, QFP 6 may be assembled.

By assembling QFP 6 using the lead frame 1 with palladium plating 9 provided throughout the whole surface, as compared to copper, palladium provides higher adhesion to the adhesive material for fixing the inner lead, and peeling of inner lead 1b from the tape member 5 at the time of punching is unlikely to occur when punching by the punch 12 shown in FIG. 32 is carried out.

Furthermore, as the whole surface is coated by palladium plating 9, no silver plating 7 or exterior plating is required, and as compared to copper, palladium provides a higher melting point and can improve the heat resistance. By this, Pb-free mounting can be achieved.

Meanwhile, QFP 6 assembled by the use of the lead frame 1 with palladium plating 9 provided throughout the whole surface in advance is the one shown in FIG. 5. However, needless to say, in QFP 6 after assembly, the cut surface of the outer lead 1c or inner lead 1b is free of any palladium plating 9.

Embodiment 2

Figure 35:
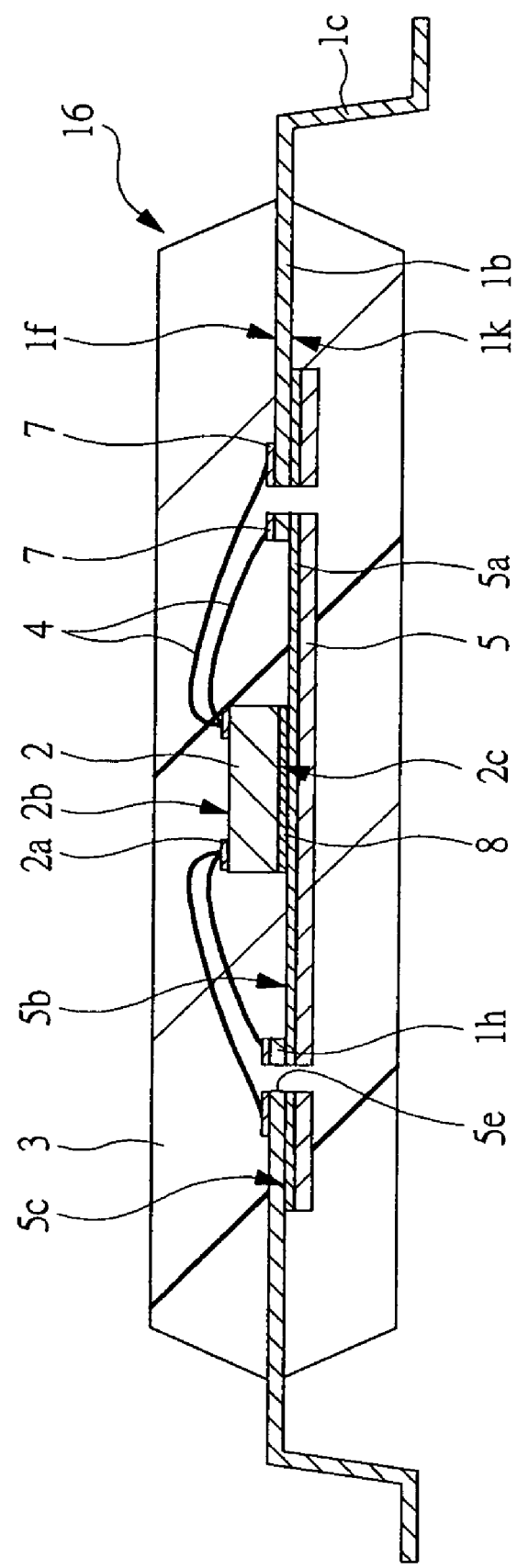
FIG. 35 is a cross-sectional view indicating one example of a construction to which the minimum size chip is mounted in a semiconductor device (QFP) of embodiment 2 according to the present invention.
Figure 36:
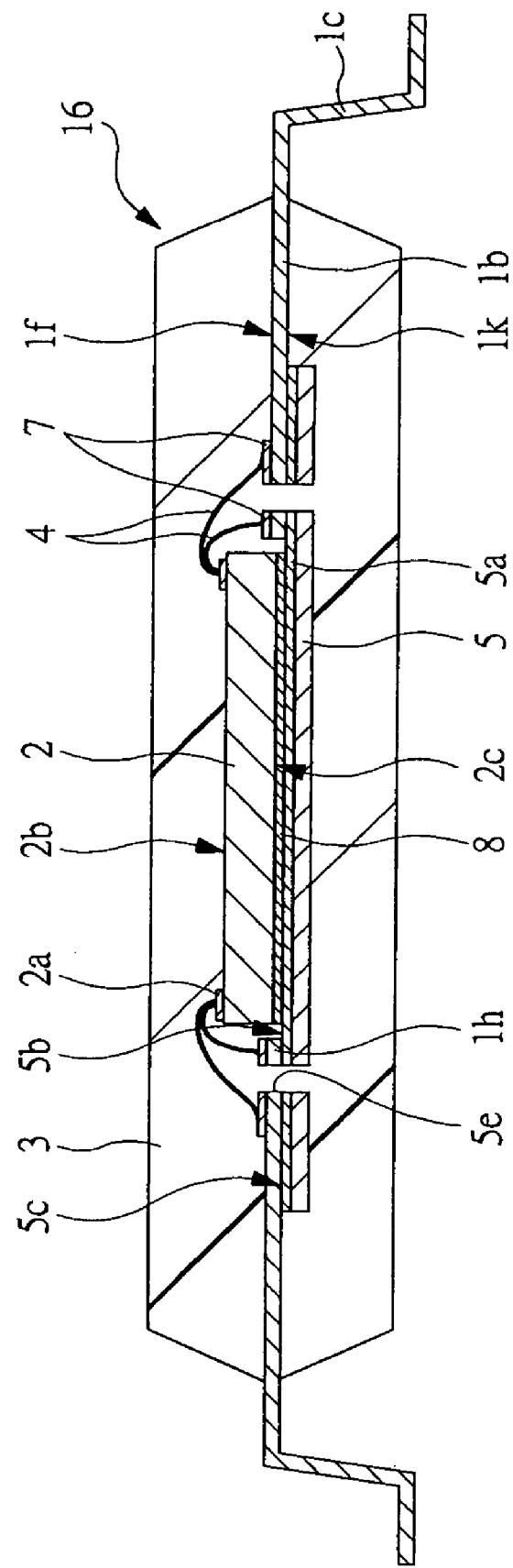
FIG. 36 is a cross-sectional view indicating one example of a construction to which the maximum size chip is mounted in a semiconductor device (QFP) of embodiment 2 according to the present invention.
Figure 37:
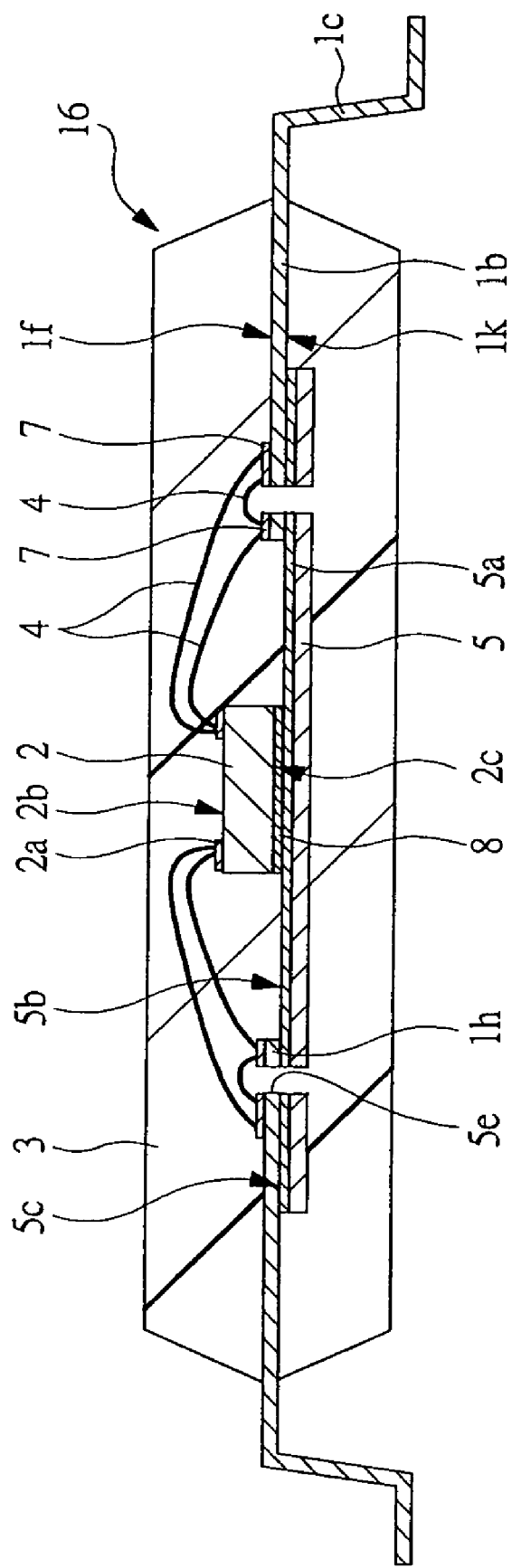
FIG. 37 is a cross-sectional view indicating a construction of QFP of a modified example of embodiment 2 according to the present invention.

The semiconductor device of the present embodiment 2 shown in FIG. 35, FIG. 36, and FIG. 37 are multi-pin QFP 16 with the semiconductor chip 2 mounted on the tape member 5 same as QFP 6 of the embodiment 1, but what differs from QFP 6 of the embodiment 1 is that the semiconductor chip 2 is mounted on the surface same as the bonded surface 5c of the tape member 5 with the inner lead 1b. That is, the tape member 5 is affixed to the lower side of the inner lead 1b and on this tape member 5, the semiconductor chip 2 is mounted.

Furthermore, it has a bar lead which is a common lead (bus-bar lead) to reinforce (stabilize) the power supply and ground.

Consequently, QFP 16 of the present embodiment 2 has a plurality of pins and has an effective construction to reinforce the power supply and ground, but it intends to reinforce (stabilize) the power supply and the ground without increasing the number of terminals of the power supply and the ground exposed from the encapsulated section 3 as external terminals.

Figure 38:
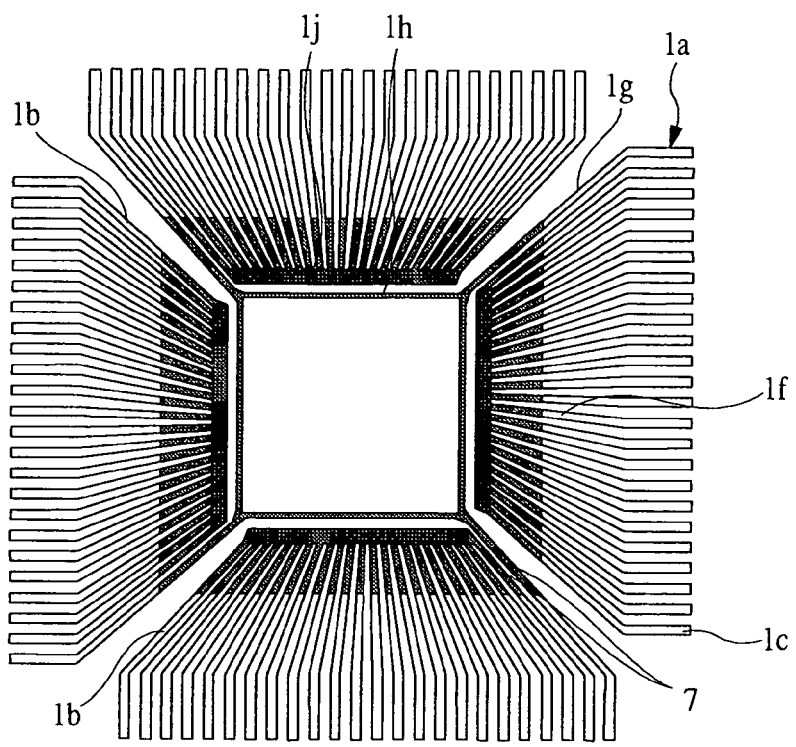
FIG. 38 is a fragmentary plan view indicating one example of a construction of a frame material of a lead frame used for assembly of QFP shown in FIG. 35.

First of all, as shown in FIG. 38, QFP 16 shown in FIG. 35 is of a construction which comprises a first bar lead 1h which is a ring-form common lead arranged inside the inner lead 1b group; corner leads 1g coupled to the first bar lead 1h and arranged at four corners; and a first through-hole 5e formed between the first bar lead 1h and the head end of each inner lead 1b, and the semiconductor chip 2 of the minimum size that corresponds to the minimum mountable size on the tape member 5 is mounted.

Now, in QFP 16 shown in FIG. 35, connection by wire 4 is made between each pad 2a of the semiconductor chip 2 and relevant inner leads 1b corresponding thereto, and further between the pad 2a of ground/power supply of the semiconductor chip 2 and the first bar lead 1h.

In addition, FIG. 36 indicates a construction in which the semiconductor chip 2 of the maximum size corresponding to the maximum mountable size is mounted in QFP 16 shown in FIG. 35.

Furthermore, in QFP 16 shown in FIG. 37, connection by wire 4 is carried out between each pad 2a of the semiconductor chip 2 and relevant inner leads 1b corresponding thereto as well as between the pad 2a of ground or power supply of the semiconductor chip 2 and the first bar lead 1h, and further between the first bar lead 1h and the inner lead 1b.

Consequently, the pad 2a of ground or power supply of the semiconductor chip 2 is connected to the common ground or power supply terminal via the first bar lead 1h, common lead, and further the first bar lead 1h is connected to the external mount substrate and others via four corner leads 1g.

Next discussed is a method for manufacturing QFP 16 of the present embodiment 2 and a method for manufacturing the lead frame 1 used for QFP 16.

First of all, a frame material 1a as shown in FIG. 38 is prepared.

This frame material 1a couples integrally one another a plurality of inner leads 1b arranged in correspondence with a pad 2a row of the semiconductor chip 2 to be mounted; a plurality of outer leads 1c formed integral to the inner leads 1b; a coupling section 1j for coupling the leading end sections of a plurality of inner leads 1b integrally one another; and a ring-form first bar lead 1h which couples other four corner leads 1g arranged at corners adjacent to the plurality of inner lead groups coupled by the coupling section 1j and is arranged at the inner side for the coupling section 1j.

That is, in addition to a plurality of inner leads 1b and outer leads 1c, the frame material 1a comprises the coupling section 1j which couples the leading end sections of a plurality of inner leads 1b corresponding to one side of the semiconductor chip 2; and the ring-form first bar lead 1h arranged at the inner side for the coupling section 1j and coupling the corner leads 1g which are four inner leads 1b arranged at corners.

Meanwhile, to the frame material 1a, silver plating 7 is provided at the region from each of the leading end sections to the place where wire connection is carried out on the wire connected surface 1f of each inner lead 1b including four corner leads 1g. In such event, the coupling section 1j and the first bar lead 1j are coated by silver plating 7.

Figure 39:
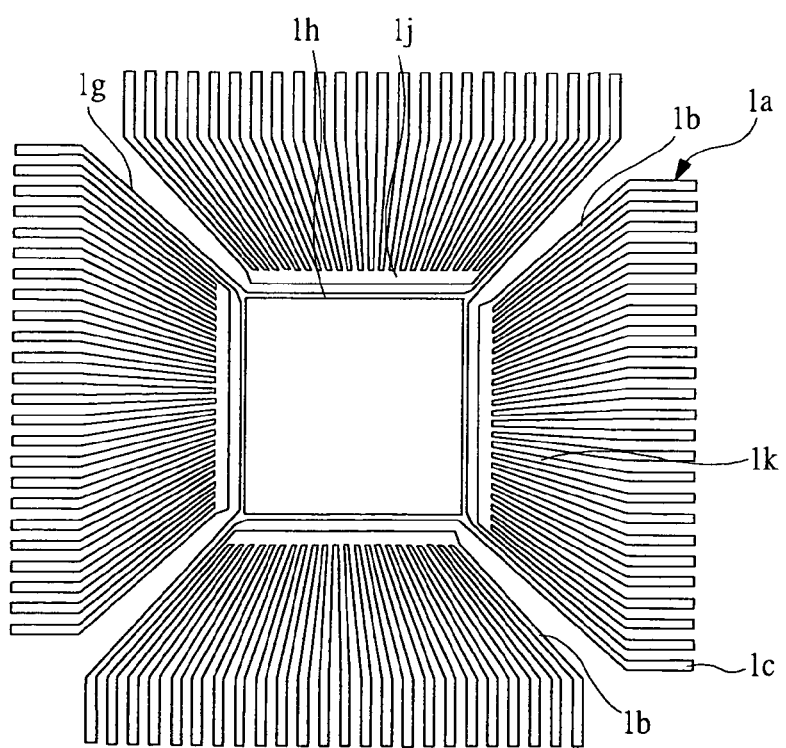
FIG. 39 is a rear view of the frame material shown in FIG. 38.

In addition, as shown in FIG. 39, to the rear surface 1k of the frame material 1a, no silver plating 7 as shown in FIG. 38 is provided.

Figure 40:
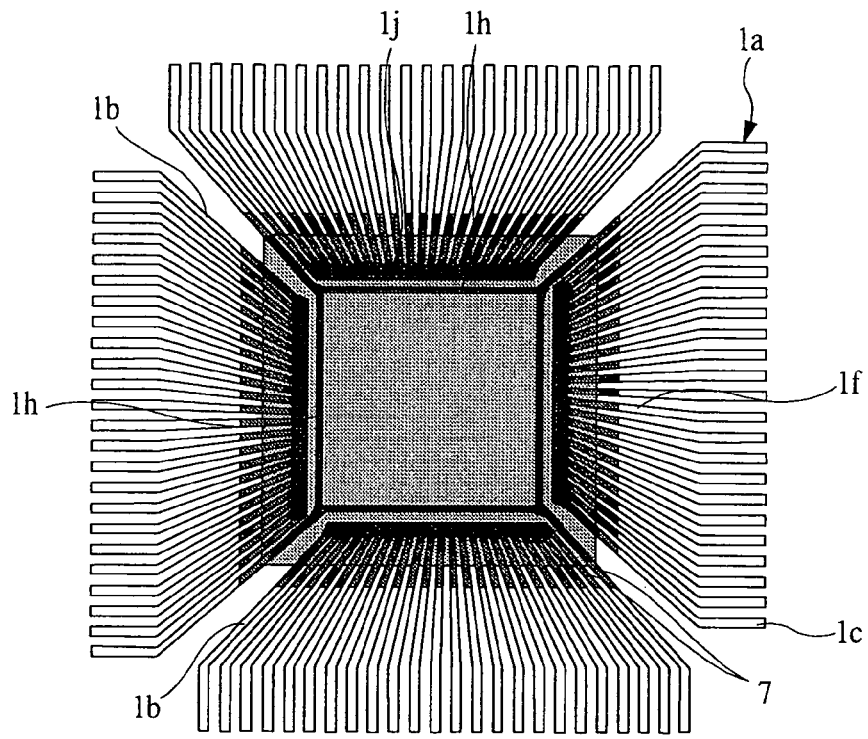
FIG. 40 is a fragmentary plan view indicating a construction of a lead frame manufactured by affixing a tape member to the frame material shown in FIG. 38.
Figure 41:
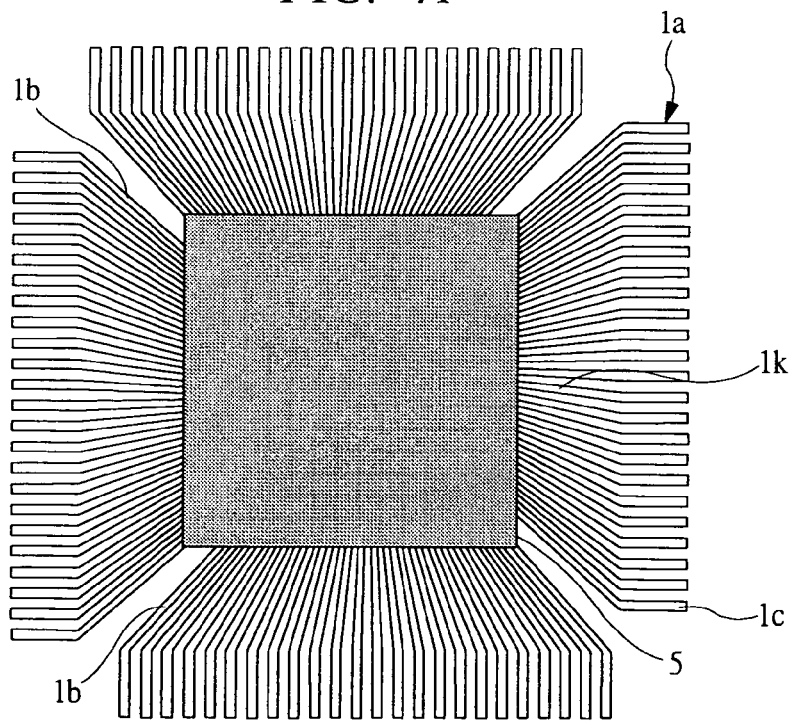
FIG. 41 is a rear view of the lead frame shown in FIG. 40.

Thereafter, as shown in FIG. 40, the relevant rear surfaces 1k of the leading end sections of plural inner leads 1b, coupling section 1j, and the first bar lead 1h are affixed to the tape member 5. The construction of the frame material 1a as viewed from its rear surface 1k after affixing the tape member is the one shown in FIG. 41.

Figure 42:
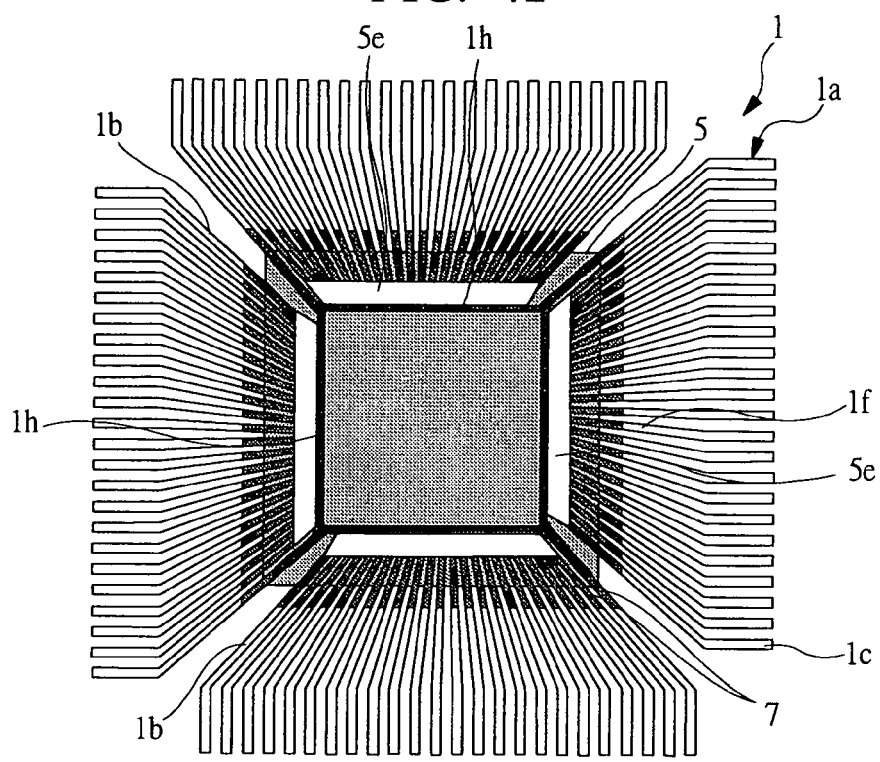
FIG. 42 is a fragmentary plan view indicating a construction after cutting a first coupled portion of the lead frame shown in FIG. 40.

Thereafter, the coupling section 1j is cut along the heat end sections of plural inner leads 1b, the coupling section 1j is removed from the frame material 1a, and four first through-holes 5e as shown in FIG. 42 are formed.

Figure 43:
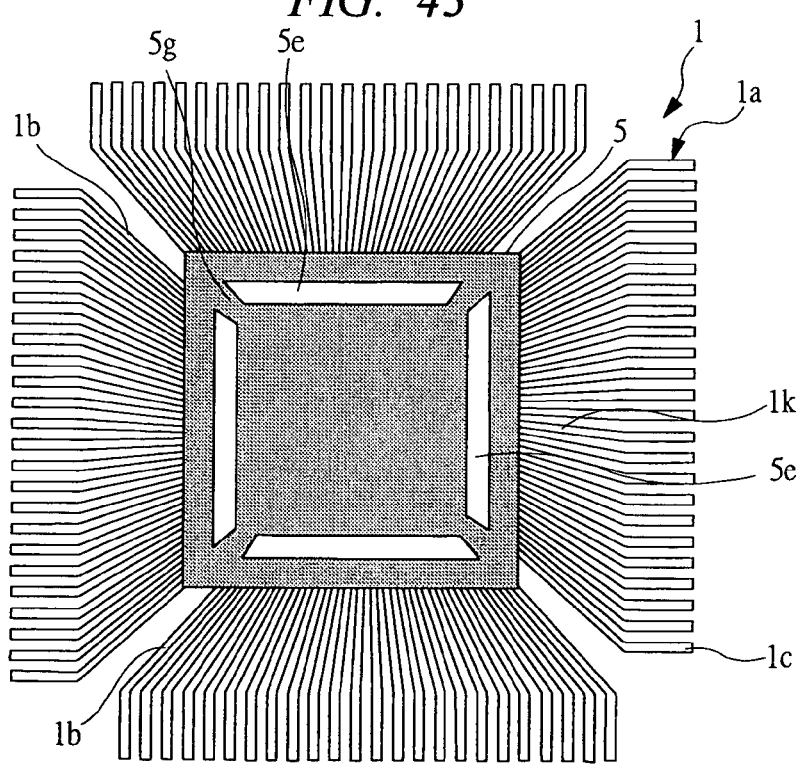
FIG. 43 is a rear view of the lead frame shown in FIG. 42.

By this, the lead frame 1 as shown in FIG. 42 and FIG. 43 is manufactured.

In the lead frame 1 according to he present embodiment 2, to each inside of the four first through-holes 5e, the first bar lead 1h, common lead, is arranged, so that the rigidity of the chip mounting region of the tape member 5 can be increased as well as that the strength of the bar lead which serves as the common lead can be improved because the corner leads 1g arranged at the four corners are integrally coupled by the ring-form first bar lead 1h.

By this, generation of undulation of the tape member 5 can be prevented, and the yield in manufacturing the lead frame 1 can be improved.

Thereafter, die-bonding for mounting the semiconductor chip 2 is carried out on the surface same as the bonded surface 5c of the tape member 5 to the inner lead 1b.

In such event, as shown in FIG. 35, the semiconductor chip 2 is fixed by, for example, the silver paste 8.

Thereafter, wire-bonding for connecting the pad 2a of the semiconductor chip 2 to the inner lead 1b corresponding to this by wire 4 is carried out.

In this case, in the wire connection between the wire 4 and the inner lead 1b, that is, at the second bonding, the silver plating 7 formed portion on the wire connected surface 1f of the inner lead 1b is connected to the wire 4 as shown in FIG. 38.

After completion of wire-bonding, the semiconductor chip 2 and plural wires 4 are resin-encapsulated using encapsulating resin and the encapsulated section 3 is formed.

Thereafter, a plurality of outer leads 1c are cut, respectively, to separate them from the lead frame 1 and at the same time, the outer lead 1c is formed by bending to complete the assembly of QFP 16.

Figure 44:
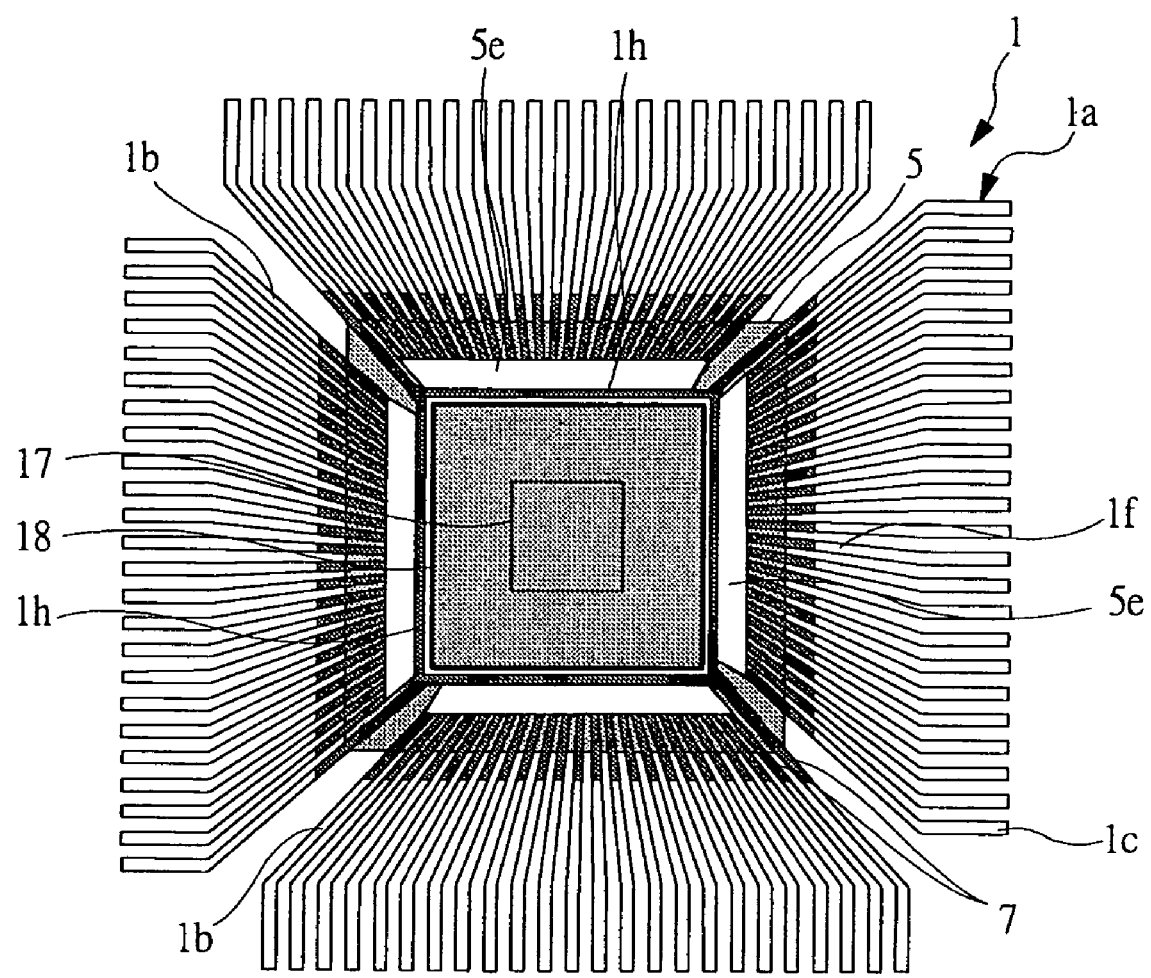
FIG. 44 is a fragmentary plan view indicating the minimum mountable chip size and the maximum mountable chip size of the lead frame shown in FIG. 42.
Figure 45:
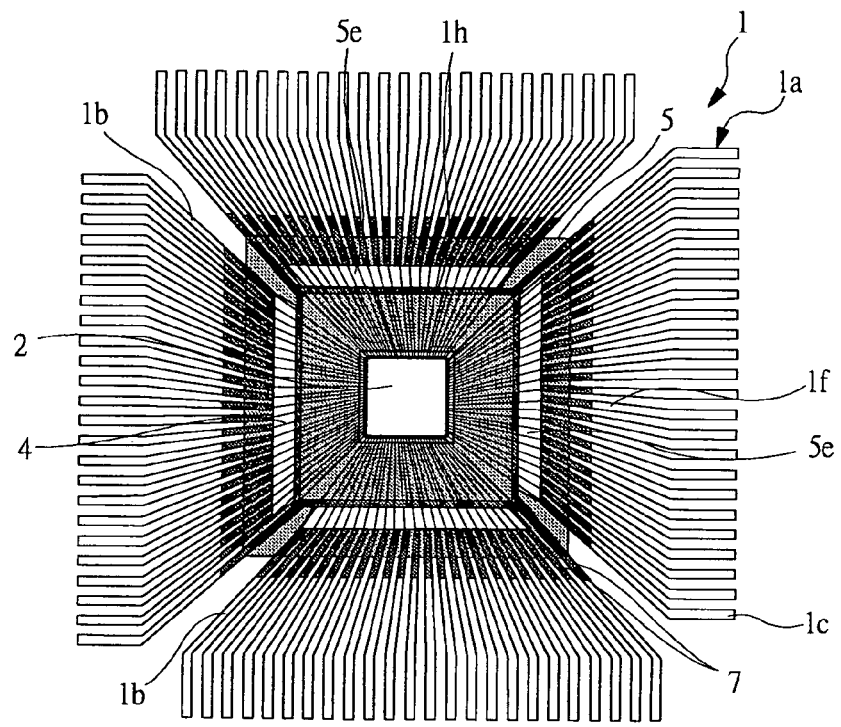
FIG. 45 is a fragmentary plan view indicating one example of a construction after wire-bonding when a minimum-size semiconductor chip is mounted to the lead frame shown in FIG. 42.
Figure 46:
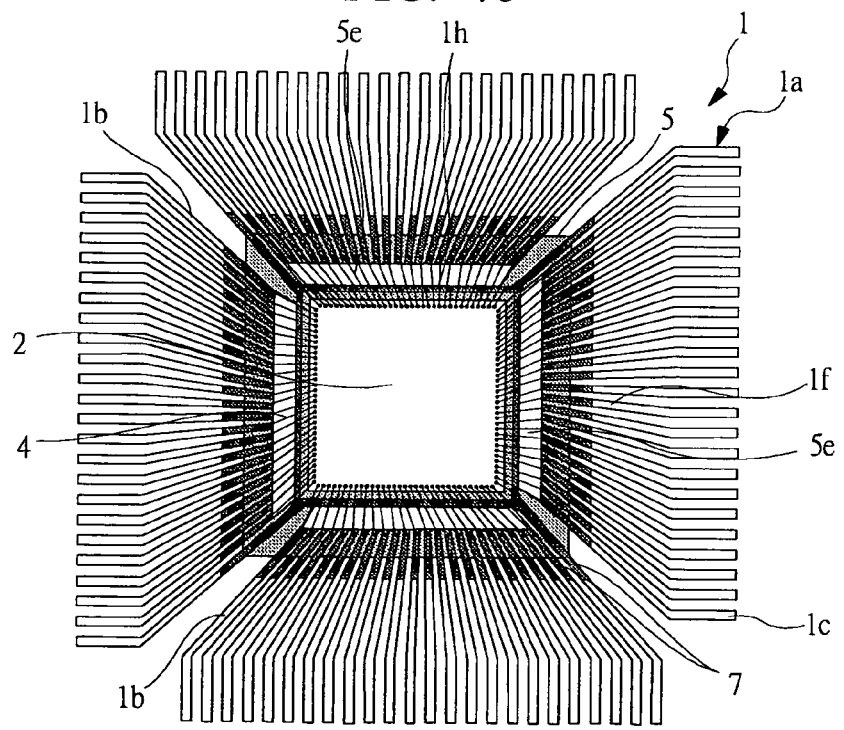
FIG. 46 is a fragmentary plan view indicating one example of a construction after wire-bonding when a maximum-size semiconductor chip is mounted to the lead frame shown in FIG. 42.

By the way, FIG. 44 shows the minimum chip mounted area 17 and the maximum chip mounted area 18 in the lead frame 1 shown in FIG. 42, and furthermore, FIG. 45 shows a construction in which wire-bonding is carried out with the minimum semiconductor chip 2 mounted, while FIG. 46 shows a construction in which wire-bonding is carried out with the maximum semiconductor chip 2 mounted.

In this way, in the lead frame 1 used for the present embodiment 2, the semiconductor chips 2 of various sizes can be mounted and the versatility of the lead frame 1 can be increased.

Meanwhile, because four corner leads 1g are coupled integrally with the ring-form first bar lead 1h in the lead frame 1 shown in FIG. 42, this first bar lead 1h is used for one common power supply or one common ground.

According to QFP 16 according to the present embodiment 2, the power supply or ground can be reinforced without so much increasing the number of power supply or ground terminals exposed from the encapsulated section 3 as external terminals.

For example, because in the case of a publicly known example shown in FIG. 8 which was mentioned in Japanese Patent Application Laid-Open Publication No. 9-252072, a lead that is coupled to the common lead and exposed to the outside must be installed when the common lead which is a busline 50 of the power supply or ground is installed in correspondence to each side of the quadrilateral semiconductor chip, a space for 8 inner leads is required, serving as disincentive to the intention to increase the number of pins resulting from reduced inner lead head end width or to shorten the wire length.

In the case of QFP 16 assembled by the use of the lead frame 1 shown in FIG. 42 of the present embodiment 2, four external terminals exposed to the outside are installed as common leads of the power supply or ground, enabling the reduction of four external terminals as the common leads of power supply or ground, and at the same time, since a larger region to which the head end of the inner lead 1b can be secured, it becomes possible to arrange the inner lead head end still closer to the semiconductor chip 2.

In addition, because the first bar lead 1h is formed in the form of a frame, the rigidity of the whole tape member 5 can be increased.

Furthermore, let the number of the whole external terminals exposed to the outside be the same; then, in the case of QFP 16 of the present embodiment 2, more than four signal terminals can be used as signal terminals as compared to the known example, and consequently, QFP 16 of the present embodiment 2 is remarkably effective for multi-pin packages.

Now, discussion will be made on the lead frame 1 of a modified example of the present embodiment 2.

Figure 47:
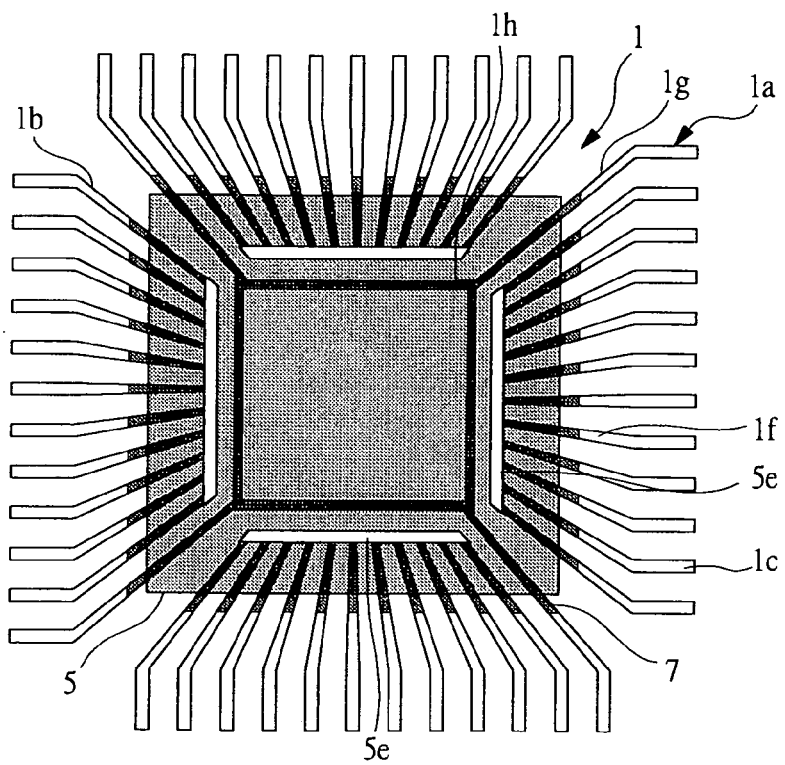
FIG. 47, FIG. 48, and FIG. 49 are fragmentary plan views, respectively, indicating a lead frame construction of a modified example in embodiment 2 according to the present invention.

The lead frame 1 of the modified example shown in FIG. 47 has the number of pins of the lead frame 1 shown in FIG. 42 reduced, with other construction same as that of FIG. 42.

Figure 48:
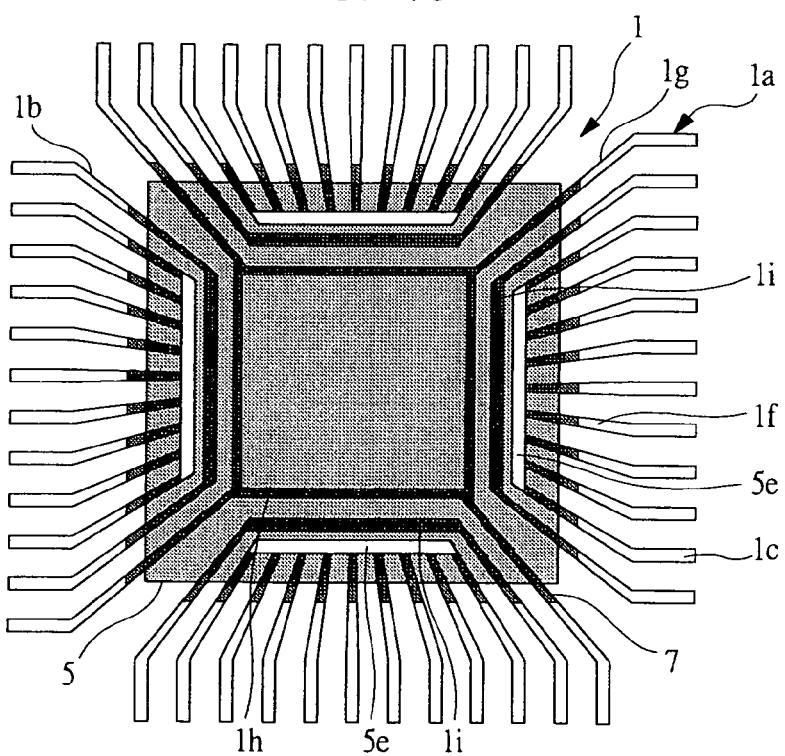

In addition, the lead frame 1 of the modified example shown in FIG. 48 is the case in which a second bar lead 1i serving as a common lead is provided outside the first bar lead 1h. That is, the semiconductor device is manufactured by the use of a frame material 1a which has the second bar lead 1i with its both ends coupled to the inner lead 1b between the coupled section 1j and the first bar lead 1h shown in FIG. 38, and when the coupled section 1j is cut and removed after affixing the tape member 5, the coupled section 1j is cut in such a manner that the coupling with the second bar lead 1i of the inner lead 1b coupled to the both ends of the second bar lead 1i is allowed to remain of the plurality of inner leads 1b aligned in one row and coupling between the plural inner leads 1b arranged in its inside and the coupled section 1j is eliminated, and the coupled section 1j is removed from the frame material 1a and four first through-holes 5e are formed to manufacture the lead frame 1.

Because two types of common leads are installed in the lead frame 1 of the modified example shown in FIG. 48, the common leads can be used as two common power supplies or two common grounds, or a combination of each one of both. Consequently, this is effective for a multi-pin semiconductor device.

Figure 49:
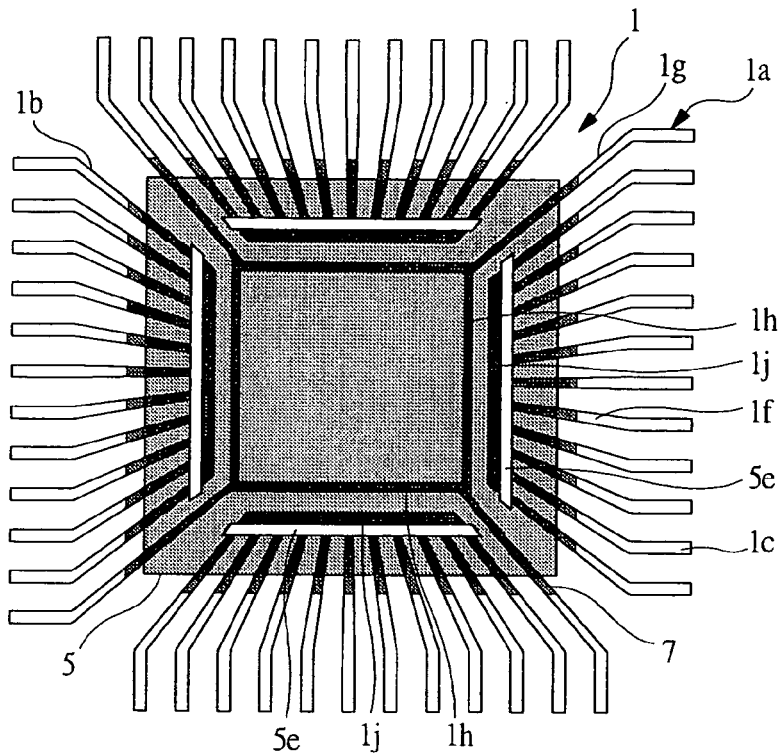

The lead frame 1 of the modified example shown in FIG. 49 has the coupled section 1j left on the tape member 5, and therefore, after the tape member 5 is affixed to the frame material 1a, the coupled section 1j is not cut but the leading end sections of the plural inner leads 1b connected to the coupled section 1j is cut along the coupled section 1j in such a manner that this coupled section 1j remains on the tape member 5.

Figure 50:
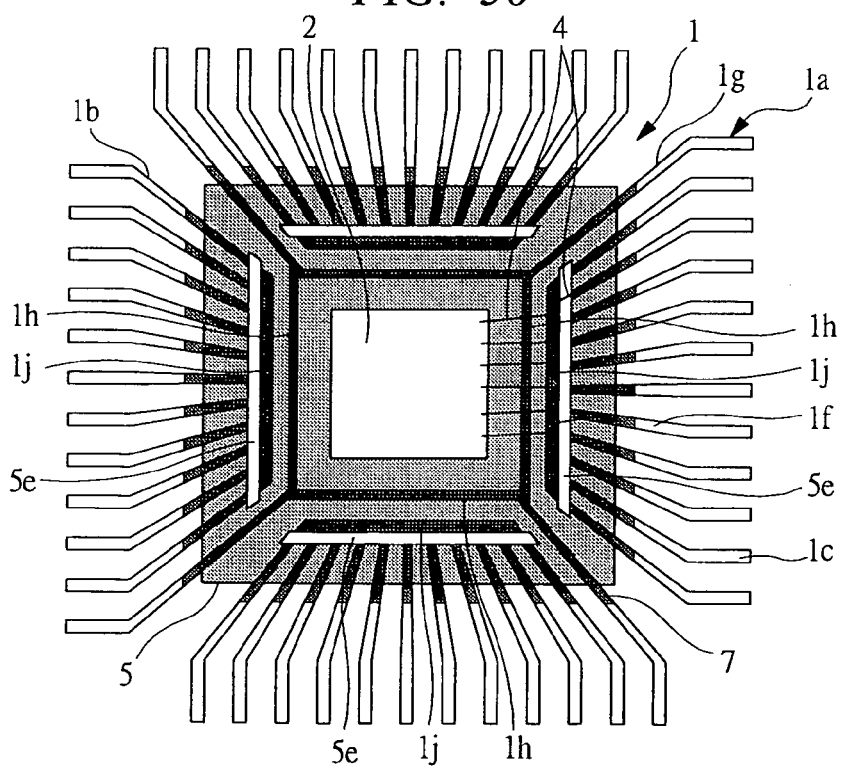
FIG. 50 is a fragmentary plan view indicating one example of wire-bonding condition of the lead frame shown in FIG. 49.

Because, as shown in FIG. 50, this enables the wire connection between the pad 2a (see FIG. 35) of the semiconductor chip 2 and the coupled section 1j, wire connection between the coupled section 1j and the inner lead 1b at any locations, the degree of freedom of wire 4 arrangement or pad 2a arrangement increases and at the same time, this can be effectively utilized in multi-pin semiconductor devices.

Figure 51:
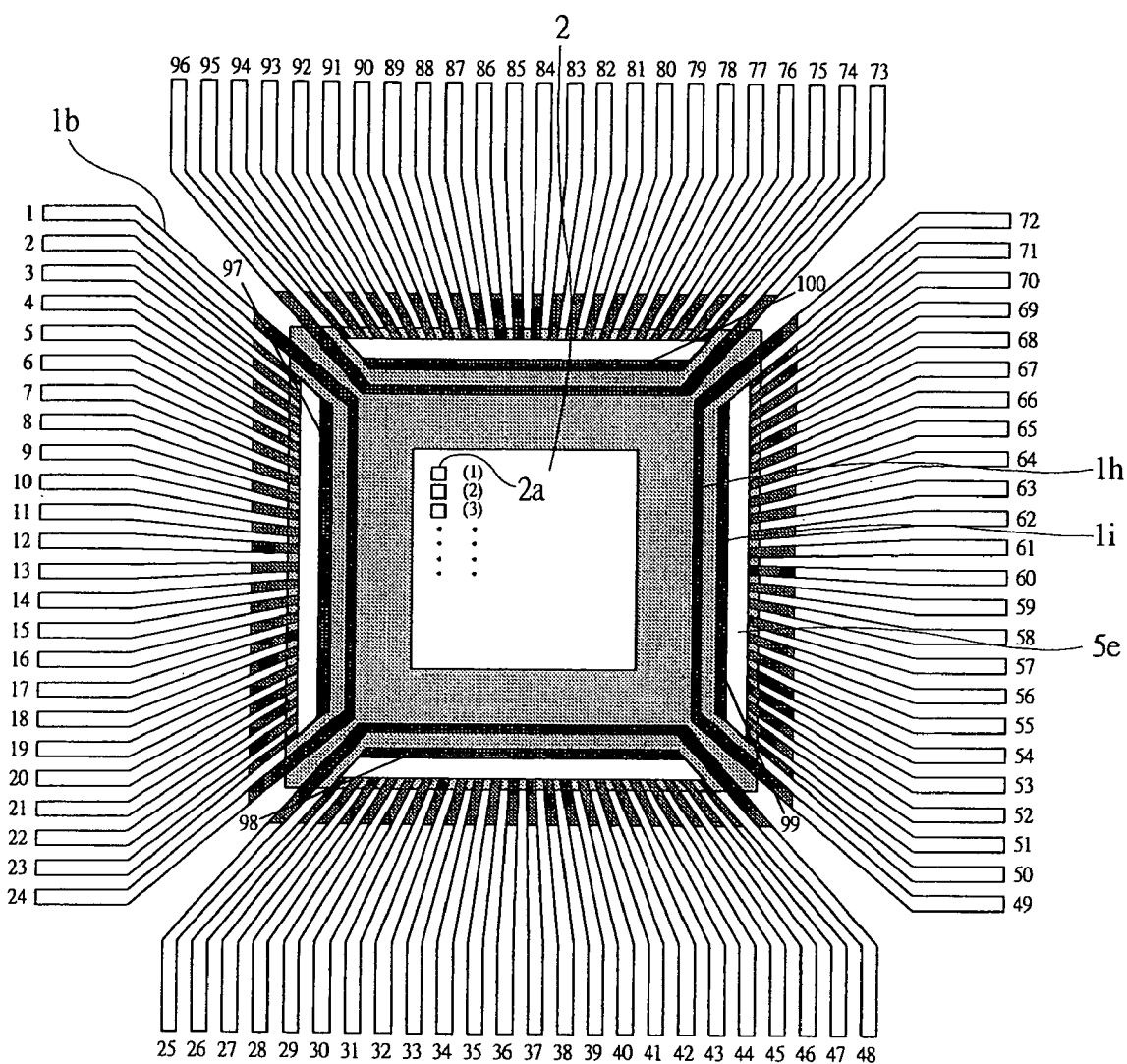
FIG. 51 is a fragmentary plan view indicating a construction of a lead frame of a modified example in embodiment 2 according to the present invention.

Next, FIG. 51 and FIG. 52 indicate the correspondence relationship between the pad 2a and the inner lead 1b on the chip when the lead frame 1 of the modified example of the embodiment 2 and one example of the common lead use condition, and in FIG. 51 and FIG. 52, pad number (primary side) is indicated by (1) . . . and lead number (secondary side) is indicated by 1 . . . 100. Furthermore, in the secondary-side lead number shown in FIG. 52, leads of the shaded number are used as power supply or ground.

Because a large number of the secondary side can be provided as common leads as shown in FIG. 52, this is effective for increased pins.

Figure 54:
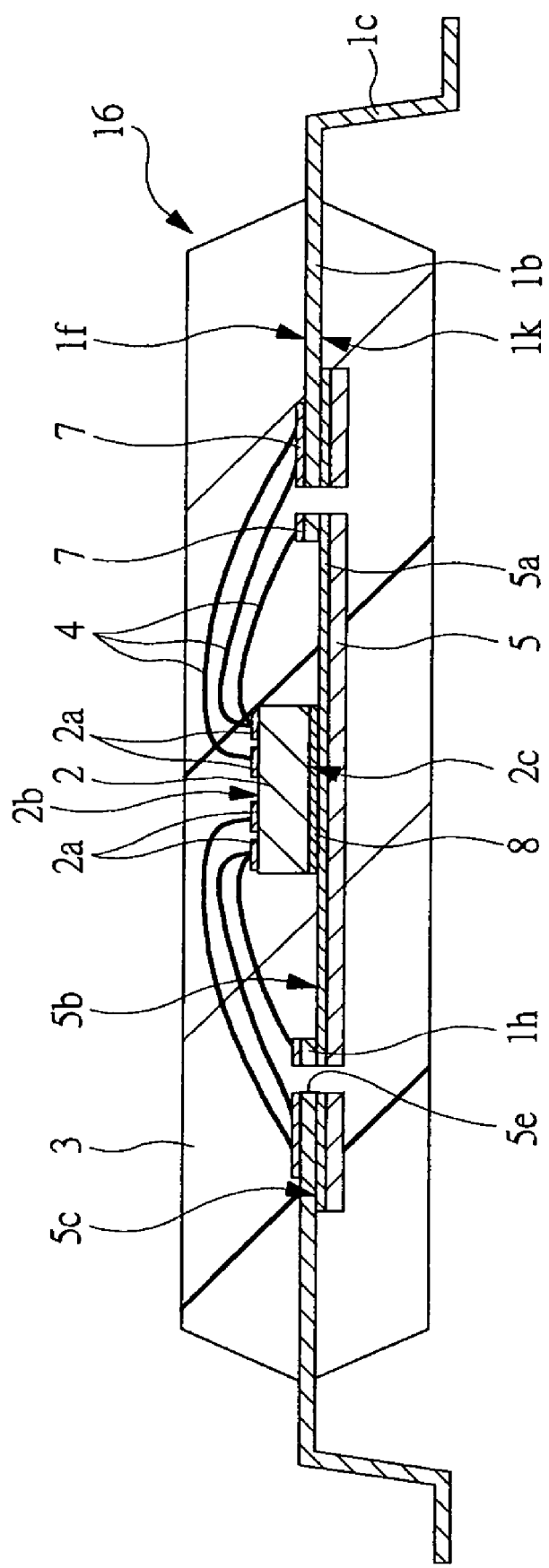
FIG. 54 is a cross-sectional view showing a construction of QFP of a modified example of embodiment 2 according to the present invention.
Figure 55:
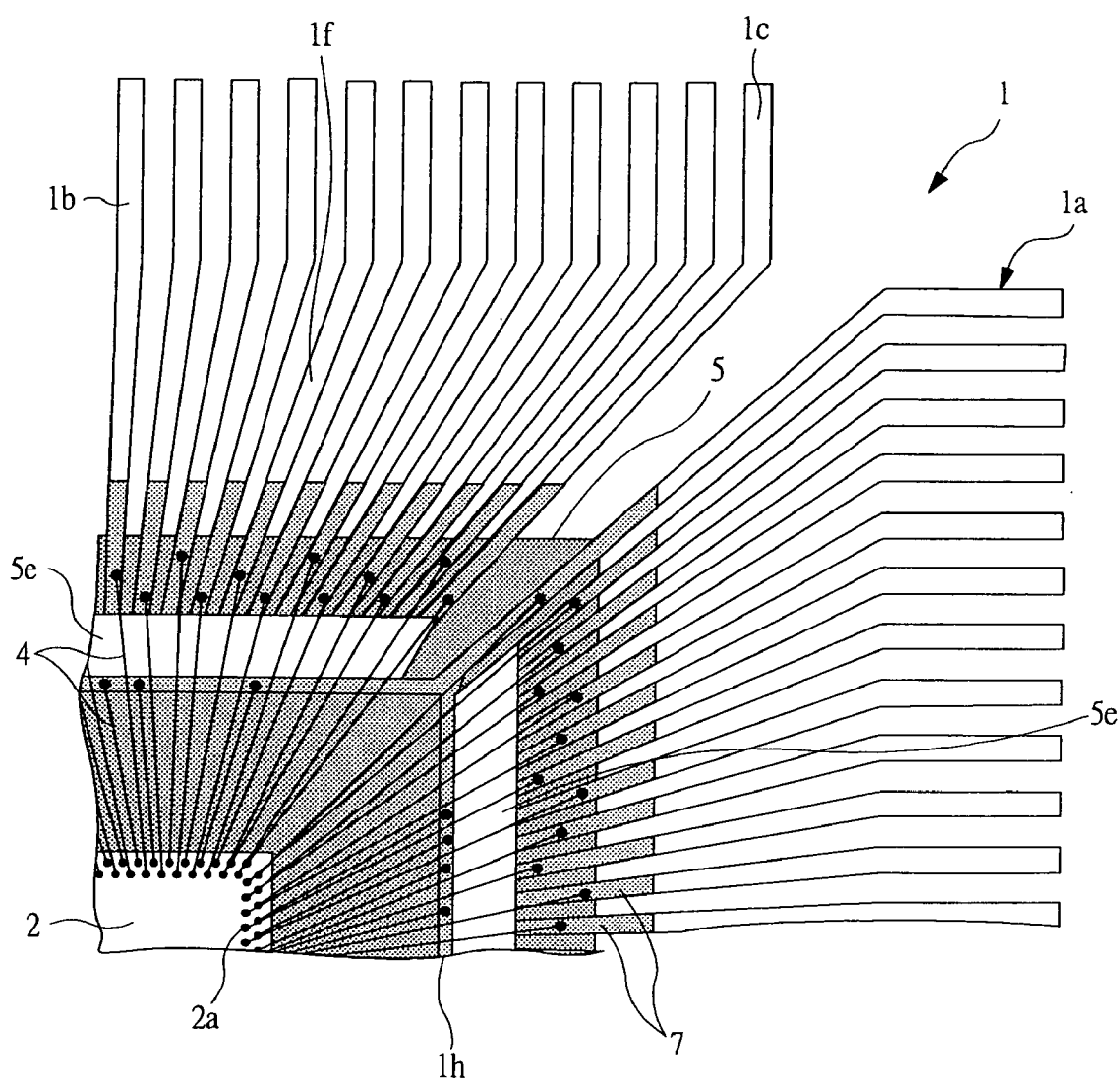
FIG. 55 is an enlarged fragmentary plan view indicating one example of wiring condition of QFP shown in FIG. 54.

Next, the construction shown in FIG. 54 is a drawing concerning a modified example when the wire 4 connecting position on the inner lead 1b and the arrangement of pad 2 on the semiconductor chip 2 are made in a zigzag pattern in FIG. 35 of the present embodiment 2, and the construction shown in FIG. 55 is a plan view with part enlarged in the modified example shown in FIG. 54.

In recent years, the present inventor investigated a technique for securing intervals between wires and positional intervals to which the wire 4 is bonded and preventing failure resulting from contact of wires themselves or contact of wire 4 with a wire-bonding jig by arranging the position to bond the wire 4 on the inner lead and the semiconductor chip in a zigzag pattern and keeping the loop height of the outside wire 4 higher than the loop height of the inside wire 4.

In the case of arranging the position to bond the wire 4 in a zigzag pattern in this way, a phenomenon in that the length of wire 4 which forms the outside loop becomes longer than the case in which the positions for bonding the wire 4 are aligned linearly occurs.

The wire 4 having a long loop form is likely to cause deformation of wire 4 in the resin encapsulating process by the transfer molding method, and it becomes difficult to prevent failure resulting from contacts of two wires.

Therefore, when the wire-bonding position is arranged in the zigzag pattern, it is effective to adopt the configuration described in the present modification example in which the head ends of the inner leads 1b are fixed on the tape member 5 via the adhesive layer 5a. That is, because in the present modification example, the head end of the inner lead 1b is fixed to the tape member 5, it becomes possible to arrange the head end of the inner lead 1b at still finer pitches, and it becomes possible to arrange the predetermined number of head ends of inner leads 1b still closer to the outer circumference of the small semiconductor chip 2, and it is possible to keep the length of wire 4 shorter than that in the case where the head end of the inner lead 1b is arranged distantly. And by this, even in the semiconductor device which has inside and outside wire loops, too, it is possible to effectively prevent deformation of wire 4 in the resin encapsulating process in which a transfer molding method is adopted.

In the present modified example, the description is made on the case in which both the portion to which the wire 4 on the inner lead 1b is bonded and the pad 2a on the semiconductor chip 2 are arranged in a zigzag pattern, but the present invention shall not be limited to such a case only but can be applied to the case in which the head end of the inner lead 1b is fixed to the tape substrate 5 and refinement of the head-end pitch of the inner lead 1b is encouraged to have an effect of reducing the wire loop length even when either the portion to which the wire 4 on the inner lead 1b is bonded or the portion to which the wire 4 on the semiconductor chip 2 is bonded is arranged in a zigzag pattern.

Figure 53:
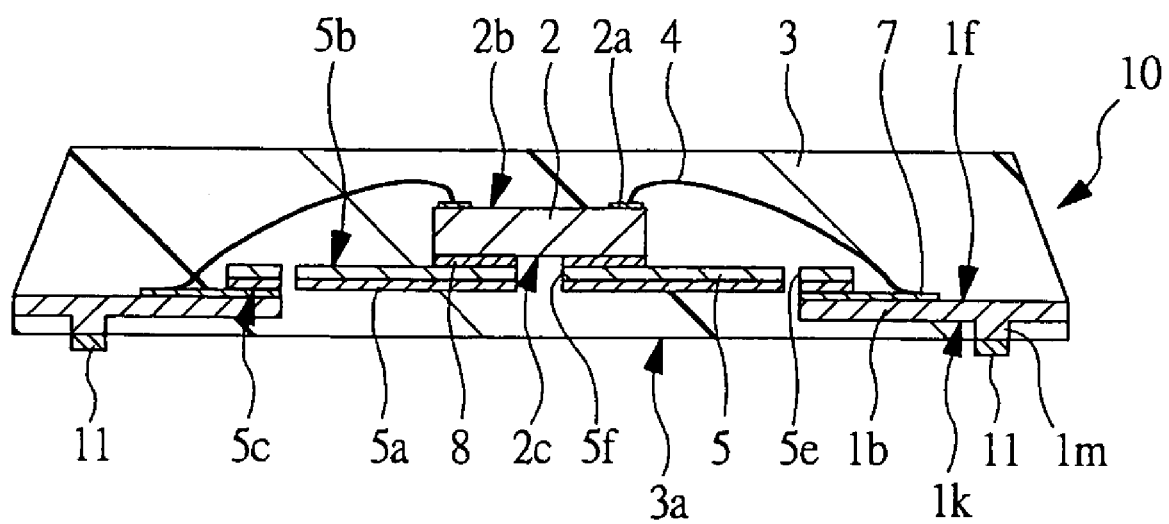
FIG. 53 is a cross-sectional view indicating one example of construction of a semiconductor device (QFN) of another embodiment according to the present invention.

Meanwhile, in the embodiments 1 and 2, the description is made with QFP 6, 16 taken up as semiconductor devices, but for the semiconductor device, QFN (Quad Flat Non-leaded Package) 10 and others as shown in a modified example of FIG. 53 may be available if it is assembled by the use of a lead frame.

QFN 10 is a small-size semiconductor package, with part of the inner lead 1b embedded in the encapsulated section 3 exposed to the rear surface 3a of the encapsulated section 3 as a connected section 1m, and is of a construction in which this connected section 1m is connected to solder 11.

For this kind of small-size QFN 10, the manufacturing method of the semiconductor device according to embodiments 1, 2 can be applied.

Next description will be made on embodiments 3 through 8. By the way, in embodiments 3 through 8, the explanation will be made primarily on the examples in which the present invention is applied to the Quad Flat Package (QFP) with gull-wing form leads protruded from the side surface of four directions of the package. QFP has a specified package shape and the number of pins can be increased by shortening the lead pitches. In addition, the present invention is applicable to Quad Flat Non-leaded Package (QFN) which has a construction inside the resin-encapsulated package nearly similar to that of QFP but has no leads protruded from the package side surfaces. Being similar to QFP, the explanation will be omitted in embodiments, but it should be noted that the present invention is applicable to Quad Flat Package with Heat Sink (HQFP) of a type with heat sink attached to QFP.

Embodiment 3

Figure 56:
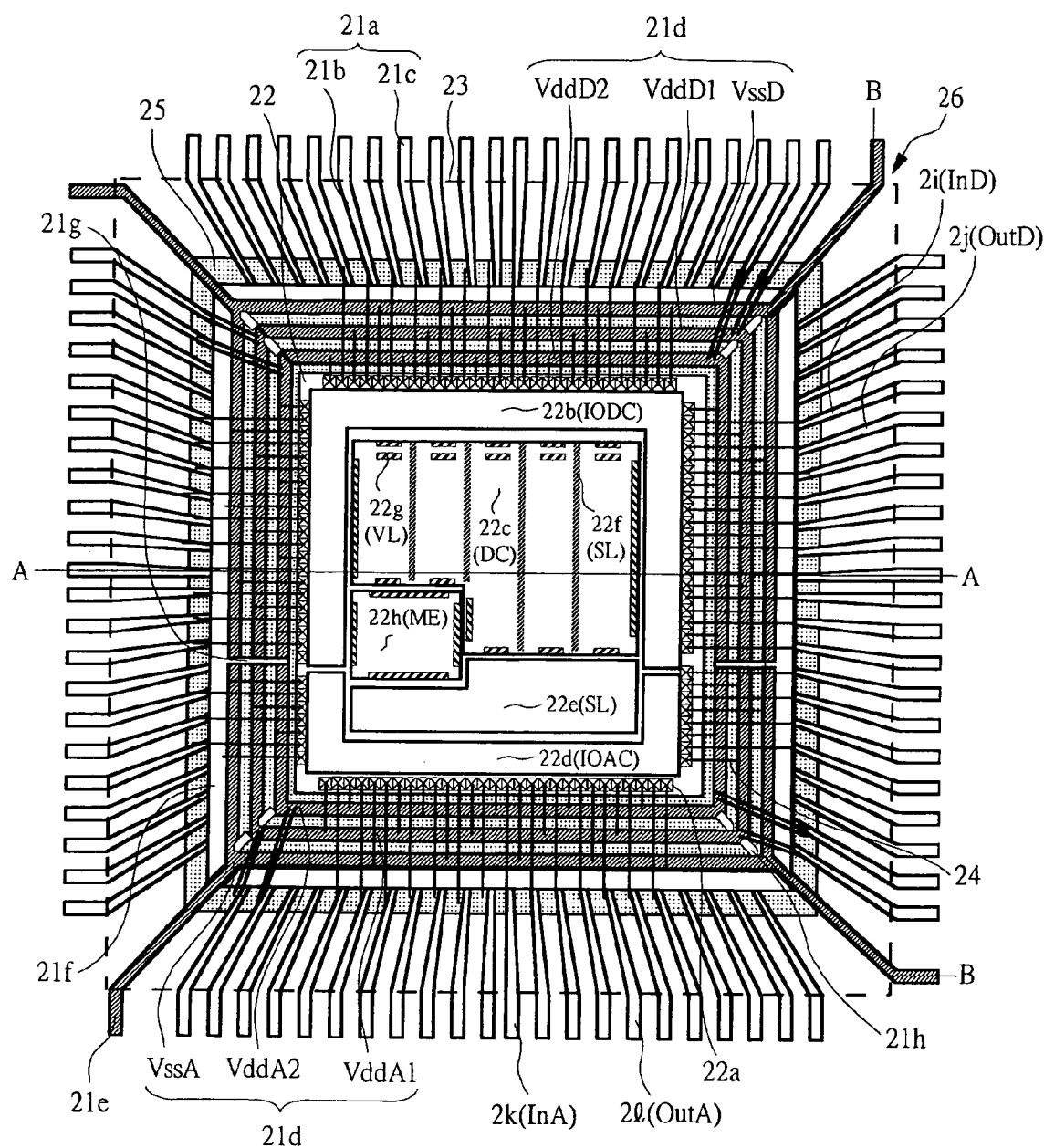
FIG. 56 is a layout drawing with a bus-bar separated by a digital circuit section and an analog circuit section.
Figure 57:
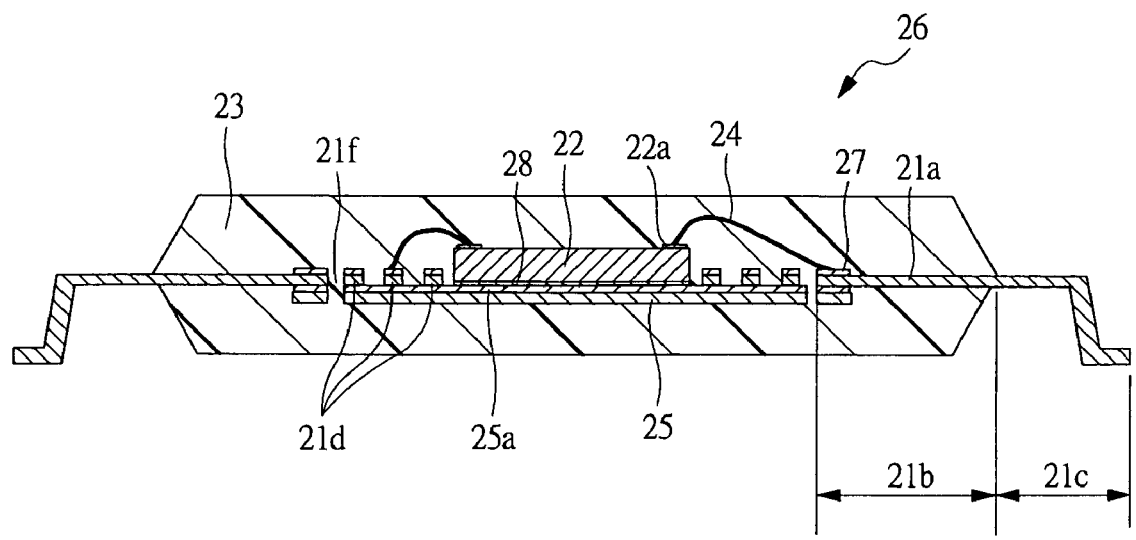
FIG. 57 is a cross-sectional view taken on line A-A of the semiconductor device of FIG. 56.
Figure 58:
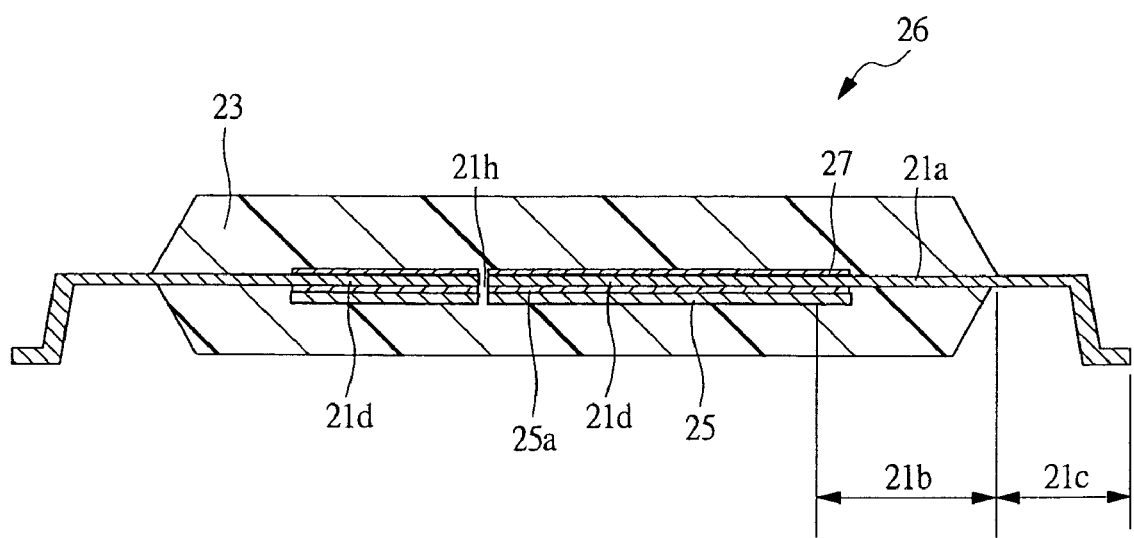
FIG. 58 is a cross-sectional view taken on line B-B of the semiconductor device of FIG. 56.

The semiconductor device according to the embodiment 3 shown in FIG. 56 through FIG. 58 is QFP 26 of a type in which a semiconductor chip 22, lead 21a (inner lead 21b, outer lead 21c) and bus-bar 21d (bar lead, or may be simply called a lead) are mounted on the upper surface of a substrate 25 (insulative tape member or heat spreader substrate is primarily used). Now, for the bus-bar 21d, there available are digital power supplies VddD1, VddD2, VssD and analog power supplies VddA1, VddA2, VssA. For this type, the wire 24 (gold wire is generally used) which connects the pad 22a to the lead 21a can be shortened by just that much of small level difference between the semiconductor chip 22 and the lead 21a, and contact failure at the time of bonding or flow of wire 24 at the time of resin encapsulating is difficult to occur.

The substrate 25 has the semiconductor chip 22, lead 21a, and bus-bar 21d bonded via an adhesive layer 25a formed on the top surface of the substrate. The adhesive layer 25a is formed by, for example, acrylic adhesive and others. A plurality of leads 21a and bus-bars 21d are originally affixed to the substrate 25 in the integrated state as a lead frame, and then, the cut section 21f cuts the plural leads 21a and bus-bars 21d by punching out the coupled portions together with the substrate 25.

The bus-bar cut section 21g integral with the cut section 21f in FIG. 56 cuts the bus-bar 21d at the vicinity of the boundary between the digital circuit section 22c and the analog circuit section 22e and makes them electrically insulative. Because the cut section 21f and the bus-bar cut section 21g are integrated, they can be punched out at a stretch simultaneously. Because the bus-bar cut section 21h cuts the inner bus-bar 21d (VddD1, VddD2) integrated with the outer bus-bar 21d (VssD), the coupled portion is punched out together with the substrate 25. In the event that the coupled section of the outer and the inner bus-bars 21d is located at the portion punched out by the bus-bar cut section 21g, the bus-bar cut section 21h may not be prepared.

A plurality of leads 21a include an analog circuit input 2k, analog circuit output 2l, digital circuit input 2i, and digital circuit output 2j. There are leads 21a which are connected to power supplies (VddD1, VddD2, VssD, VddA1, VddA2, VssA).

The semiconductor chip 22 comprises digital I/O circuit section 22b operating on digital power supplies (VddD1, VssD); digital circuit section 22c and memory 22h (typically SRAM: Static Random Access Memory) operating on digital power supplied (VddD2, VssD), nonvolatile ROM (Read Only Memory) and others; analog I/O circuit section 22d operating on analog power supplies (VddA1, VssA); analog circuit section 22e operating on analog power supplies (VddA2, VssA); and pad 22a. These circuits are not particularly restricted, but typically, comprise N-type MOS (Metal Oxide Semiconductor) transistors and P-type MOS transistors prepared on a silicon chip by the use of integrated circuit technology. However, they shall not be restricted to this but they may be prepared by bipolar transistor process or BiCMOS process.

The digital I/O circuit section 22b is connected to the pad 22a which supplies VddD1 and VssD by wiring not illustrated. Similarly, the digital circuit section 22c is connected to the pad 22a which supplies VddD2 and VssD and the analog I/O circuit section 22d to the pad 22a which supplies VddA1 and VssA, and the analog circuit section 22e to the pad 22a which supplies VddA2 and VssA, respectively.

The bus-bar 21d (VssD, VssA) located at the outermost position has the lead section 21e (four corners in FIG. 56) which has a similar shape to the lead 21a, and the power is supplied through this lead section 21e. The bus-bar 21d (VddD1, VddD2, VddA1, VddA2) inside is connected to the lead 21a for power supply by wire-bonding. As the wire 24 in the vicinity of four corners in FIG. 56 shows, in this case, one lead 21a and bus-bar 21d are connected two pieces of wire 24 in order to lower the impedance.

In this way, when the connection position of the lead 21a for power supply and the bus-bar 21d is rotationally symmetrical through 90 degrees or 180 degrees, even if a package is rotated and mounted when it is mounted, there is no fear of applying the power supply and GND reversely and device destruction can be prevented. Meanwhile, in FIG. 56, the connection position of lead 21a for power supply and the bus-bar 21d is arranged at the end of each side, but this is not limited to the end.

As shown in FIG. 57, the lead 21a, bus-bar 21d, and semiconductor chip 22 with silver plating 27 applied to the top surface are affixed to the top surface of the substrate 25 by the adhesive layer 25a. However, to the bottom surface of the semiconductor chip 22, silver paste 28 is applied. Each of bus-bars 21d and inner leads 21b is separately arranged and insulated. After the inner lead 21b and the substrate 25 are affixed, the inner lead 21b and the substrate 25 are punched out together by the cut section 21f. The pad 22a and inner lead 21b as well as the bus-bar 21d are connected by gold wire and other wire 24 by wire-bonding. Furthermore, all the portions excluding the outer lead 21c are encapsulated by resin 23.

As shown in FIG. 58, the analog power supply and the digital power supply are separated and insulated by the bus-bar cut section 21g.

Figure 59:
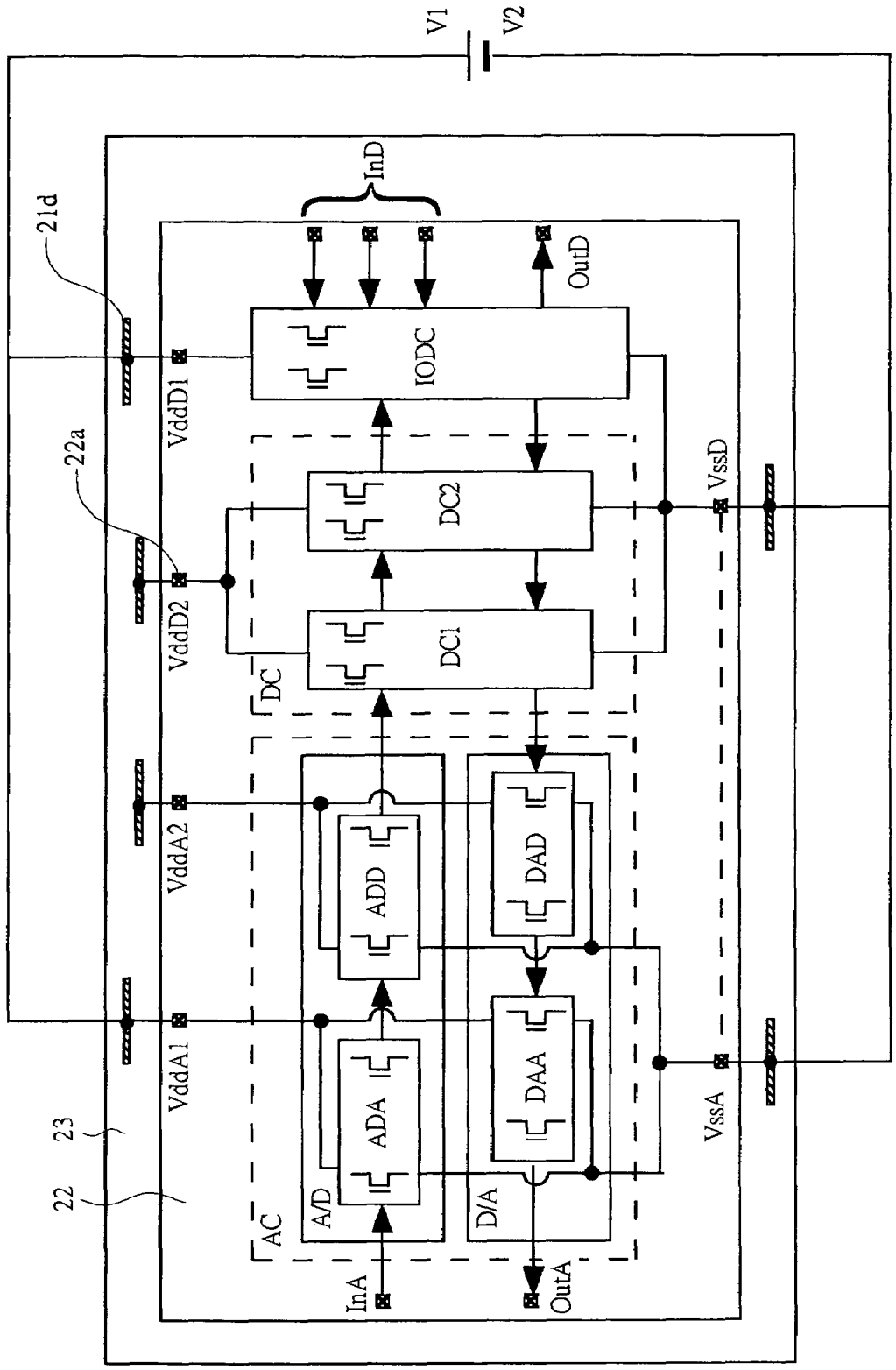
FIG. 59 is a circuit diagram of digital/analog mixed circuit of FIG. 56.

FIG. 59 is a circuit diagram of a digital/analog mixed circuit of FIG. 56. The digital circuit is separated to two power supplies and the analog circuit to two power supplies. The digital first circuit section DC1 and the digital second circuit section DC2 are circuit sections inside the digital circuit section 22c of FIG. 56.

IODC which is the digital I/O circuit section 22b converts the level in response to a digital signal InD from the outside and sends to the inner circuit DC2. The IODC signal amplitude is typically located between VssD and VddD1, while the DC2 signal amplitude is smaller than that and is located between VssD and VddD2. Signals from the inner circuit DC2 has the level converted at IODC and outputted to the outside. DC1 transfers digital signals to and from AC and DC2, which are analog circuit section 22e. DC2 transfers digital signals to and from DC1 and IODC (digital I/O circuit section 22b). DC1 and DC2 are circuit sections inside the digital circuit section 22c of FIG. 56.

The analog circuit section 22e typically comprises an A/D converter which converts analog signals InA from the outside to digital signals and sends to DC1 and a D/A converter which converts digital signal from DC1 to analog signals and outputs to the outside. The A/D converter comprises an A/D converter analog section ADA to which the analog signal InA from the outside is inputted and an A/D converter digital section ADD which receives signals from ADA and sends signals to DC1. The D/A converter comprises a D/A converter digital section DAD to which signals from DC1 are inputted and a D/A converter analog section DAA which received signals from DAD and outputs analog signal OutA to the outside.

The internal power supply VddD2 of the digital circuit section 22c and the internal power supply VddA2 of the analog circuit section 22e are separated but in general, are supplied with the same electric potential. The external power supply VddD1 of the digital circuit section 22c and the external power supply VddA1 of the analog circuit section 22e should satisfy VddD1>VddD2 and VddA1>VddA2 only, and for example, VddD1=VddA1=3.3V and VddD2=VddA2=1.5V are supplied.

To the GND-side power supply VssD of the digital circuit section 22c and GND-side power supply VssA of the analog circuit section 22e are separated but supplied with the same electrical potential. In this case, an example in which the GND side is separated to digital VssD and analog VssA but there are cases where they are made common.

Now, an example in which VddA1 and VddD1 as well as VssA and VssD are separated in a package encapsulated with resin 23 is shown. In general, VddA1 and VddD1 are connected to the external power supply V1 (high potential side) and VssA and VssD are connected to the power supply V2 (low potential side).

Figure 60:
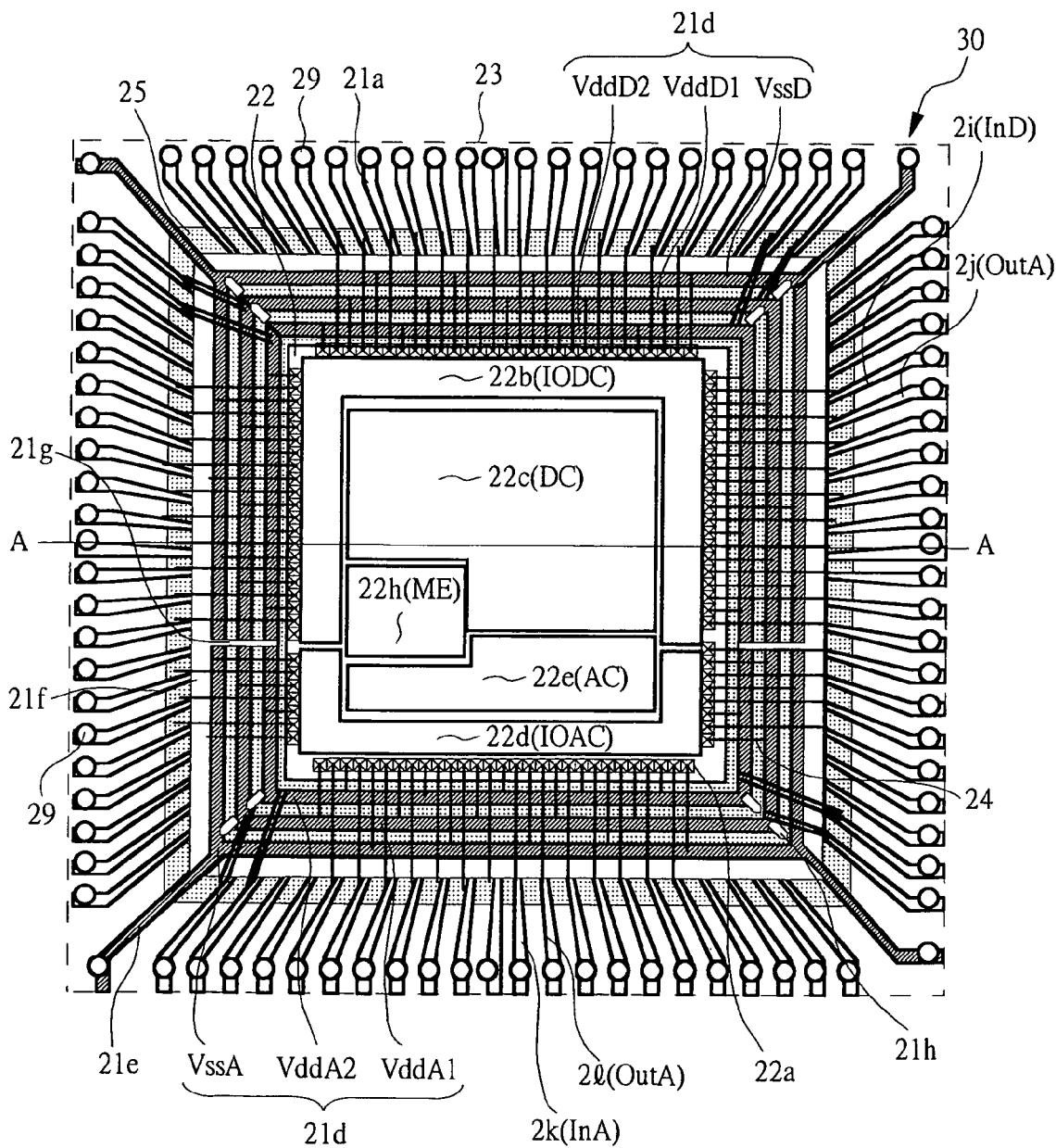
FIG. 60 is a layout drawing when the present invention is applied to QFN.
Figure 61:
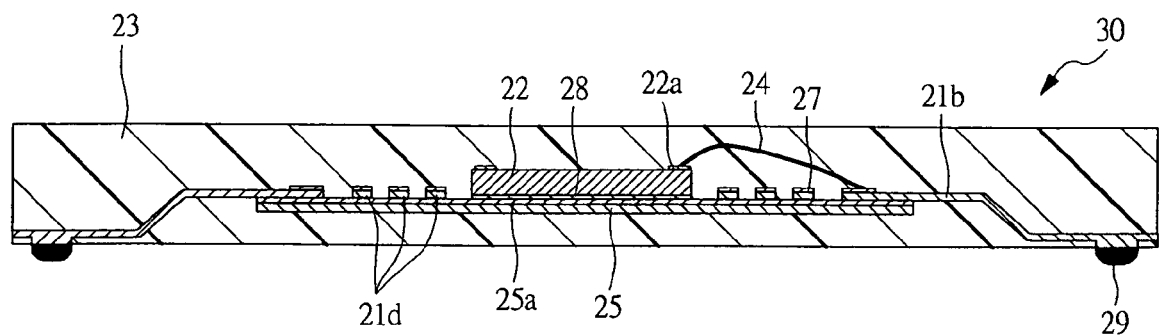
FIG. 61 is a cross-sectional view taken on line A-A of FIG. 56 when the present invention is applied to QFN.

FIG. 60 is a layout drawing when QFN 30 which is a type with the outer lead 21c not protruded from the chip side surface is applied to the present invention. FIG. 61 is a cross-sectional view taken on the line A-A of FIG. 60. This is nearly same construction as that of QFP 26, but differs in the lead 21a which is not protruded from the package side surface. The head end of the lead 21a comes out to the package rear surface (rear surface of the plan view of FIG. 60) and is applied with solder 29.

By the configuration illustrated in FIG. 55 through FIG. 61, the following effects can be obtained.

First, by the bus-bar 21d for power supply installed between the inner lead 21b and the semiconductor chip 22, the number of pads 22a can be greatly increased. This is because wire-bonding to the bus-bar 21d enables the connections irrespectively of pitches of the inner lead 21b, and the pitch of the pad 22a is made smaller than the pitch of the inner lead 21b and the number of pads 22a can be increased from the number of the inner leads 21b. By connecting the pad 22a for power supply to the bus-bar 21d, the number of leads 21a for power supply is greatly reduced. By this, the number of leads 21a which can be used for signals is increased and the number of pads 22a for signals can be increased.

Second, it is possible to supply the power supply separated for each circuit section by separating the bus-bar 21d in accordance with the circuit section arrangement inside the semiconductor chip 22. In recent years, circuits are more closely arranged because of increased miniaturization of LSI (Large Scale Integrated Circuit), so that noise counter measures have become important subjects. In particular, it is important to separate the power supply for the digital circuit section 22c and the analog circuit section 22e to prevent noise generated in the digital circuit section 22c and noise generated in the analog circuit section 22e from exerting influence on each other.

Third, the power supply wiring for supplying the power supply to the circuit section (for example, VL which is the power supply wiring 22g for supplying VddD2 to DC and memory 2h) is able to obtain a sufficient power supply capacity only by connecting to bus-bar 21d of low impedance without going around along the outer circumference of the circuit section on the semiconductor chip 22. Conventionally, the impedance was lowered by allowing the power supply wiring VL to go around along the outer circumference of the circuit section.

As shown in FIG. 56, wiring for signals to date was wired crossing the lower layer or the upper layer of the ring-form power supply wiring layer by a layer different from the power supply wiring layer, but by separating and arranging the power supply wiring VL without going around, it becomes possible to separate and arrange plural kinds of wiring on the same wiring layer and the number of wiring layers can be reduced. It is also possible to lay out the power supply wiring VL and Sl which is signal wiring 22f in the same wiring layer.

Needless to say, allowing the power supply wiring to going around in the same manner as conventional and using a separate layer for the power supply layer can increase the degree freedom of signal wiring 22f.

In addition, to lower the impedance, thick wiring is required, but this causes a problem of increasing a wiring area. If the present invention is used, the wide bus-bar 21d can serve as the go-around wiring, so that the power supply wiring area on the semiconductor chip 22 can be reduced. When the semiconductor chip 22 is miniaturized to be 0.1 □m process or smaller, the wiring becomes relatively slender, too, and the present invention becomes particularly effective.

In the case where the type in which the vicinities of four corners of the lead 21a are integrated with the bus-bar 21d as shown in FIG. 56 (type in which power supply pins are arranged on four corners as a package) is applied to a chip which originally has a pad arrangement of the semiconductor chip 22 and in which power supply pads 22a are arranged at four corners, there is little design change in the semiconductor chip 22, and it is advantageous. For example, for the pad 22a arrangement, power supply pads Vss, Vdd1 (VddD1, VddA1), Vdd2 (VddD2, VddA2) and signal pads IO are arranged from one corner in such a manner as Vss, IO, IO, IO, Vdd1, IO, IO, IO, Vdd2, IO, IO, IO, Vss, . . . , then, several pieces of power supply pins are placed (three are placed in the present embodiment 3), and by arranging in this way, the current consumed at IOs is compensated for as much as possible and at the same time, the power supply drop is frequently prevented, but in such event, if the bus-bar 21d is present, connection and power supply to each of the power supply pads are facilitated and it is advantageous.

Conventionally, because in a multi-pin (for example, 208 pins) type package, consideration is given to the power supply drop, power supply pins are arranged at four corners and power supply pins are frequently arranged at intervals of several pieces as described above, the present invention is easy to apply.

Figure 62:
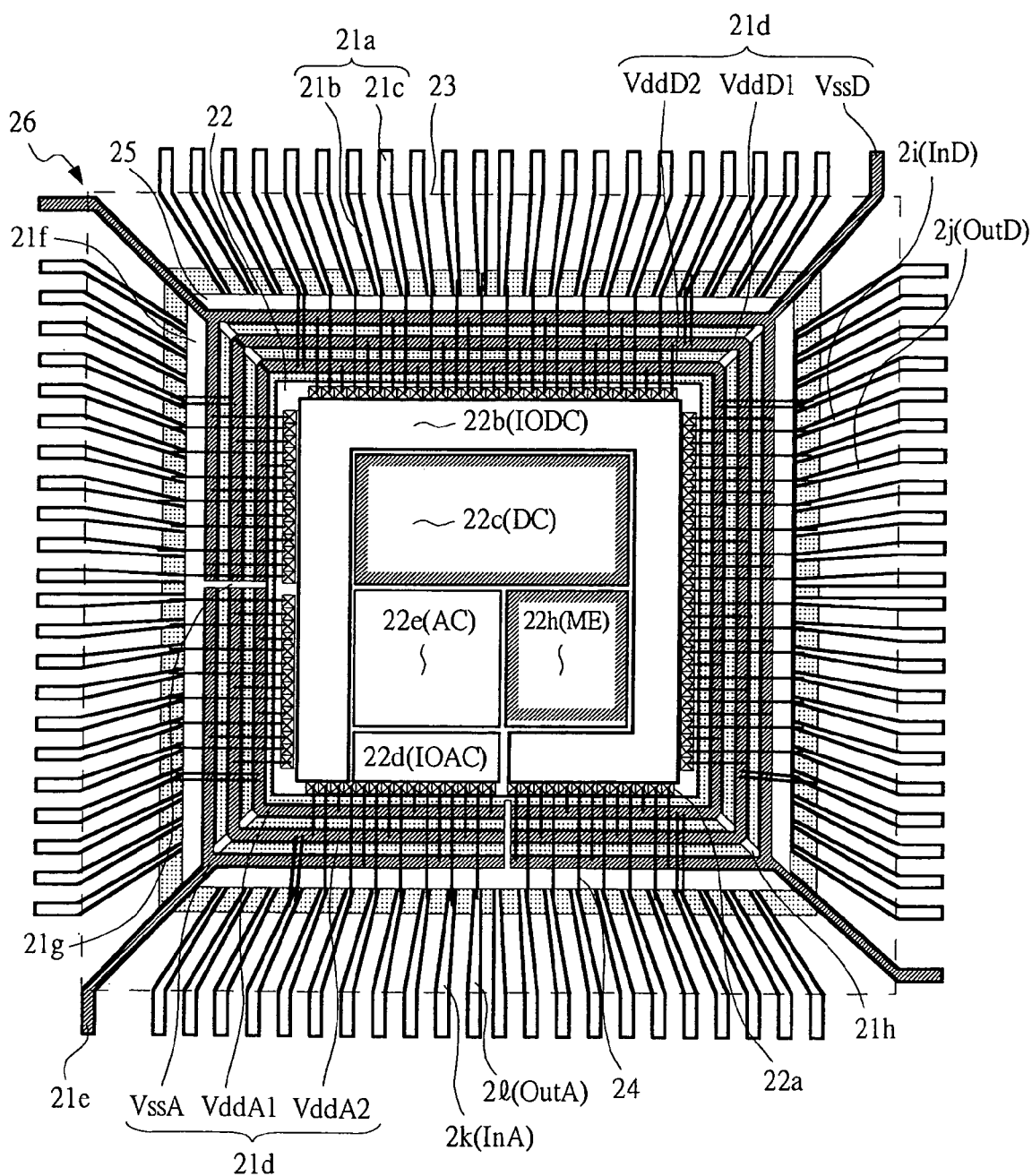
FIG. 62 is another layout drawing with a bus-bar separated by a digital circuit section and an analog circuit section.

FIG. 62 is a modified example of the layout drawing with the bus-bar 21d separated by the digital circuit section 22c and the analog circuit section 22e of FIG. 56. Even if the present invention is applied to the semiconductor chip 22 of a circuit arrangement different from FIG. 56, a suitable arrangement can be achieved only by changing the position of the bus-bar 21d separated by the cut section 21f.

In addition, in FIG. 56, double wire 24 for VddD1 and VddA1 power supply and VddD2 and VddA2 power supply are arranged adjacent each other, but in the present embodiment, they are arranged at places away from each other. By wire-bonding at the position away from each other and supplying power from distant position, the consumed current at each circuit is dispersed and resistance can be still more lowered. In this event, the case of double wire 24 is shown, but wire 24 may be double or more.

Figure 63:
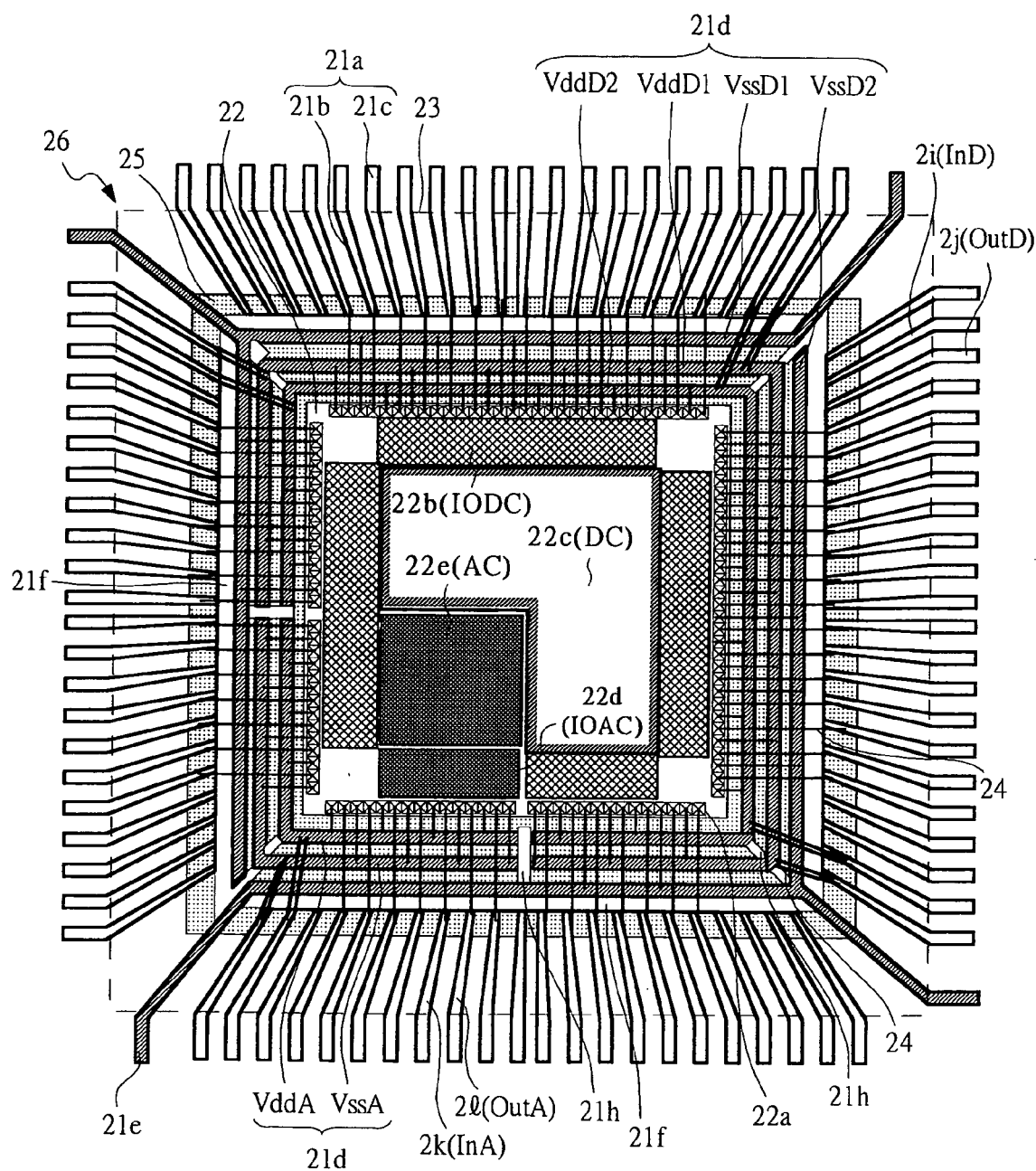
FIG. 63 is a layout drawing in which the analog circuit is separated into one power supply system and the digital circuit into two power supply systems.

FIG. 63 is a modified example of FIG. 62. It is a layout drawing in which he analog circuit is separated into one power supply system (VddA, VssA) and the digital circuit into two power supply systems (VddD1 and VssD1 system and VddD2 and VssD2 system). Same as FIG. 56 and FIG. 62, a type with triple bus-bar 21d is used, but the present case differs from FIG. 56 and FIG. 62 in that the bus-bar 21d is not always separated in the vicinity of the boundary of the circuit sections.

Since in the present embodiment, the digital circuit section 22c requires four bus-bars 21d, the outermost bus-bar 21d is separated to VssD1 and VssD2, which are used for digital applications. The bus-bar cut section 21g integral with the cut section 21f electrically separates the bus-bar 21d by punching out the corner of the outermost bus-bar 21d together with the substrate 25. For the bus-bar cut section 21h in FIG. 63, there are the bus-bar cut section 21h at the corner which cuts the inner bus-bar 21d integral with the outer bus-bar 21d (separates VddD1 and VddD2, VddA1 and VddA2) and the bus-bar cut section 21h which cuts the bus-bar 21d in the vicinity of the boundary between the digital circuit section 22c and the analog circuit section 22e (separates VddD1 and VddA1, VddD2 and VddA2).

In FIG. 63, an example in which the outermost bus-bar 21b is separated by the bus-bar cut section 21g integral with the cut section 21f is shown, but when the digital I/O circuit section (IODC) 22b and the digital circuit section (DC) 22c share the GND side, they do not need to be separated. In such event, the outermost bus-bar 21d is used as in the form of a ring.

Figure 64:
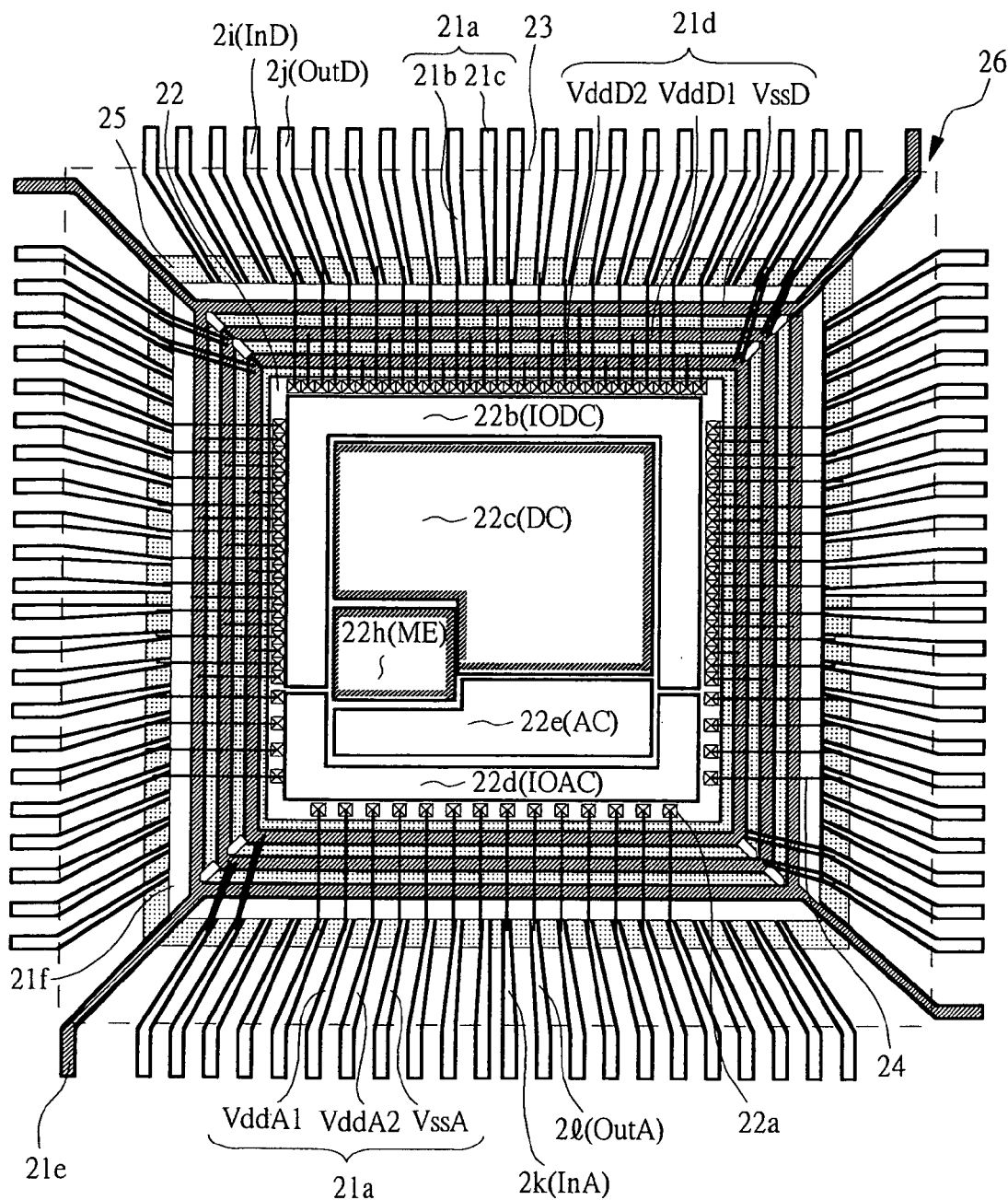
FIG. 64 is a layout drawing in which the power supply of the digital circuit is connected to the bus-bar and the digital circuit to an inner lead.

FIG. 64 is a layout drawing in which the ring-form bus-bar 21d of FIG. 56 is utilized for digital application without providing a notch. The power supply of the digital I/O circuit section (IODC) 22b and the digital circuit section (DC) 22c is directly connected to the bus-bar 21d, while the power supply of the analog I/O circuit section (IOAC) 22d and the analog circuit section (AC) 22e is directly connected to the inner lead 21b in the way it was. In such event, the analog circuit section 22e can be used as in the conventional circuit arrangement.

Meanwhile, when the present invention is applied, in principle, the conventional circuit configuration and arrangement in the chip do not have to be changed and the power supply pad only is connected to the bus-bar 21d. In addition, it goes without saying that this can be met by properly choosing the arrangement of the bus-bar 21d which matches the circuit arrangement configuration.

Embodiment 4

Figure 65:
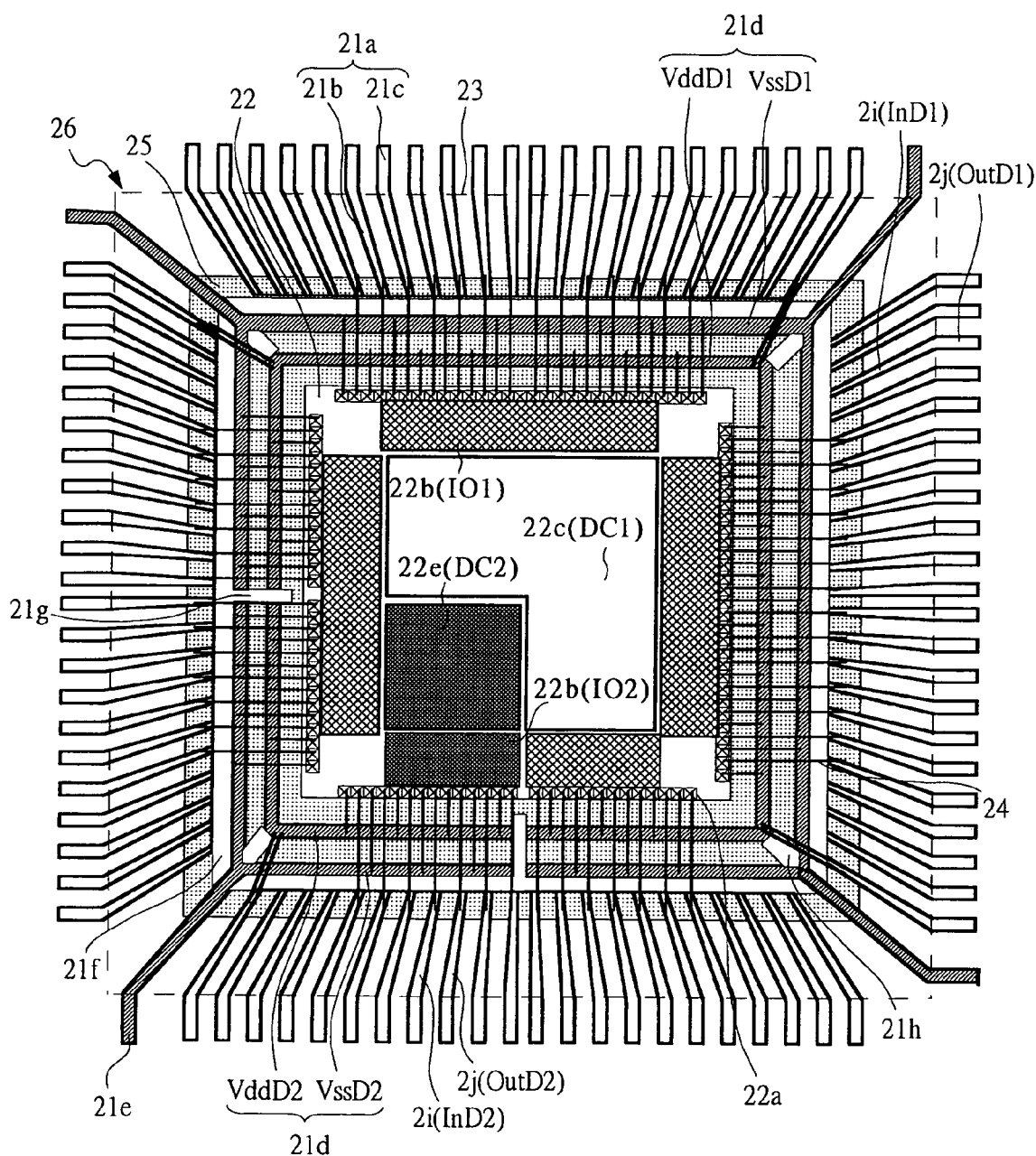
FIG. 65 is a layout drawing in which the digital circuit is separated into two power supply circuit sections.
Figure 66:
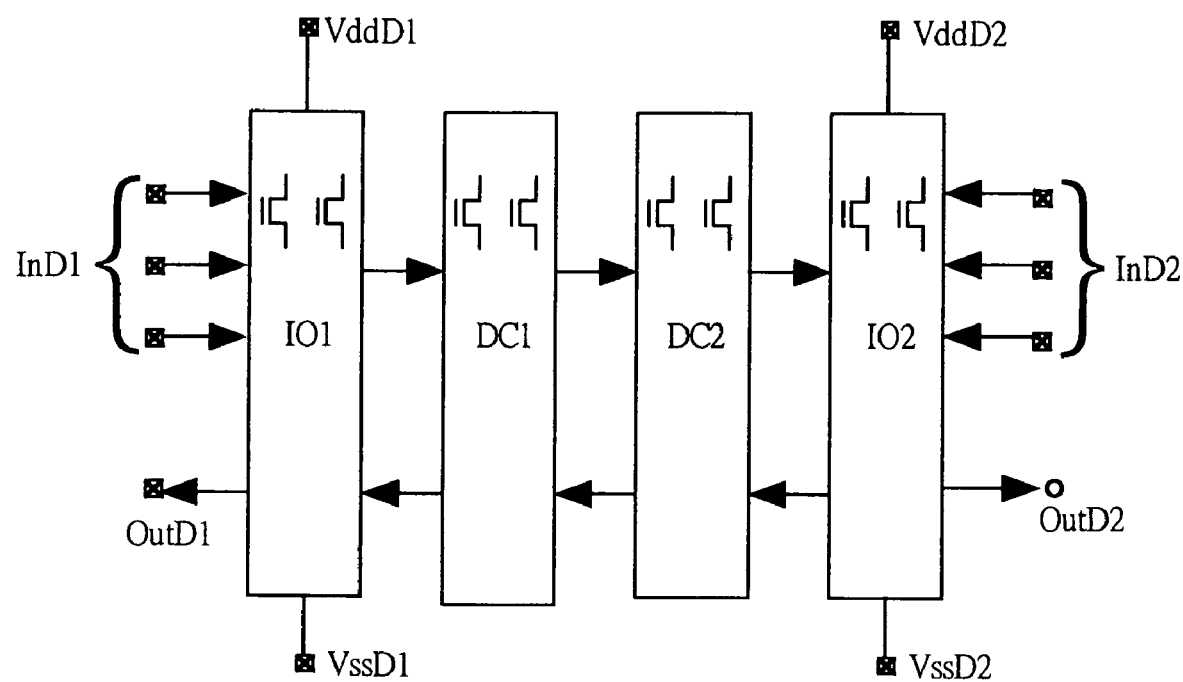
FIG. 66 is a circuit diagram of FIG. 65.

FIG. 65 is a layout drawing in which the digital circuit is separated into two power supply circuit sections and FIG. 66 is a circuit diagram of the digital circuit of FIG. 65.

The power supply separation as is the case of the present embodiment 4 is effective for protecting DC1 from noise, for example, when DC1 and DC2 are operated on different internal voltages (internal voltage of D1<internal voltage of D2). For example, the case of VddD1=InD1=OutD1=3.3V, VddD2=InD2=OutD2=3.3 V, and D1 internal voltage=1.5V, D2 internal voltage=3.3V falls under this. In addition, this is effective for protecting DC1 from noise in the event that the I/O signals (InD2, OutD2) of the digital I/O circuit section (IO2) is very large voltage (VddD1<VddD2) as compared to the IO1 I/O signals (InD1, OutD1), too. For example, the case of VddD1=InD1=OutD1=3.3V (or 5V) and VddD2=InD2=OutD2=7V (or 10V) and others fall under this.

Because in the case of FIG. 65 and FIG. 66, the number of power supplies is small as compared to FIG. 56, FIG. 62 and FIG. 63 and four pieces are only sufficient, the bus-bar 21d of a double type is used. In the event that the number of power supplies increases such as the cases or others in which the internal voltage of DC1 and DC2 is supplied from the outside, the number of bus-bars 21d may be increased or the bus-bar 21d of a triple type may be used.

In the event that the clock frequency used for DC1 and DC2 differs or in other cases, the power supply separation is effective from the viewpoint of measures against interference noise.

From FIG. 56 to FIG. 66, various bus-bar 21d forms and arrangement methods are shown, but they should not be limited to the forms and methods shown in the drawings but various modifications can be thought in accordance with the circuit layout methods.

For example, the ring-form bus-bar 21d is not always necessary to be arranged in the form of a quadrangle along the sides of the semiconductor chip 22 but may be arranged in the form of an octagon surrounding the semiconductor chip 22. In such event, since the wire 24 is difficult to be inserted at the chip corners, pad 22a can be arranged to the corner of the semiconductor chip 22.

The connections between the bus-bar 21d on the outside and the bus-bar 21d on the inside as well as the bus-bar cut section 21g or bus-bar cut section 21h which separates the connections should not be limited to the corners of the bus-bar 21d but in any places. Furthermore, the number of bus-bars 21d may be increased or decreased in accord with the number of power supplies. In the embodiments, examples of double bus-bar 21d or triple (3 to 6 pieces) bus-bar 21d are shown, the invention should not be limited to these. Because at lease one piece of bus-bar 21d achieves the effects, for example, the bus-bar 21d may be one.

Furthermore, the number and the shape of the plural leads 21a shown in the drawings shall not be limited to these but various types can be thought. Furthermore, the form and size of the semiconductor chip 22 should not be limited to the examples shown in the present embodiment but the invention can be achieved by the use of various chips.

Embodiment 5

Figure 67:
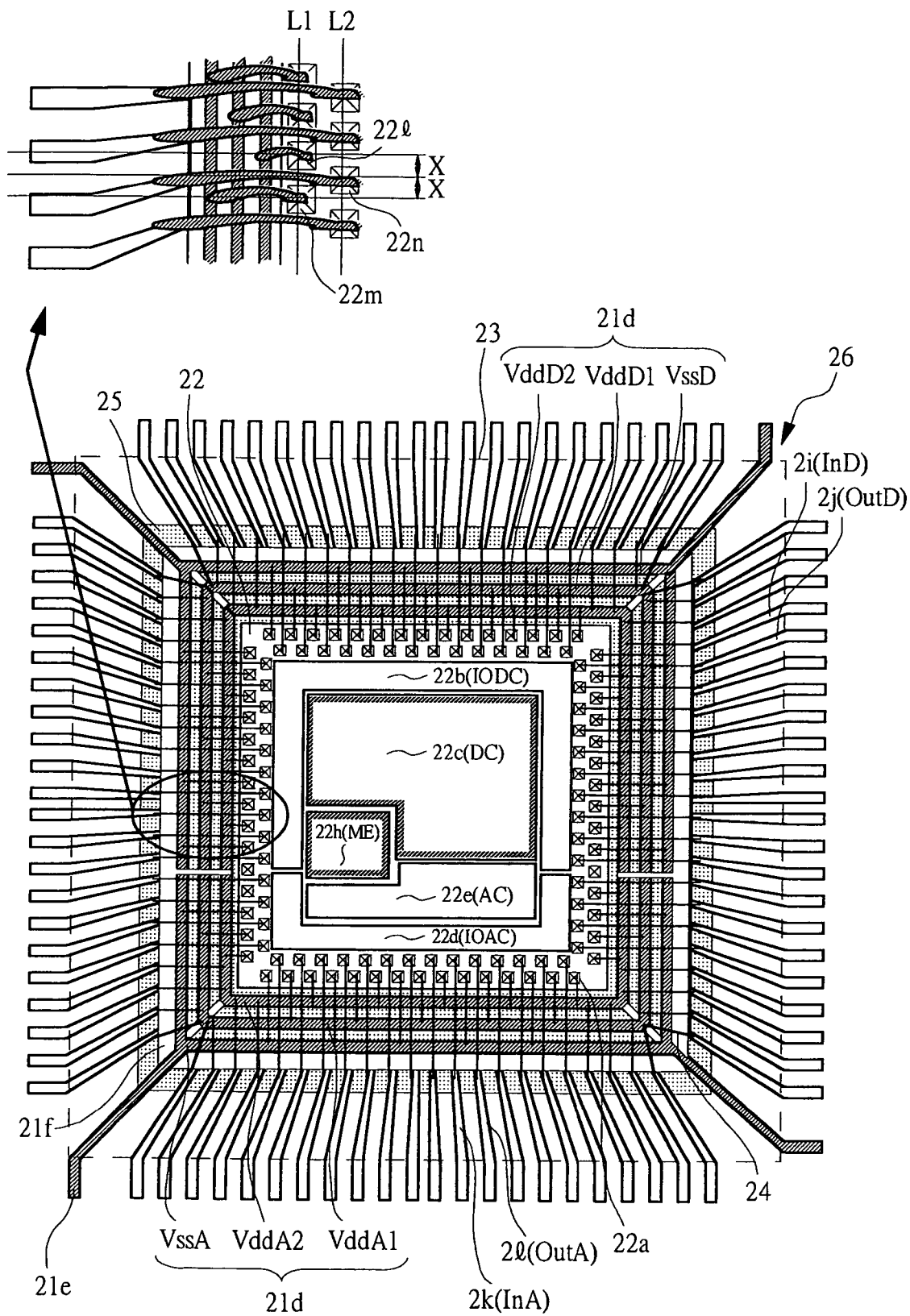
FIG. 67 is a drawing in which pads of FIG. 56 are arranged in a zigzag pattern and wire-bonded to inner leads and the bus-bar in a zigzag pattern.

FIG. 67 is a drawing in which pads 22a of the semiconductor device of FIG. 56 are arranged in a zigzag pattern and are wire-bonded in a zigzag pattern to the inner lead 21b and the bus-bar 21d. The partly wire-bonded portion is shown by an enlarged view.

In the present embodiment, pad 22a for power supply connected to the bus-bar 21d by wire 24 is arranged on the first row L1, while the pad 22a for signals connected to the inner lead 21b is arranged on the second row L2. As the enlarged view shows, the third pad 22n on the second row L2 is located at the middle of the first pad 22a and the second pad 22m which are the pads 22a for power supply on the first row L1 (X=X). Repeatedly arranging the first pad 22l and the second pad 22m on the first row L1 and the third pad 22n on the second row L2 by this kind of method achieves a zigzag pad arrangement as shown in FIG. 67. Even when the pads 22a are arranged in two rows and the number is increased, the pad 22a for power supply is connected to the bus-bar 21d, and therefore, the inner lead 21b can be used for signals.

Figure 68:
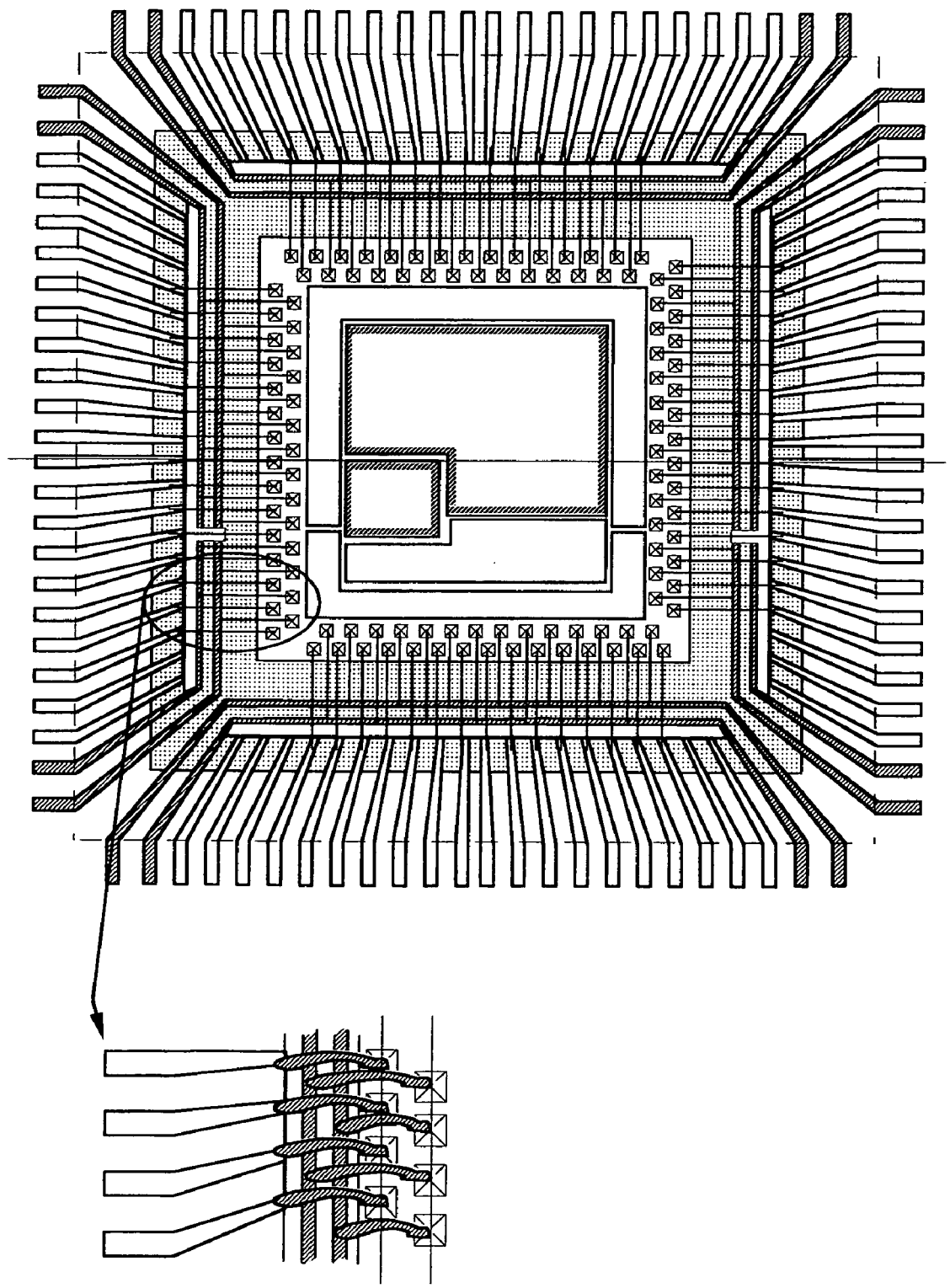
FIG. 68 is a modified example of FIG. 67.
Figure 69:
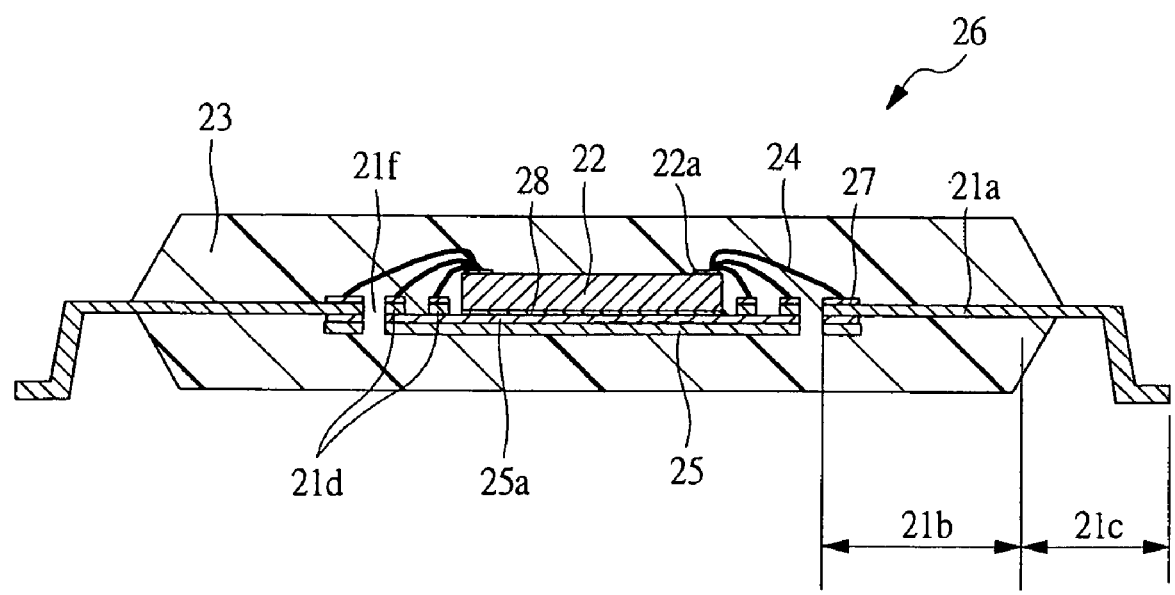
FIG. 69 is a cross-sectional view taken on line A-A of FIG. 68.

FIG. 68 is a modified example of FIG. 67 and FIG. 69 is a cross-sectional view taken on the line A-A of FIG. 13. In this case, a double type bus-bar 21d separated by four sides is used. Unlike FIG. 67, pad 22a for signal connected to the inner lead 21b by wire 24 is arranged on the first row L1 on the chip end side, while the pad 22a for power supply connected to the bus-bar 21d is arranged on the second row L2 on the inner side of the chip. In such event, both pad 22a for signals and the pad 22a for power supply can prevent the wire-bonding distance from extending.

In FIG. 67 through FIG. 69, examples of zigzag patterns of pads are shown, but the number of bus-bars 21d may be increased or decreased in accord with the number of power supplies, and the bus-bar 21d may not be all located on all the sides. The shape, too, can be thought various modifications without limiting to those illustrated. The pad 22a of the whole ship may not be arranged in a zigzag pattern and may be part of it. In FIG. 67, the signal pad 22a is located inside but may be on the chip end side, and in addition in FIG. 68, the signal pad 22a is located on the chip end side, it may be located inside.

Embodiment 6

Figure 70:
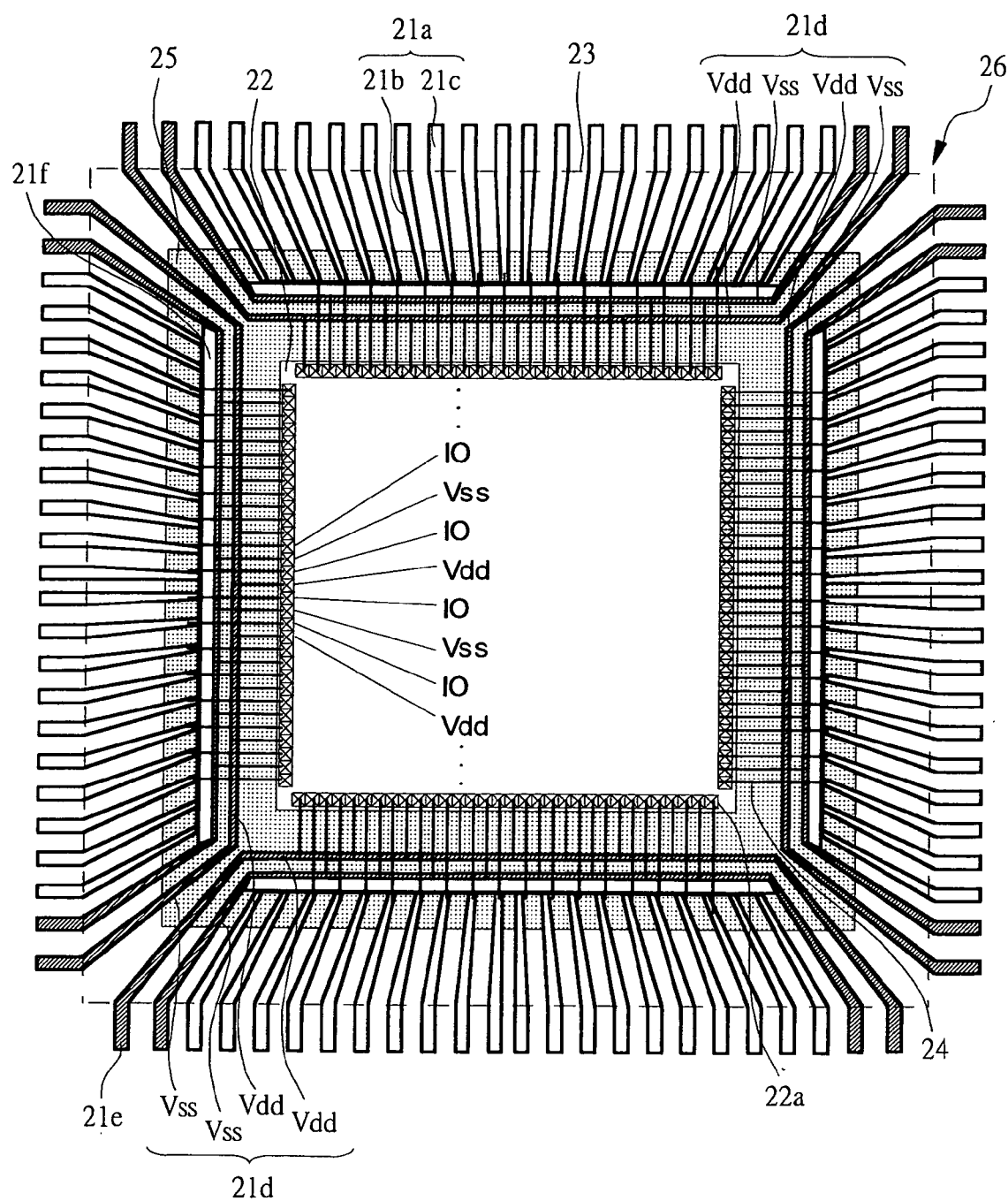
FIG. 70 is a plan view in which IO pads and power supply pads are alternately arranged.

FIG. 70 is a drawing in which signal pad 22a (IO) and power supply pad 22a (Vdd, Vss) are alternately arranged.

By providing the bus-bar 21d for power supply between the inner lead 21b and the semiconductor chip 22, the number of pads 22a for power supply can be greatly increased. By this, it becomes possible to arrange pads 22a for power supply alternately, which used to be arranged at intervals of several pieces, and to reinforce the power supply. Furthermore, cross talk noise between signals can be eliminated.

In addition, NC (non-connect) pins which become surplus as a result of adopting bus-bars for power supply may only be fixed to a proper power supply on the lead side, and this provides more distance between signals, and it goes without saying that it is effective for reducing interference noises or reducing power supply noise when I/O buffer is operating.

In FIG. 67 through FIG. 69, cases in which pads 22a are arranged in a zigzag pattern and the wire-bonding positions of the bus-bar 21d and the inner lead 21b are arranged in a zigzag pattern are shown, but as shown in FIG. 70, wire-bonding may be made in a zigzag pattern on the bus-bar 21d and inner lead 21b sides only.

Embodiment 7

Figure 71:
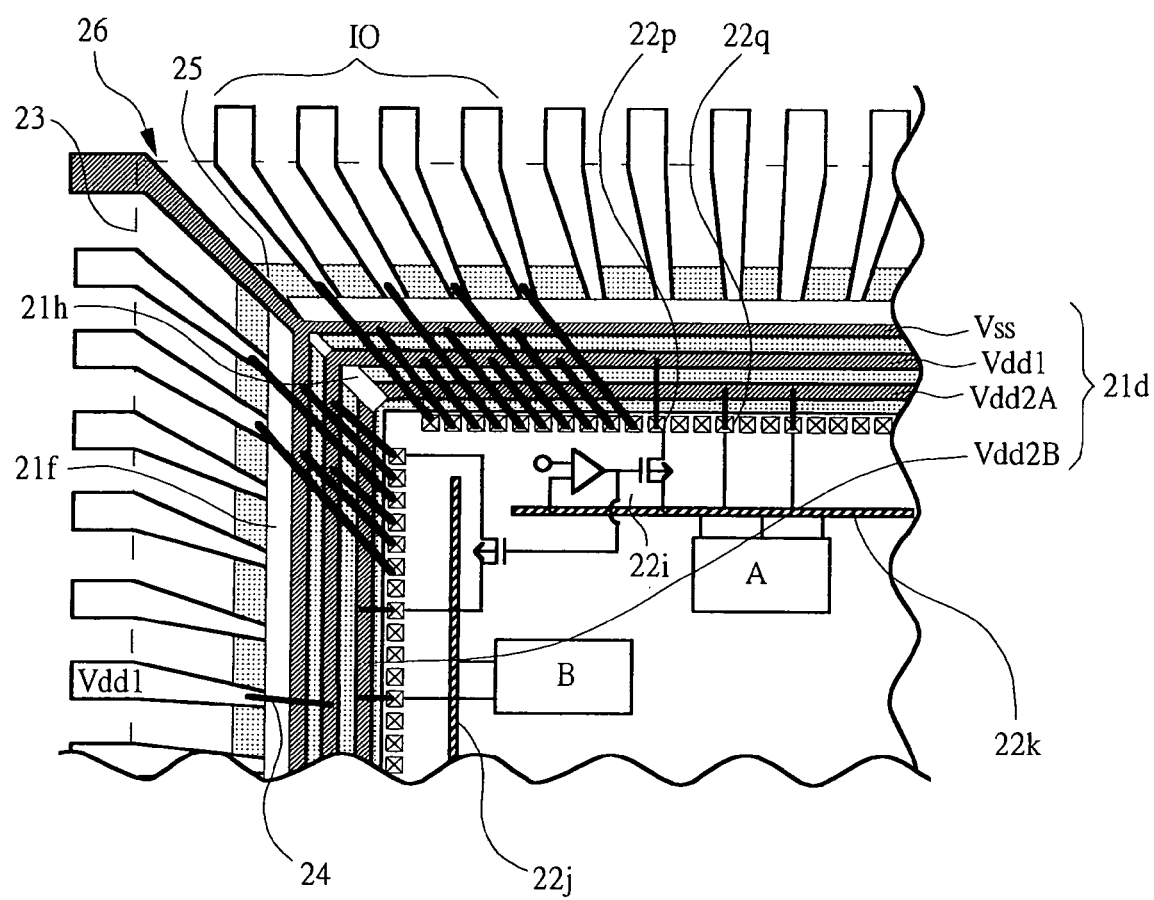
FIG. 71 is a fragmentary plan view indicating wire-bonding when an internal step-down circuit is used in a circuit in which internal step-down circuits is made selectable by wire-bonding.
Figure 72:
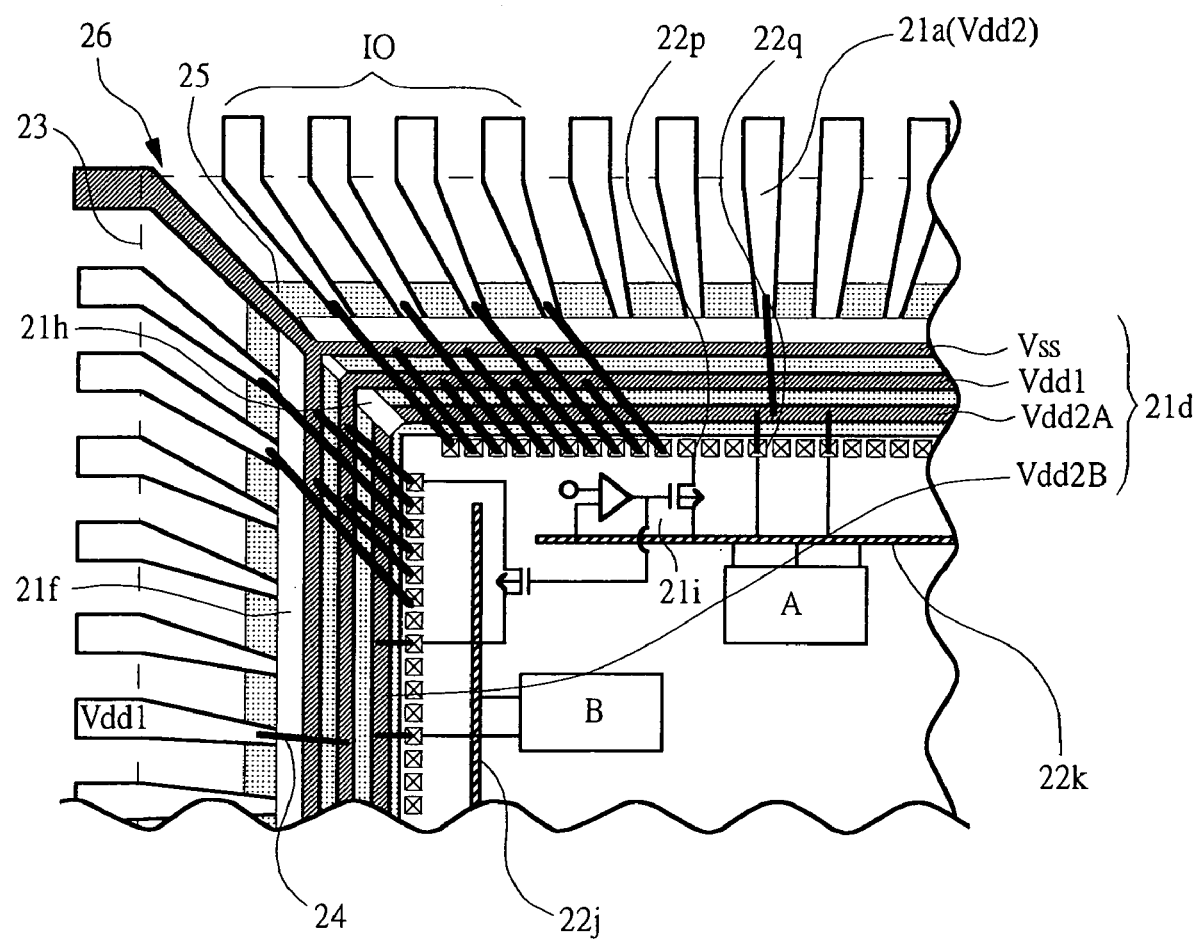
FIG. 72 is a fragmentary plan view indicating wire-bonding when an internal step-down circuit is not used in a circuit in which internal step-down circuits is made selectable by wire-bonding.

FIG. 71 and FIG. 72 are layout drawings of a circuit which enables the selection or non-selection of an internal step-down circuit by wire-bonding. The wire-bonding method differs between a case shown in FIG. 71 in which the inner step-down circuit 22i is used and a case shown in FIG. 72 in which the inner step-down circuit 22i is not used. The inner power supply wiring 22k (Vdd2AL) connected to a circuit section A and the inner power supply wiring 22j (Vdd2BL) connected to a circuit section B are separated.

In FIG. 71, the internal step-down circuit 22i is used to step down the external power supply Vdd1 to Vdd2A using the internal step-down circuit 22i to supply to the circuit section A. By the wire 24, the lead 21a to which the external power supply Vdd1 is supplied is connected to the bus-bar 21d for Vdd1 supply, and the bus-bar 21d for Vdd1 supply is connected to the pad A22p connected to the internal step-down circuit 22i. The pad B22q connected to the internal step-down circuit 22i via the internal power supply wiring 22k (Vdd2AL) is bonded to the bus-bar 21d for Vdd2A supply for supplying the internal power supply Vdd2A to the circuit section A.

In FIG. 72, the internal power supply is supplied from the bus-bar 21d for Vdd2A supply to the circuit section A without using the internal step-down circuit 22i. The bus-bar 21d for Vdd2A supply and pad B22q are connected in the same manner as FIG. 71. Unlike FIG. 71, the lead 21a to which internal power supply Vdd2A is supplied is connected to the bus-bar 21d for Vdd2A supply. In this case, the pad A22p is not wire-bonded but may be connected to the bus-bar 21d for Vdd2A power supply or others.

Figure 73:
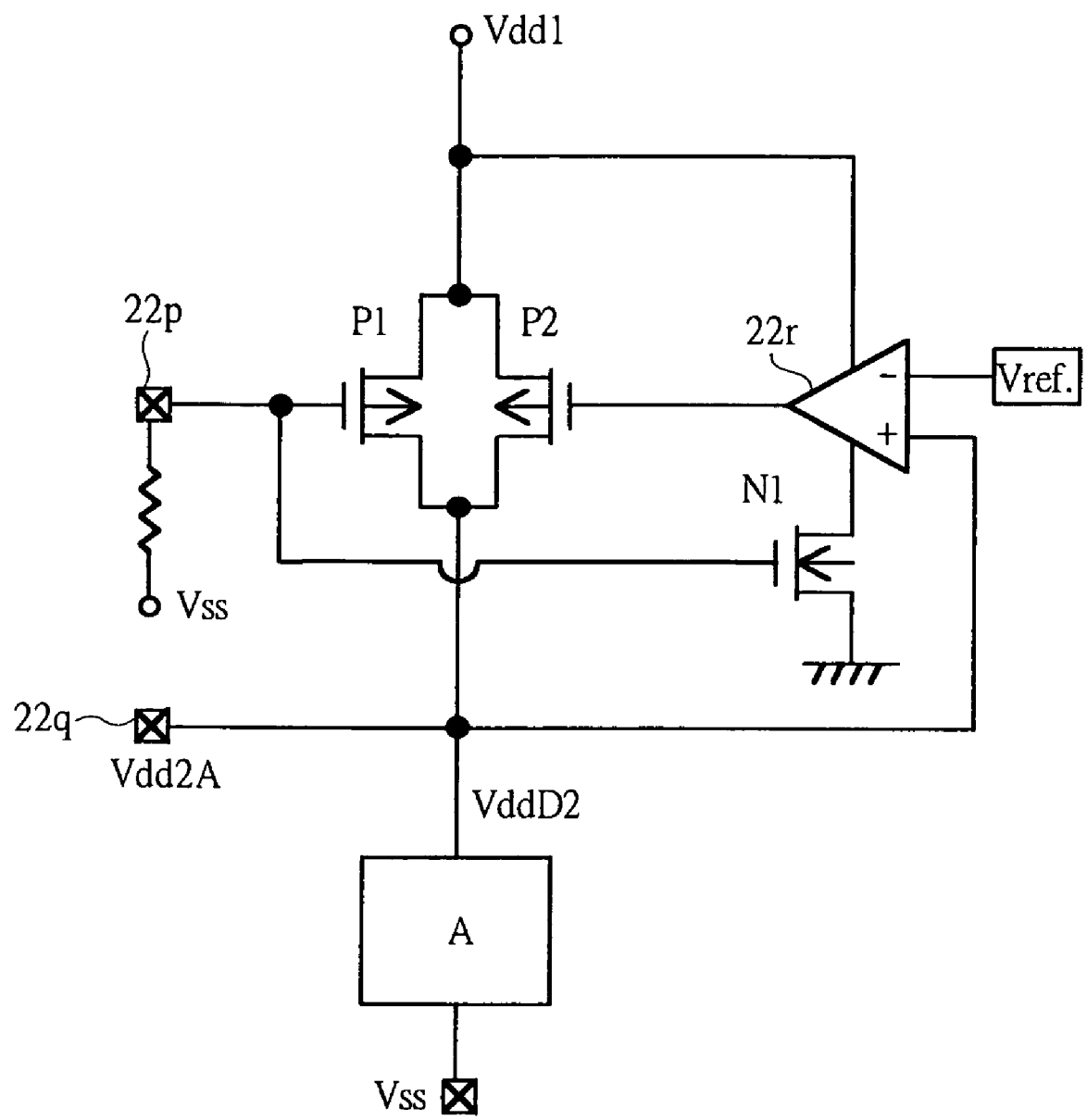
FIG. 73 is a circuit diagram in which the internal step-down circuit is made selectable.

FIG. 73 is a circuit diagram of selectable internal step-down circuit 22i of FIG. 71 and FIG. 72. The internal step-down circuit 22i in FIG. 71 and FIG. 72 is shown by a sketch, but in FIG. 73, a specific example is shown. P1, P2 denote P-type MOS transistors and N1 denotes an N-type MOS transistor.

When the internal step-down circuit 22i is used (in the case of FIG. 71), the pad A22p is bonded to the high potential side H (Vdd1). By this, P1 is turned OFF and N1 is turned ON, and a comparison circuit 22r operates between Vdd1 and Vss. Because the comparison circuit 22r controls the P2 gate, P2 steps down Vdd1 to VddD2 and supplies to the digital circuit section 22c which is an internal circuit (see FIG. 56).

On the other hand, when the internal step-down circuit 22i is not used (in the case of FIG. 72), the pad A22p is either not wire-bonded or wire-bonded to the low potential side L (Vss). By this, N1 is turned OFF and the comparison circuit 22r does not operate. In such event, for the circuit A, by a pad B22q bonded to the bus-bar 21d to which Vdd2 is supplied, Vdd2 is supplied to the internal circuit.

In FIG. 71 through FIG. 73, an example of the internal step-down circuit 22i connected to the circuit A is discussed, but the invention can be applied to other internal circuits in the similar manner.

Embodiment 8

Figure 74:
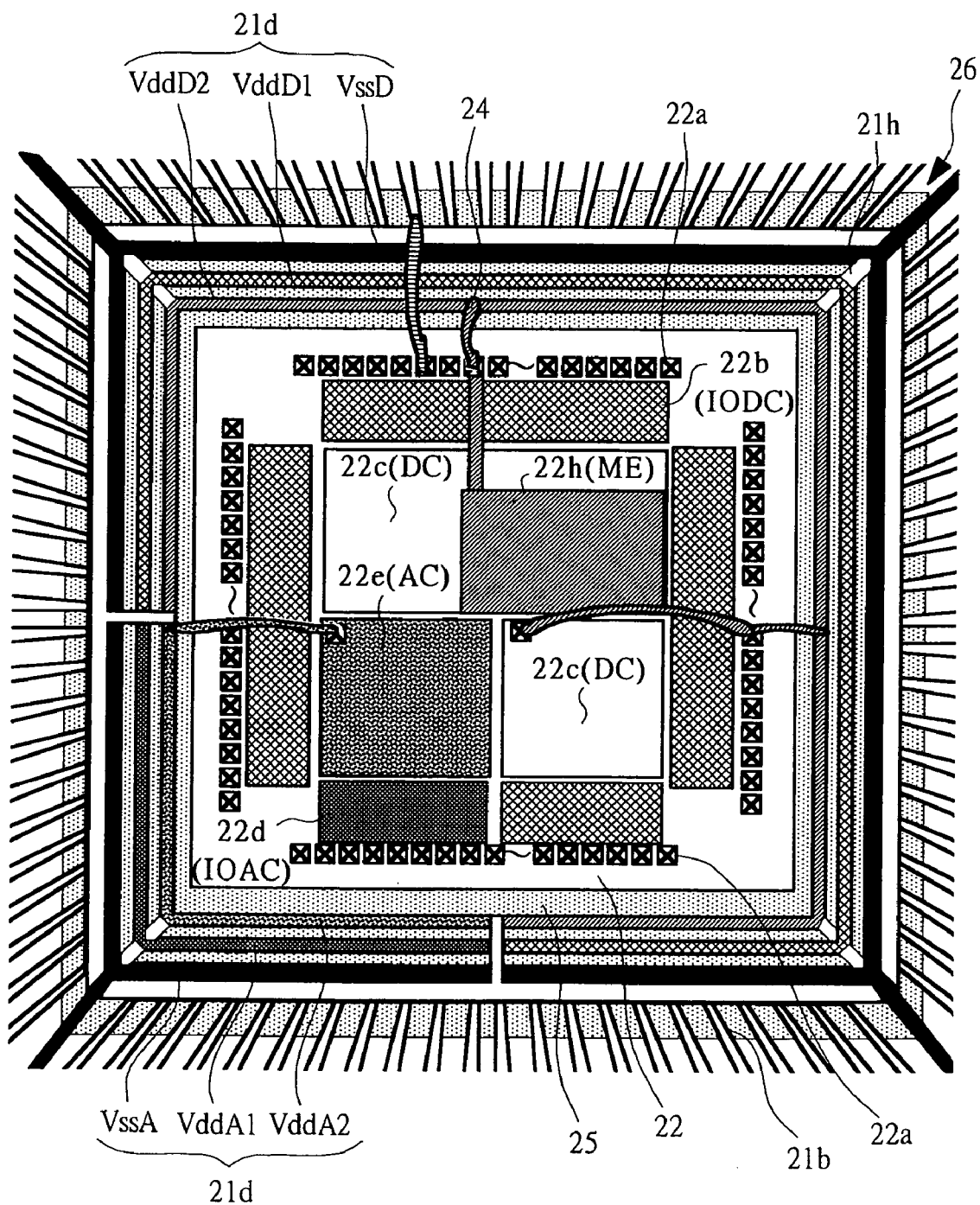
FIG. 74 is a layout drawing when the pad around the chip and internal circuit are connected by outgoing wiring, when pads are installed near the chip center, and when the pad near the chip center, the pad at the chip end, and the bus-bar are wire-bonded in two stages.

FIG. 74 is a layout drawing indicating the case in which the pad 22a around the chip and the internal circuit are connected by outgoing wiring, the case in which the pad 22a is installed near the center of the semiconductor chip 22, and the case in which the pad 22a near the chip center, the pad 22a at the chip end section, and the bus-bar 21d are wire-bonded in two stages. In FIG. 74, the outgoing wiring from memory (ME) 22 is connected to the bus-bar 21d for VddD2 supply.

The pad 22a installed inside the analog circuit section (AC) 22e is directly wire-bonded to the bus-bar 21d for VddA2 supply.

The pad 22a installed inside the digital circuit section (DC) 22c is wire-bonded to the bus-bar 21d for VddD2 supply via the pad 22a for VddD2 supply. The connection method as described above can lower the impedance because the diameter of wire 24 and the bus-bar 21d is larger in area than the wiring width inside the chip, and achieves an effect to alleviate the power supply drop of the internal circuit. In addition to the power supply ring which generally goes around the circuit section, this is particularly effective when a problem of power supply drop occurs in the internal circuit.

By the way, it has been discussed that the bus-bar 21d is remarkably useful as power supply, but since some manufacturer may hope to fix the pad 22a of the semiconductor chip 22 to a specified level value, it goes without saying that the bus-bar 21d can be used as a level fixing terminal.

Embodiment 9

The plan view that explains the relevant lead patterns in the semiconductor device (QFP) in embodiments 9 through 20 indicates the connection condition of the wire 24 of the pad 22a only, which is part of the semiconductor chip 22, and for convenience of explanation, the connecting condition of the wire 24 of other pads 22a is omitted, but in actuality, the wire 24 is connected to other pads 22a, too (however, the wire 24 may not be connected to all the pads 22a and non-contact pads 22a may sometimes exist).

Figure 75:
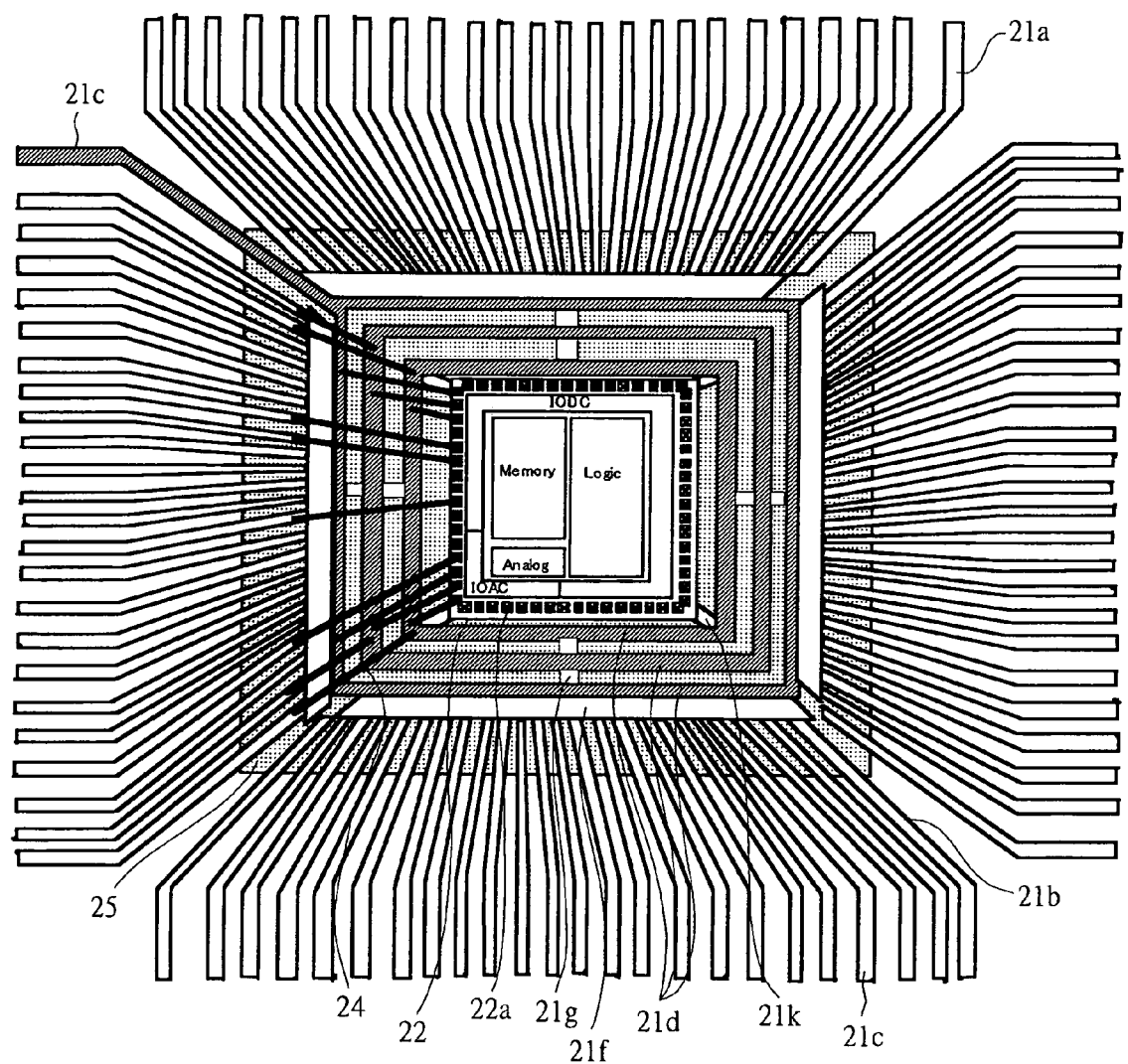
FIG. 75 is a plan view indicating a lead pattern and part of wiring condition in a semiconductor device of embodiment 9 according to the present invention.

The lead pattern of the semiconductor device shown in FIG. 75 indicates that of the ring-form bus-bars 21d arranged triply around the semiconductor chip 22, the outermost bus-bar 21d only is coupled to one outer lead 21c, and this outer lead 21c is arranged at the corner of the semiconductor device.

That is, it is the case in which a semiconductor chip 22 with power supply pads 22a arranged comparatively collectively to the corner is mounted, and in such event, the power supply pad 22a at the corner is connected to the bus-bar 21d by the wire 24 and furthermore to the inner lead 21b arranged near the corner by the wire 24.

By this, the angle of approach of the wire 24 to the pad 22a of the semiconductor chip 22 can be relaxed and pad intervals in the vicinity of chip corner can be narrowed. As a result, the number of allocatable pads can be increased.

In addition, by connecting the power supply pad 22a to the bus-bar 21d, common lead, the number of power supply pads 22a can be reduced. By this, empty pins of outer lead 21c are generated, and therefore, by fixing this pin for power supply and arranging them on both sides of the signal pins, crosstalk noise caused by the LC component can be reduced and the power supply noise caused by IO buffer operation can be reduced.

In addition, in the power supply pad 22a, by connecting the pad 22a and the inner lead 21b not directly by the wire 24 but via the bus-bar 21d, the wire 24 can be shortened and the wire flow at the time of resin encapsulating can be reduced.

Figure 76:
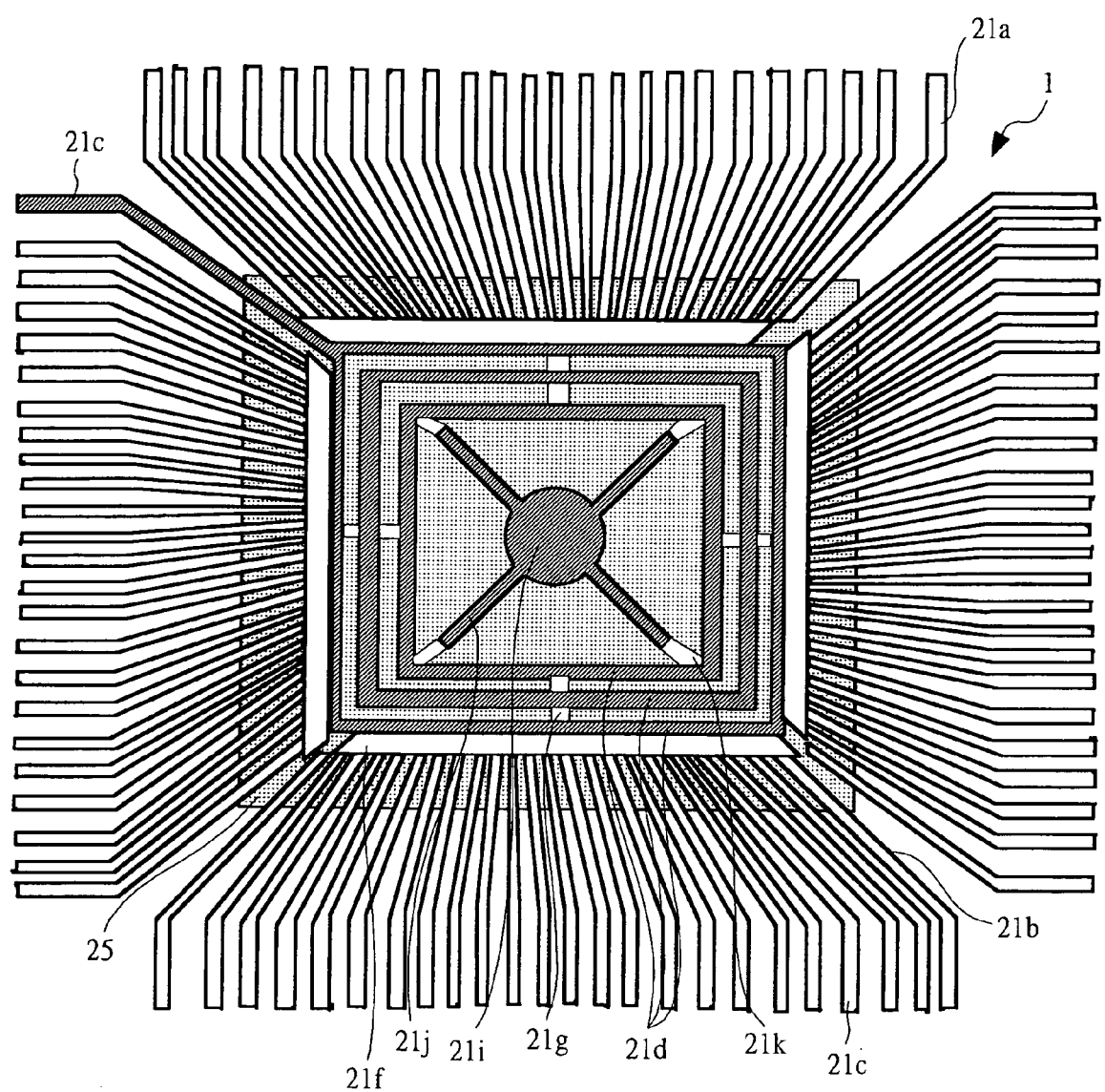
FIG. 76 is a plan view indicating one example of a construction of a lead frame used for the semiconductor device shown in FIG. 75.

FIG. 76 shows the construction of lead frame 1 used for the semiconductor device shown in FIG. 75. In the chip mounted region of the tape member 5, that is, in the inside region of the innermost ring-form bus-bar 21d, a tab 21i which is a chip mounted section is affixed. The tab 21i is coupled to four hanging leads 21j, but is separated and insulated from the hanging lead 21j and the innermost ring-form bus-bar 21d by the hanging lead cut section 21k.

Because the tab 21i and hanging lead 21j which comprise a metal sheet such as copper and others are affixed to the chip mounted region of the tape member 5 in this way, the strength of the chip mounted region of the tape member 5 can be increased, and the flatness of the tape member 5 is improved and the die-bonding capability can be improved.

Meanwhile, because the frame construction shown in FIG. 76 is a small tab construction whose tab 21i size is smaller than the main surface of the semiconductor chip 22 and the adoption of the small tab construction helps the resin 23 (see FIG. 56) go around the chip rear surface at the time of resin molding, the adhesion between the resin 23 and the chip rear surface can be increased and the reflow crack resistance of the semiconductor device (QFP) can be improved.

Embodiment 10

Figure 77:
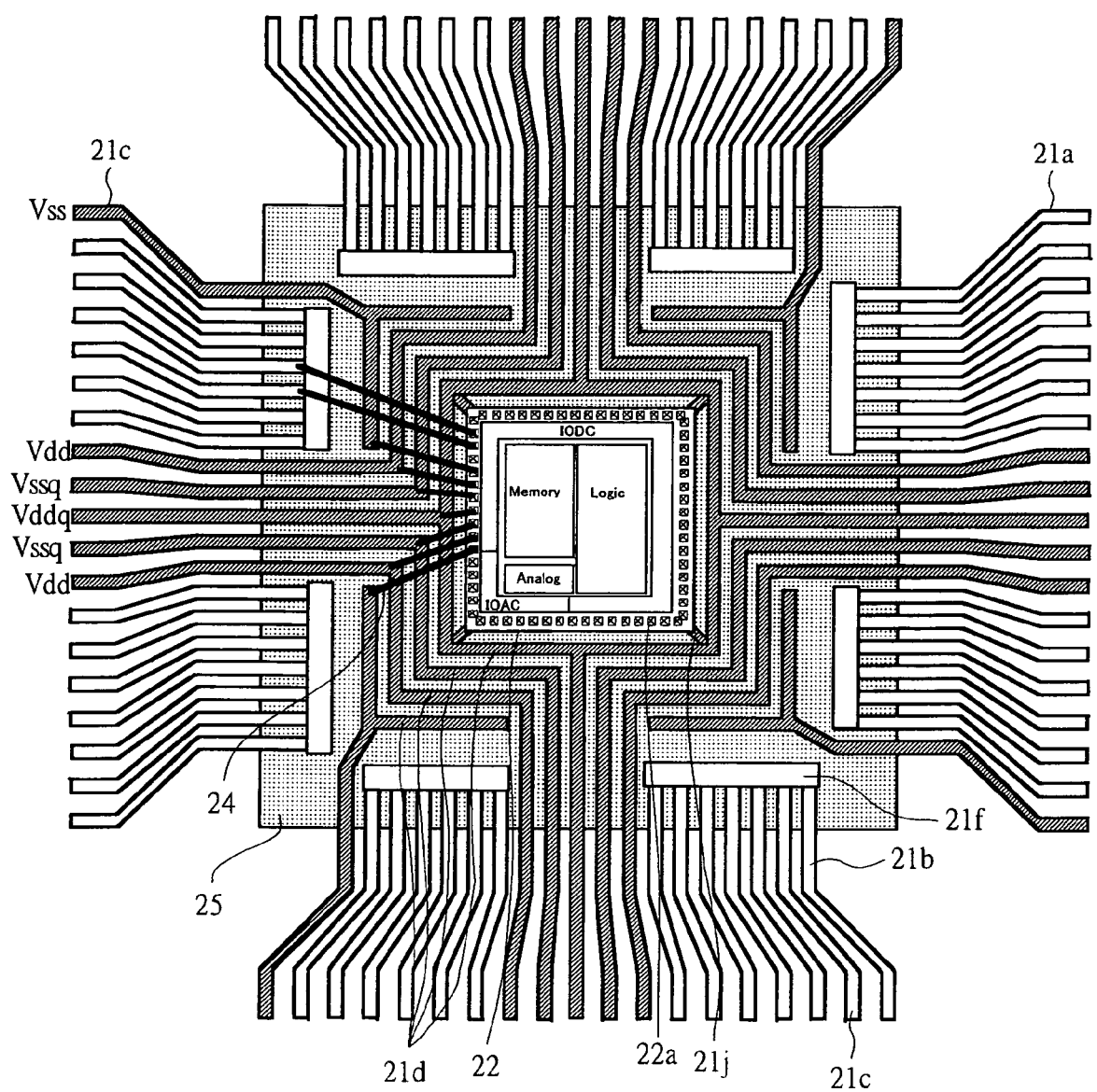
FIG. 77 is a plan view indicating a lead pattern and part of wiring condition in a semiconductor device of embodiment 10 according to the present invention.

The lead pattern of the semiconductor device shown in FIG. 77 has the bus-bars 21d arranged quadruply around the semiconductor chip 22, and five bus-bars 21d are pulled out nearly from the center of the lead arrangement direction in four sides of the resin 23, which is the resin encapsulating material shown in FIG. 56, respectively, and are coupled to the outer leads 21c, respectively, and at the same time, furthermore, one each bus-bar 21d is pulled out, respectively, at four corners and is coupled to the outer leads 21c, respectively. That is, it is a construction in which power supply pins are collected primarily near the center in each side of the resin 23 of the semiconductor device and are arranged.

Consequently, the present embodiment is best suited when the semiconductor chip 22 with power supply pads 22a concentrated near the center in the pad row is mounted.

According to this kind of construction, the width as a group (5 pieces) of bus-bars 21d can be increased, the electric characteristics can be improved by achieving reduction of lead resistance or reduction of L component.

Meanwhile, when the number of outer leads 21c is greater than the number of pads of the semiconductor chip 22, to reduce resistance, by connecting power supply outer leads 21c to plural bus-bars 21d via a plurality of wires 24 and further connecting from each bus-bar 21d to power supply pads 22a via the wire 24, wire connections to power supply pads 22a can be carried out at free positions.

As a result, because the power supply pads 22a can be arranged at suitable positions and the power supply pads 22a and the bus-bar 21d can be connected at the nearest position, the wiring resistance can be reduced.

Figure 78:
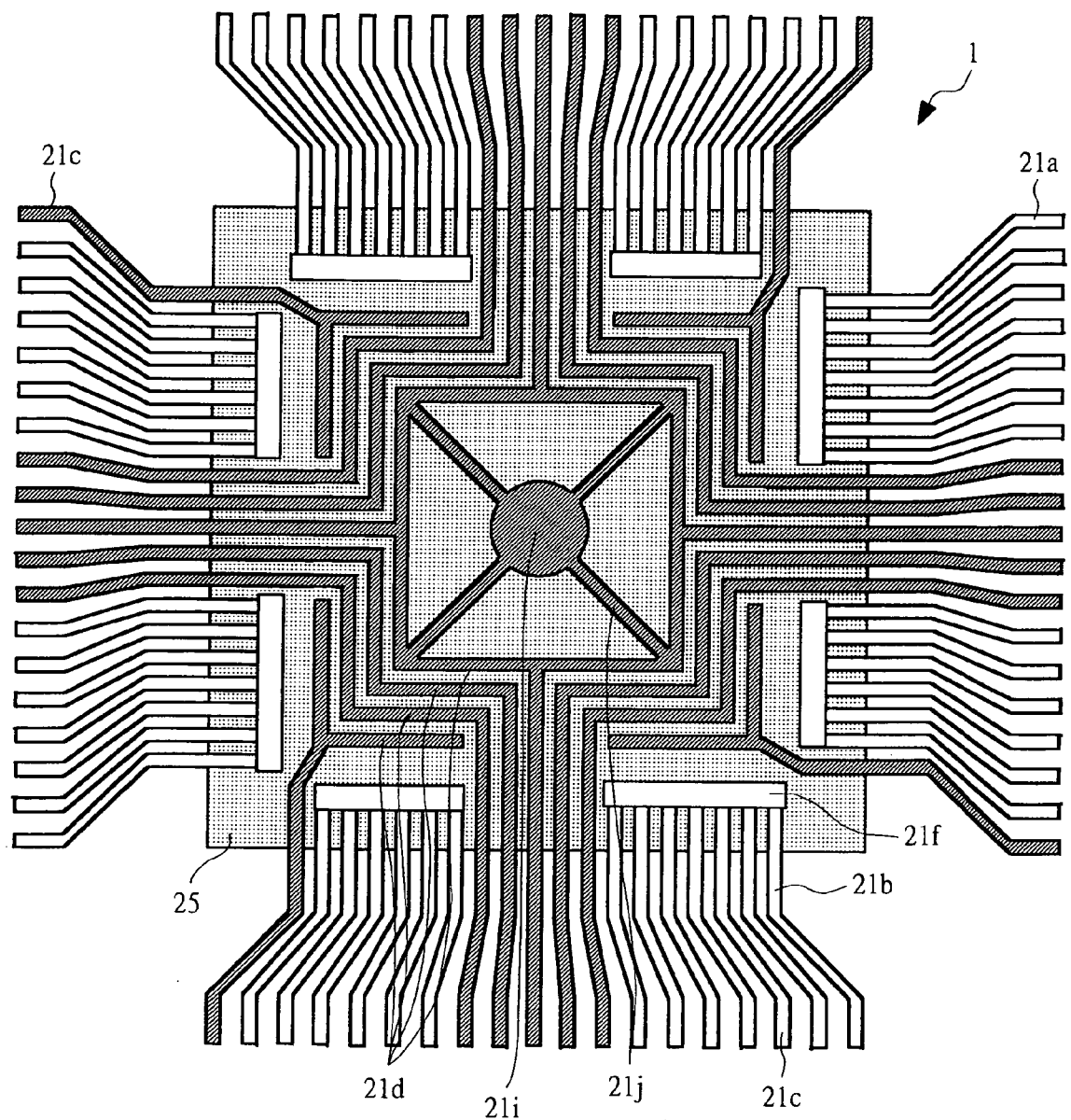
FIG. 78 is a plan view indicating one example of a construction of a lead frame used for the semiconductor device shown in FIG. 77.

The frame construction shown in FIG. 78 is also a construction in which tab 21i and hanging lead 21j comprising a metal sheet are affixed to the chip mounted region of the tape member 5, and but his, the strength of the chip mounted region of the tape member 5 can be increased and the flatness and die-bonding capability can be improved.

Furthermore, in the construction shown in FIG. 78, four hanging leads 21j that support the tab 21i are coupled to the innermost bus-bar 21d, and consequently, the strength of the tape member 5 can be further increased. By the way, since the tab 21i is coupled to the innermost bus-bar 21d via the lead 21j, when the chip rear surface is isolated from the tab 21i, the insulative die-bond material is used, and when the chip rear surface is electrically connected to the tab 21i, the conductive die-bond material is used.

In addition, because the frame construction shown in FIG. 78 is of a small-tab construction, too, the adhesion between resin 23 and the chip rear surface can be improved, and the reflow crack resistance of the semiconductor device (QFP) can be improved.

Embodiment 11

Figure 79:
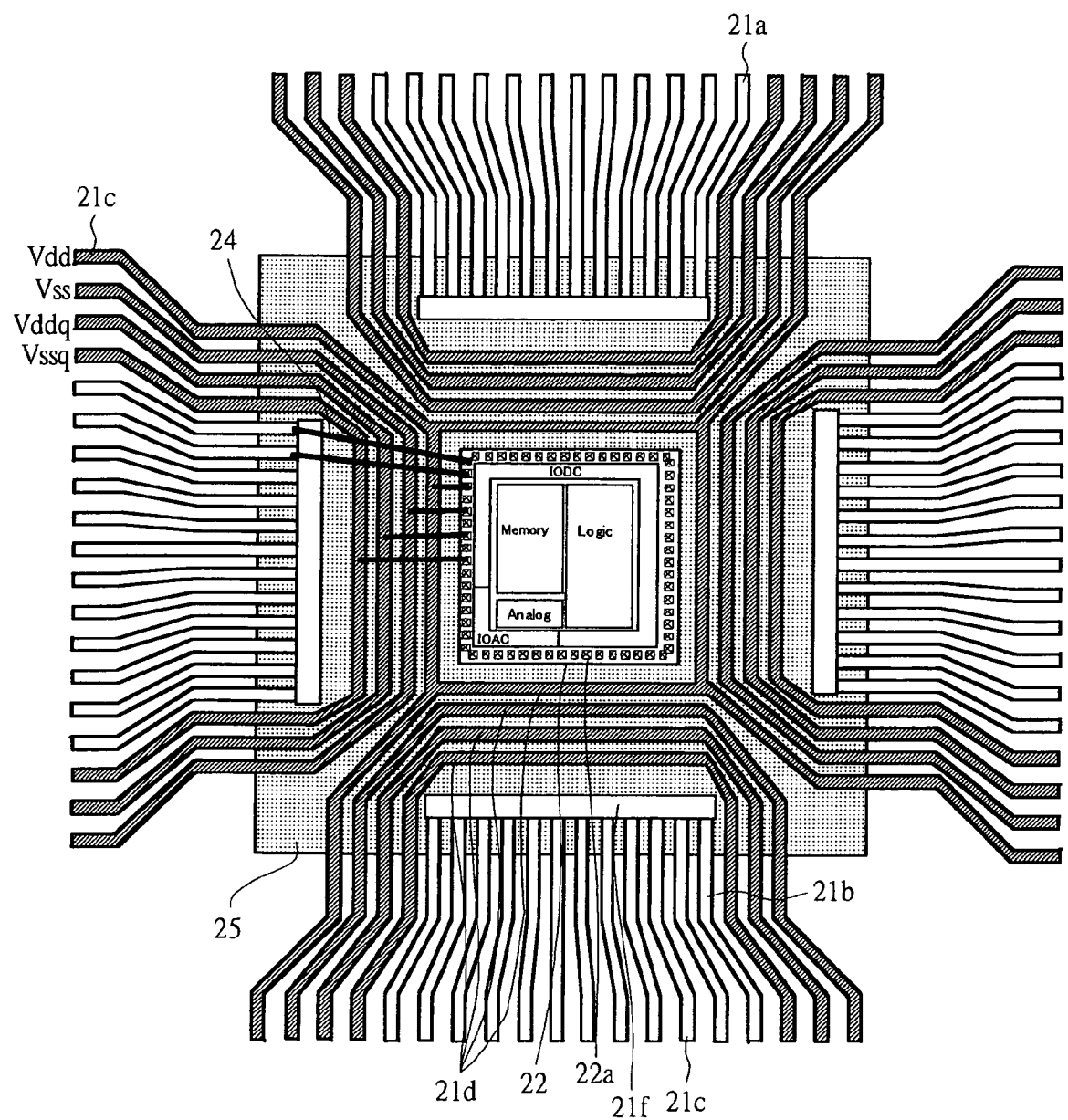
FIG. 79 is a plan view indicating a lead pattern and part of wiring condition in a semiconductor device of embodiment 11 according to the present invention.

The lead pattern of the semiconductor device shown in FIG. 79 is the case in which four power supply pins (Vdd, Vss, Vddq, Vssq) are arranged at four corners of the semiconductor device in the lead pattern shown in FIG. 77.

In such event, same as the embodiment 9, the approach angle of the wire 24 to the pad 22a of the semiconductor chip 22 can be relaxed, and the pad intervals in the vicinity of the chip corner can be narrowed. As a result, the number of allocatable pads can be increased.

Furthermore, by connecting the power supply pads 22a to the bus-bar 21d, common lead, the number of power supply pads 22a can be reduced.

In addition, because the power supply pins are arranged at four corners, it becomes possible to supply electricity from four corners and the power supply operation margin of the circuit can be secured by achieving balance of potential drop rates.

Embodiment 12

Figure 80:
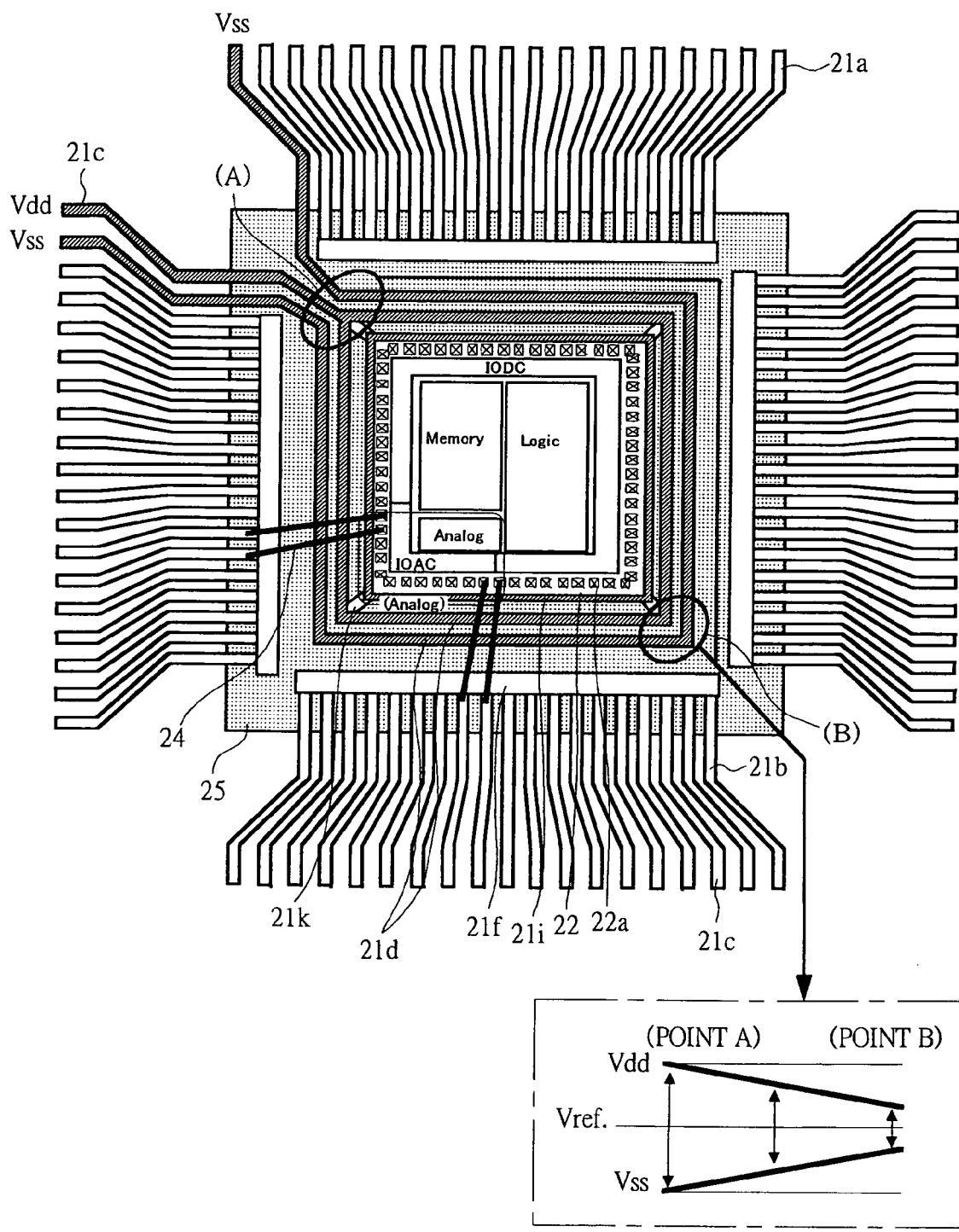
FIG. 80 is a plan view indicating a lead pattern and part of wiring condition in a semiconductor device of embodiment 12 according to the present invention and a power step-down diagram.

The lead pattern of the semiconductor device shown in FIG. 80 is the case in which power is supplied from one corner of the semiconductor device.

That is, it is a construction to supply power (Vdd, Vss) from two or more outer leads 21c arranged on the same side, for example, from two or more adjacent outer leads 21c arranged at the corners of the lead row via bus-bar 21d.

Figure 82:
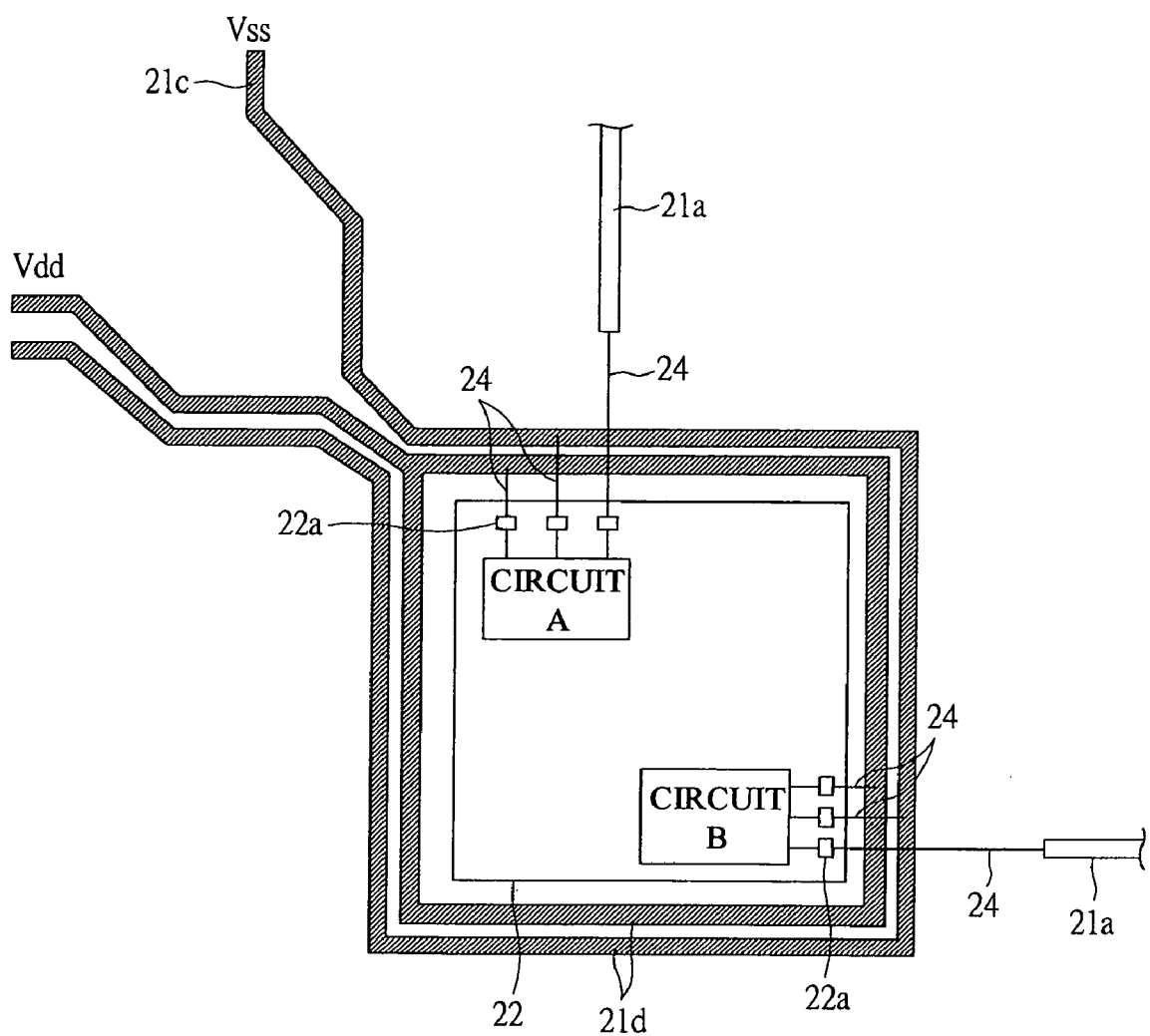
FIG. 82 is an enlarged fragmentary plan view indicating one example of connecting condition of a circuit inside the chip and the bus-bar in the semiconductor device shown in FIG. 80.

In this construction, when changes in the power supply potential of Vdd and Vss are compared as shown in the power supply drop diagram of FIG. 80 between the circuit A (point A in FIG. 80) arranged near the power supply side as shown in FIG. 82 and the circuit B (point B in FIG. 80) arranged at the opposite side far from the supply side, Vdd lowers and Vss rises and the width of both becomes narrower as the supply side becomes more distant from point A to point B, but the reference level (Vref.) can be maintained constantly at the center, and when Vref. is entered from the outside, the symmetric property of the power supply can be improved from the viewpoint of reference.

Consequently, the present embodiment is suited when the circuit A and the circuit B are the circuits used with the reference level entered from the outside, for example, analog circuits or differential amplifier circuits (comparison circuit 22r shown in FIG. 73).

Meanwhile, the position of the outer lead 21c which supplies the power supply shall not be limited to one corner of the lead row of the semiconductor device but may be that which supplies the power supply from two or more adjacent outer leads 21c via the bus-bar 21d at two corners or four corners.

In addition, where the analog section power supply must be separated from the digital-based circuits, the wire 24 may be directly connected to the inner lead 21b.

Figure 81:
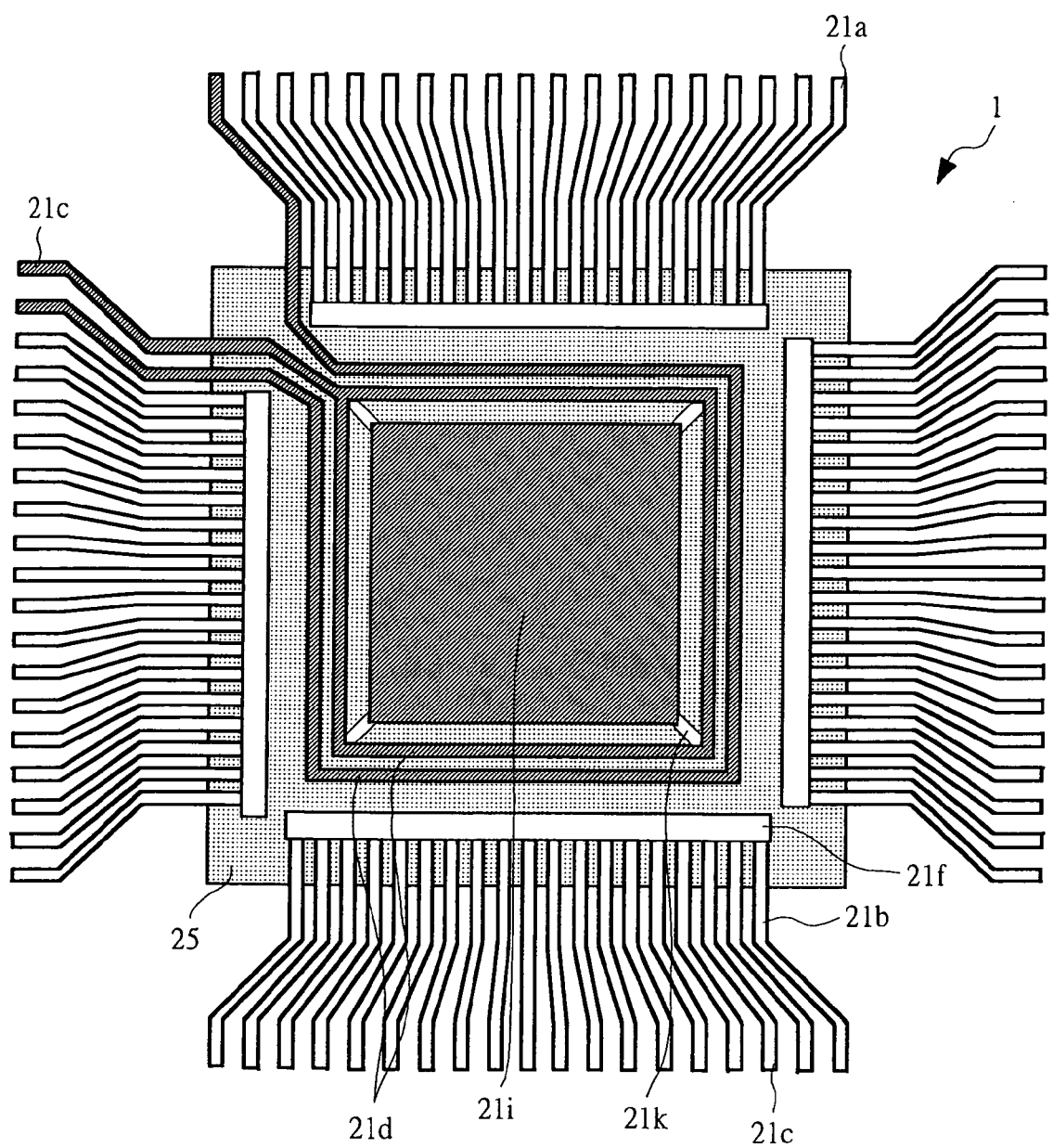
FIG. 81 is a plan view indicating one example of a construction of a lead frame used for the semiconductor device shown in FIG. 80.

Further, FIG. 81 indicates a construction of the lead frame 1 used for the semiconductor device shown in FIG. 80, and to the chip mounted region of the tape member 5, that is, the inside region of the inside ring-form bus-bar 21d, the tab 21i which is the chip mounted section, is affixed. The tab 21i is of a large tab construction nearly equal to or larger than the semiconductor chip 22, and is separated and insulated from the inside ring-form bus-bar 21d by the hanging lead cut section 21k.

Because the tab 21i comprising metal sheet such as copper and others is affixed to the chip mounted region of the tape member 5, the strength of the chip mounted region of the tape member 5 can be increased and at the same time, because the area of the large tab is far larger than that of the case of the small tab construction of FIG. 76, the strength of the tape member 5 can be still more increased, and the flatness and the die-bonding capability can be further improved, too.

In addition, because in the case of the large tab, the area is large as shown in FIG. 81, heat generated from the semiconductor chip 22 can be sufficiently diffused, and the heat radiation capability of the semiconductor device can be improved.

When a chip with a circuit with particularly big power consumption and with large heat generation from the chip, such as CPU and others of logic circuits, is mounted, to reduce thermal resistance from the semiconductor chip 22 to the tab 21i, it is preferable to use a conductive adhesive such as Ag paste or an adhesive containing conductive particles to affix the semiconductor chip 22 to the tab 21i. In addition, even when the conductive adhesive or the adhesive containing conductive particles is used as an adhesive for affixing such semiconductor chip 22 onto the tab 21i, as shown in FIG. 81, the potential (substrate potential) of the active layer exposed to the rear surface of the semiconductor chip 22 can be separated from the bus-bar 21d by electrically separating the tab 21i from the bus-bar 21d by the hanging lead cut section 21k and the degree of freedom in designing the semiconductor chip 22 can be improved.

Embodiment 13

Figure 83:
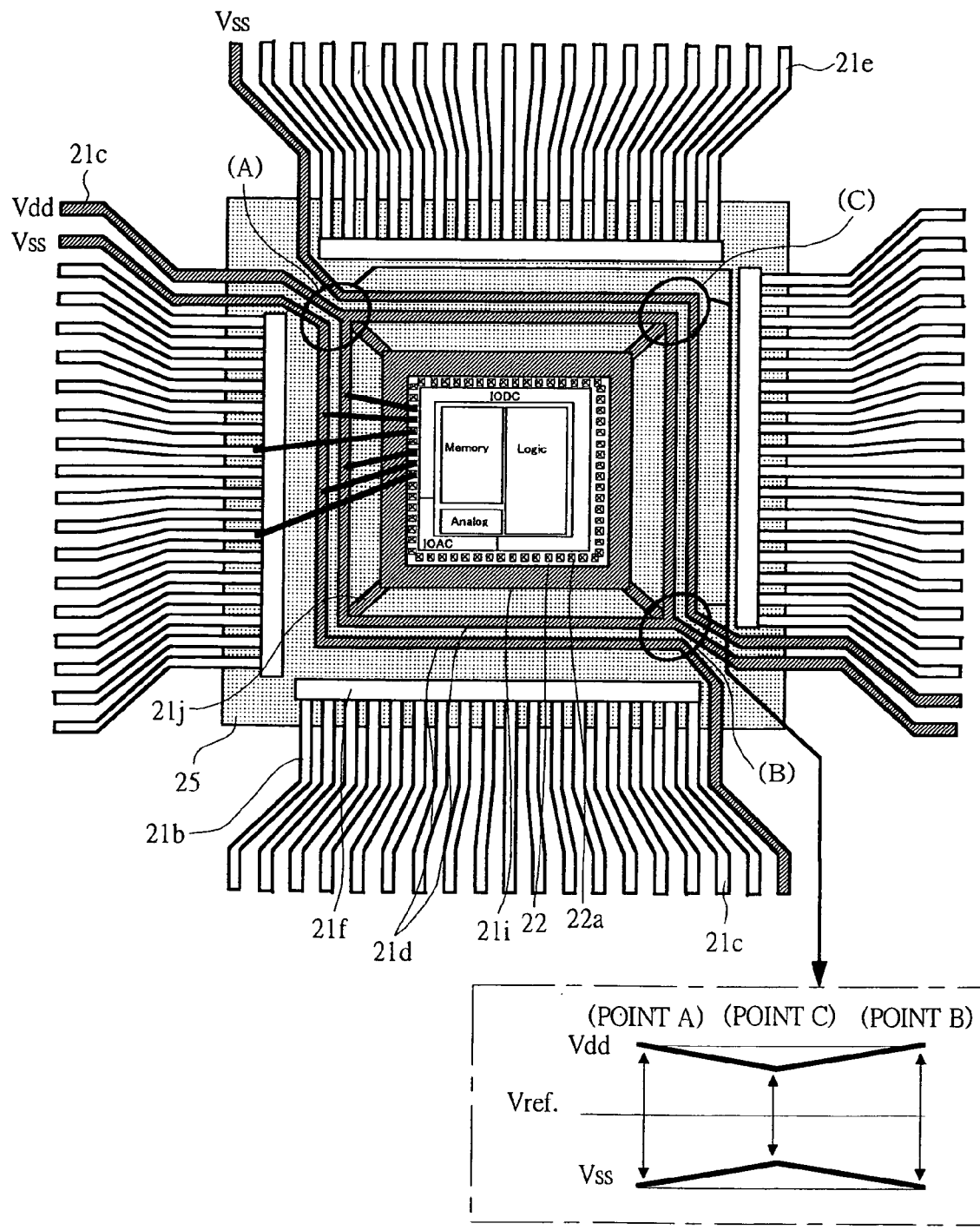
FIG. 83 is a plan view indicating a lead pattern and part of wiring condition in a semiconductor device of embodiment 13 according to the present invention and a power step-down diagram.

The lead pattern of the semiconductor device shown in FIG. 83 is the case when the power is supplied from two opposite corners of the semiconductor device.

That is, it is a construction to supply the power from plural adjacent outer leads 21c in each of opposite two corners via the bus-bar 21d.

Because in this construction, for the potential at point C at the intermediate position as shown in the power supply drop diagram, Vdd lowers and Vss rises, the power supply drop rate can be reduced as compared to the construction shown in FIG. 80 for supplying power from one corner.

That is, the more the number of power supply points, the greater is the reduced power supply drop rate, which is preferable.

Figure 84:
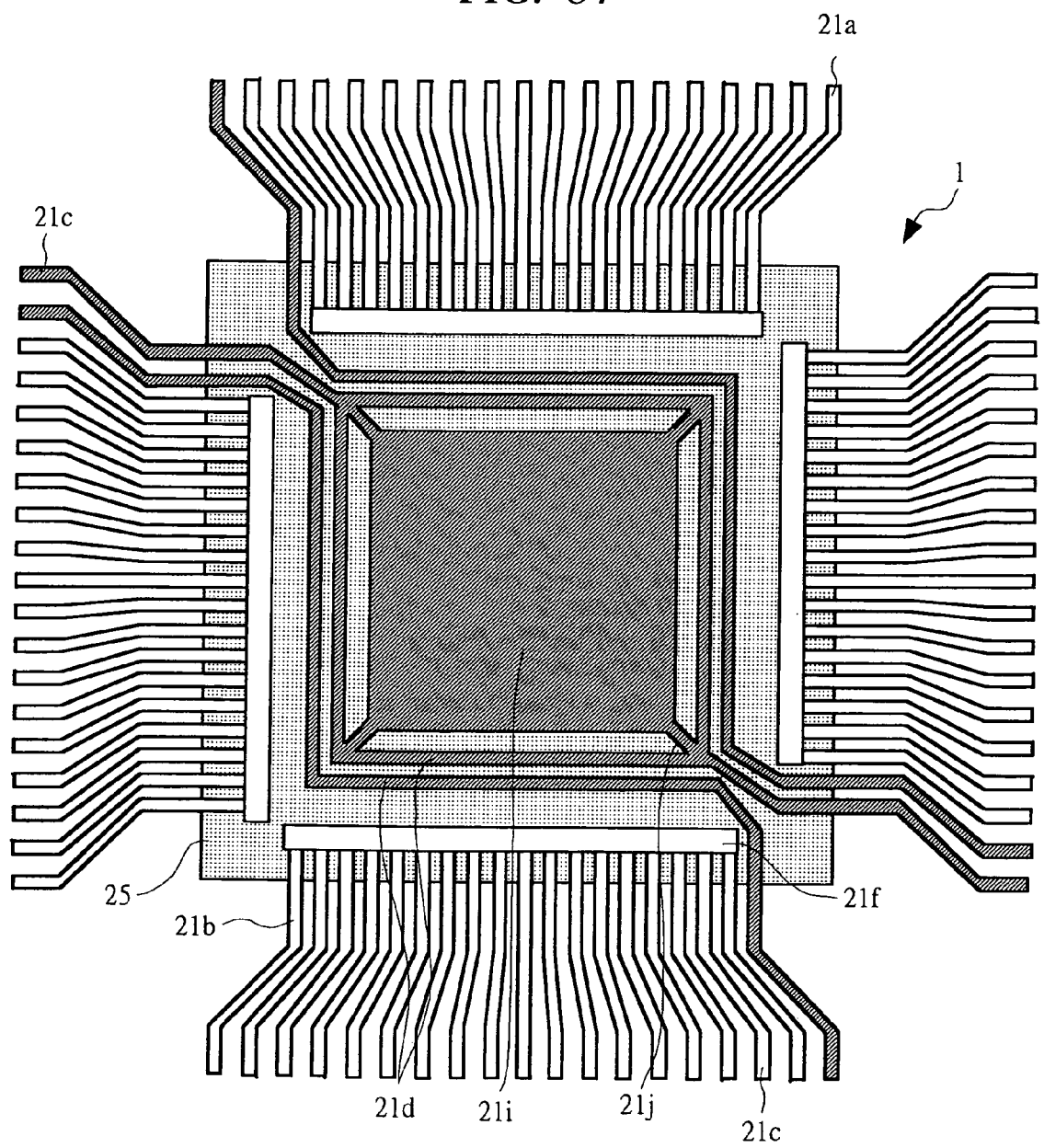
FIG. 84 is a plan view indicating one example of a construction of a lead frame used for the semiconductor device shown in FIG. 83.

In addition, FIG. 84 shows a construction of the lead frame 1 used for the semiconductor device shown in FIG. 83, and the tab 21i comprising copper or other metal sheet is of a large tab construction nearly equal to or larger than the semiconductor chip 22. By the way, the tab 21i is coupled to the inside ring-form bus-bar 21d by four hanging leads 21j.

Because the tab 21i is a large tab coupled to the inside ring-form bus-bar 21d by four hanging leads 21j, the strength of the tape member 5 can be still more increased, and the flatness and the die-bonding capability can be further improved, too.

In addition, because it is a large tab, heat generated from the semiconductor chip 22 can be satisfactorily diffused, and the heat radiation capability of the semiconductor device can be improved.

When a chip with a circuit with particularly big power consumption and with large heat generation from the chip, such as CPU and others of logic circuits, is mounted, to reduce thermal resistance from the semiconductor chip 22 to the tab 21i, it is preferable to use a conductive adhesive such as Ag paste or an adhesive containing conductive particles to affix the semiconductor chip 22 to the tab 21i.

In addition, because in the construction of the present embodiment 13, common power supply potential or grounding potential is supplied to the bus-bar 21d and the tab 21i on the inside periphery, by mounting the semiconductor chip 22 on the tab 21i via the conductive adhesive such as Ag paste, etc., the substrate potential of the semiconductor chip 22 can be made common to the potential of the bus-bar 21d on the inside periphery.

Further, because when in the construction according to the present embodiment 13, the semiconductor chip 22 is mounted on the tab 21i via the insulative adhesive, the capacity can be formed between the substrate potential of the semiconductor chip 22 and the potential of the tab 21i by using the adhesive as an insulation film, the substrate potential of the semiconductor chip 22 can be stabilized, and at the same time, the substrate potential of the semiconductor chip 22 and the potential of the tab 21i can be separated, the degree of freedom in designing the semiconductor chip 22 can be improved.

Embodiment 14

Figure 85:
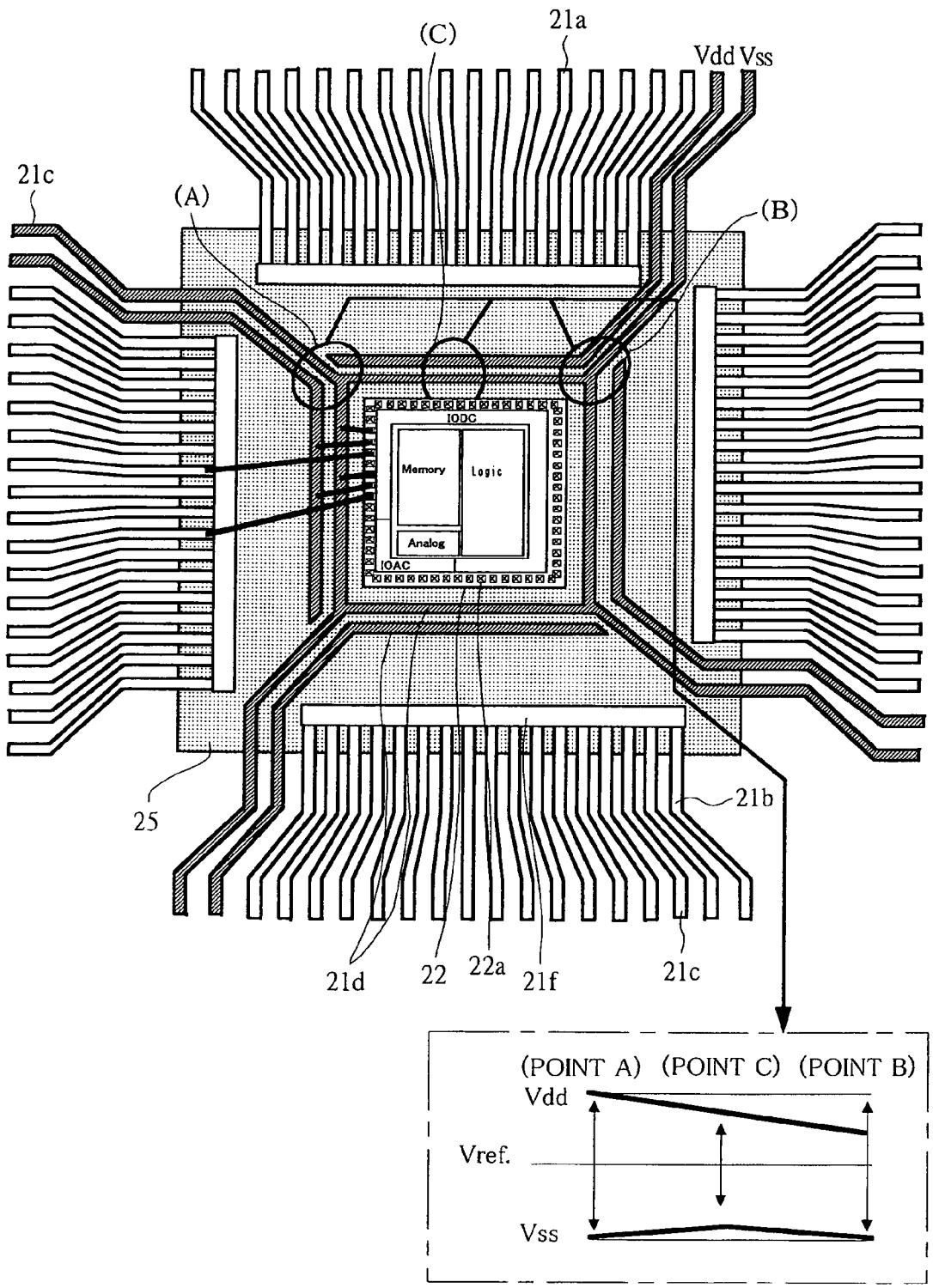
FIG. 85 is a plan view indicating a lead pattern and part of wiring condition in a semiconductor device of embodiment 14 according to the present invention and a power step-down diagram.

The lead pattern of the semiconductor device shown in FIG. 85 is of a construction to take out the Vss power supply in common from the bus-bar 21d to four corners and couple it to the outer leads 21c, respectively, and the take out the Vdd power supply from the respectively independent bus-bars 21d to each corner and couple it to the outer leads 21c.

In such event, the number of pads for Vdd power supply can be reduced.

In addition, as shown in the power supply drop diagram, Vdd rises from point A towards point B, while with respect to the potential at intermediate point C, Vss rises and lowers again further towards point B.

Embodiment 15

Figure 86:
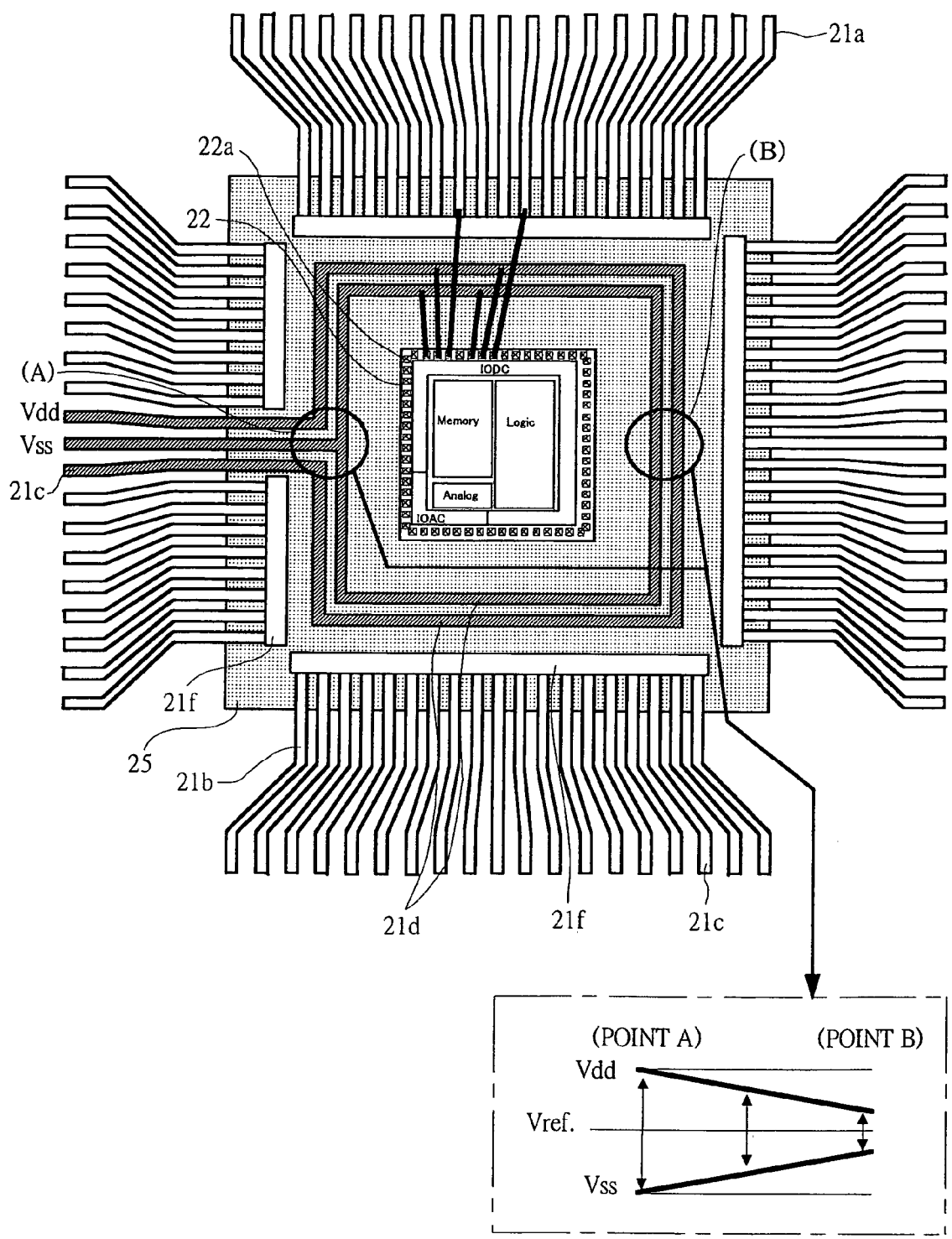
FIG. 86 is a plan view indicating a lead pattern and part of wiring condition in a semiconductor device of embodiment 15 according to the present invention and a power step-down diagram.

The lead pattern of the semiconductor device shown in FIG. 86 indicates a case for supplying the power (Vdd, Vss) from the center of one side of the semiconductor device only, and as shown in the power supply drop diagram, as the distance is remote from the power supply side, the Vss potential rises more and the Vdd lowers more.

In such event, same as the embodiment 12, the reference level (Vref.) can be maintained constantly at the center, and the symmetric property of the power supply can be improved. Consequently, the present embodiment is suited for the circuits used with the reference level entered from the outside, for example, analog circuits or differential amplifier circuits (comparison circuit 22r shown in FIG. 73).

By the way, the power supply side shall not be limited to one place but the power may be supplied from two places or four places, and it is possible to reduce the resistance by increasing the number of power supplying places.

Embodiment 16

Figure 87:
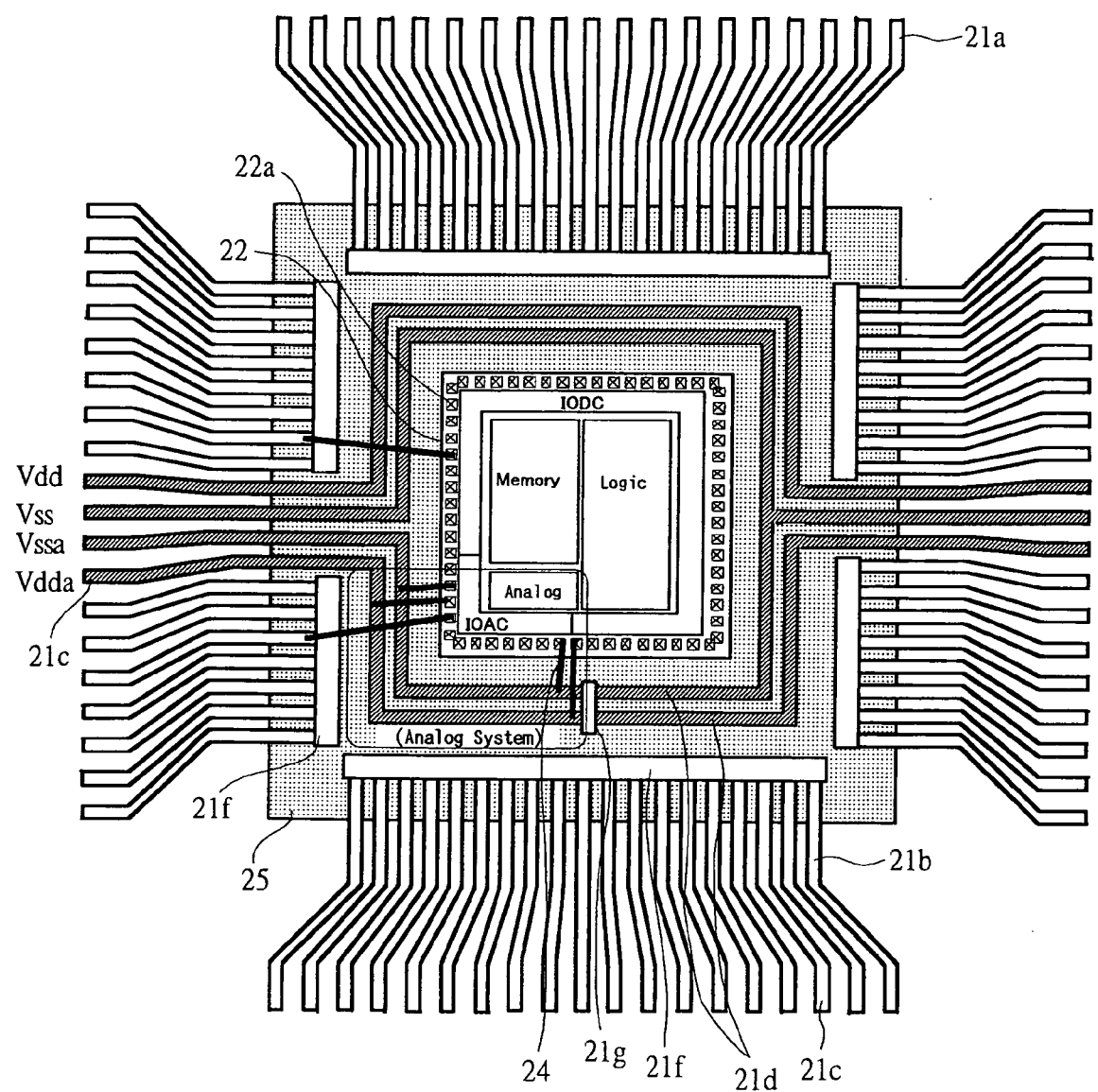
FIG. 87 is a plan view indicating a lead pattern and part of wiring condition in a semiconductor device of embodiment 16 according to the present invention.

The lead pattern of the semiconductor device shown in FIG. 87 is the case in which the bus-bar 21d for the analog circuit and the bus-bar 21d for the digital circuit are separated by the bus-bar cut section 21g.

That is, it is a construction in which the bus-bar 21d for the analog circuit is split from the bus-bar 21d for the digital circuit, and by this, noise generated from the digital signal is not allowed to be picked up by the analog signal and crosstalk of the power supply can be reduced.

Embodiment 17

Figure 88:
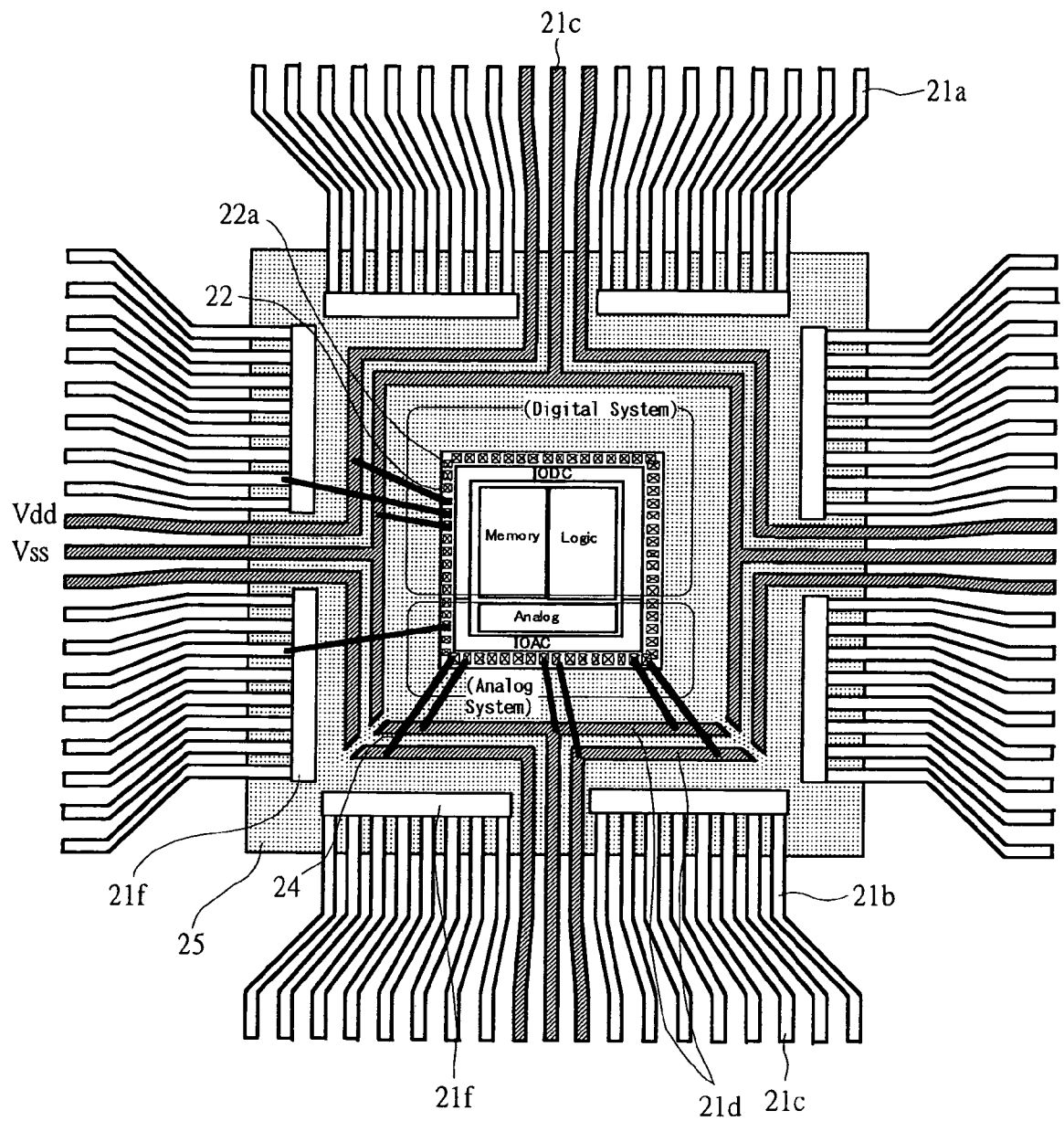
FIG. 88 is a plan view indicating a lead pattern and part of wiring condition in a semiconductor device of embodiment 17 according to the present invention.

The lead pattern of the semiconductor device shown in FIG. 88 is the case in which the bus-bar 21d for the analog circuit and the bus-bar 21d for the digital circuit are separated by the bus-bar cut section 21g, and at the same time, as the lead arrangement of the semiconductor device, on the three sides, the outer lead 21c coupled to the bus-bar 21 for digital circuit is arranged at the center of the lead row, while on one side other than the three sides, the outer lead 21c connected to the bus-bar 21d for the analog circuit is arranged at the center of the lead row.

By this, the power supply crosstalk can be still more reduced.

Embodiment 18

Figure 89:
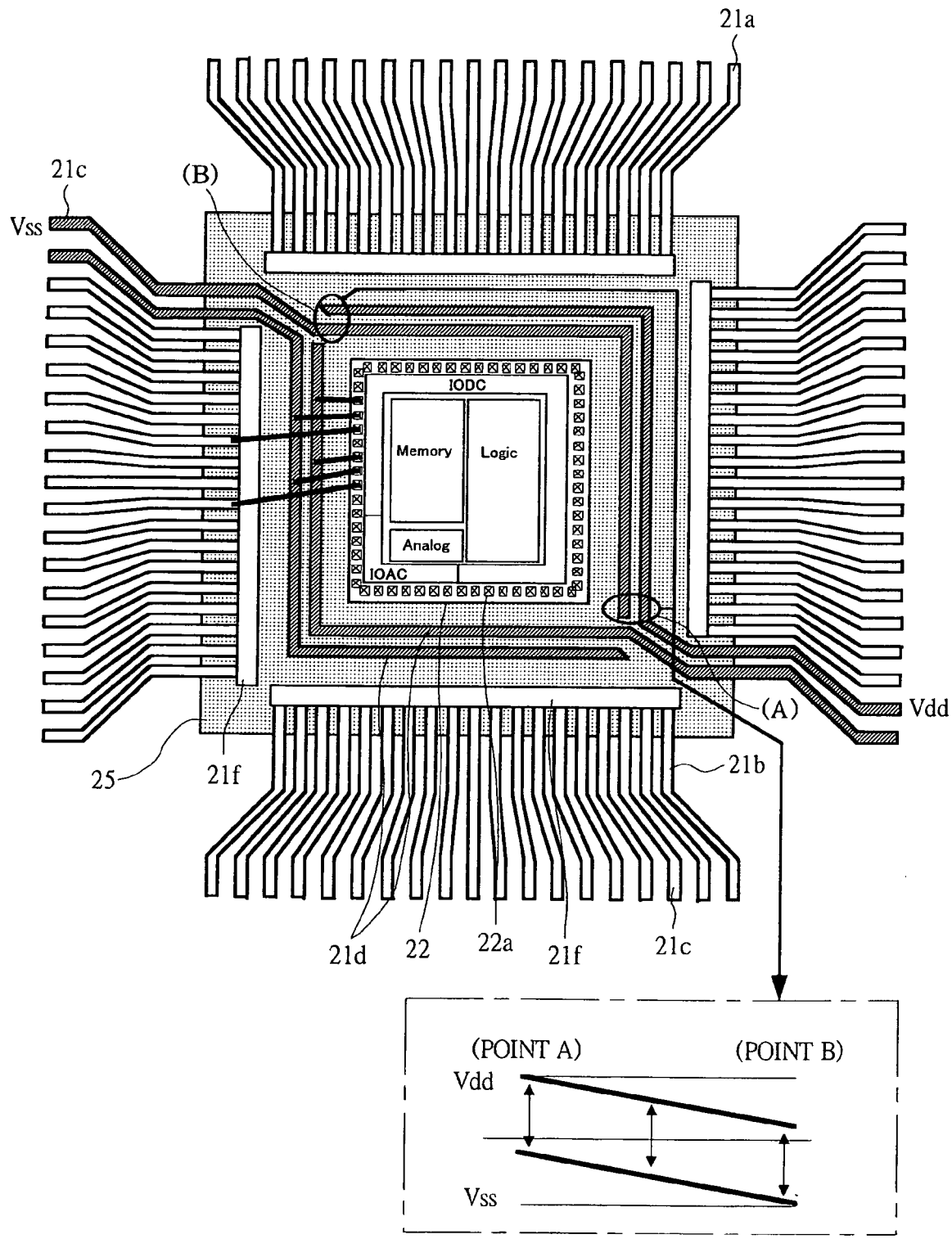
FIG. 89 is a plan view indicating a lead pattern and part of wiring condition in a semiconductor device of embodiment 18 according to the present invention and a power step-down diagram.

The lead pattern of the semiconductor device shown in FIG. 89 is the case in which the outer leads 21c coupled to the bus-bar 21d of a pair of power supply (Vdd, Vss), respectively, are arranged on the opposite sides with the signal outer leads 21c being positioned therebetween, and the power is supplied from two opposite sides.

Figure 90:
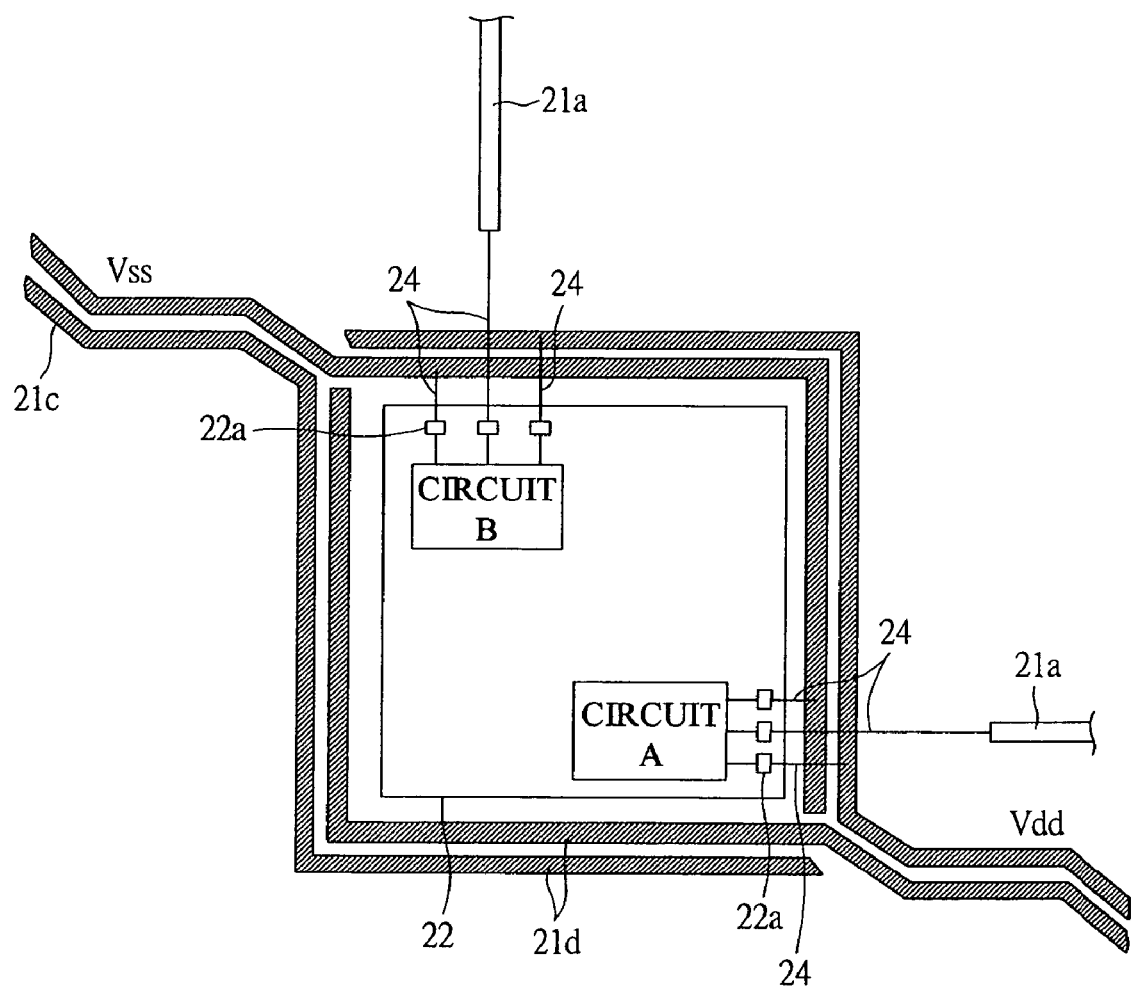
FIG. 90 is an enlarged fragmentary plan view indicating one example of connecting condition of a circuit inside the chip and the bus-bar in the semiconductor device shown in FIG. 89.

That is, as shown in FIG. 90, it is a construction in which in a pair of power supplies comprising Vdd and Vss, either one of the power supply outer leads 21c pulled out from the relevant power supply bus-bars 21d is located onto one corner, and the other power supply outer lead 21c pulled out from the power supply bus-bar 21d is located onto the corner opposite to the other corner on a diagonal line, and the power is supplied to the circuit A and the circuit B from a pair of outer leads 21c arranged on both sides respectively away from each other with the plurality of signal outer leads 21c being positioned therebetween. In such event, for example, the circuit A is a circuit which is arranged in the chip near the point A and the circuit B is the circuit arranged in the chip near the point B.

Because in such event, as shown in the power supply drop diagram of FIG. 89, both Vdd and Vss have the power supply potential lowered across point A and point B, the drop rate of both power supplies can be maintained to the same level, that is, the amplitude between Vdd and Vss can be brought to be nearly constant, and furthermore, variations such as speed, etc. caused by signal amplitude drop in the digital circuit can be reduced.

Consequently, a large power supply driving force can be obtained, and it is suited to, for example, logic circuits, etc.

Meanwhile, the power supply can be supplied from four corners, and a pair of power supplies in such event may be used for the analog circuit and the effect from the logic circuit can be avoided.

Embodiment 19

Figure 91:
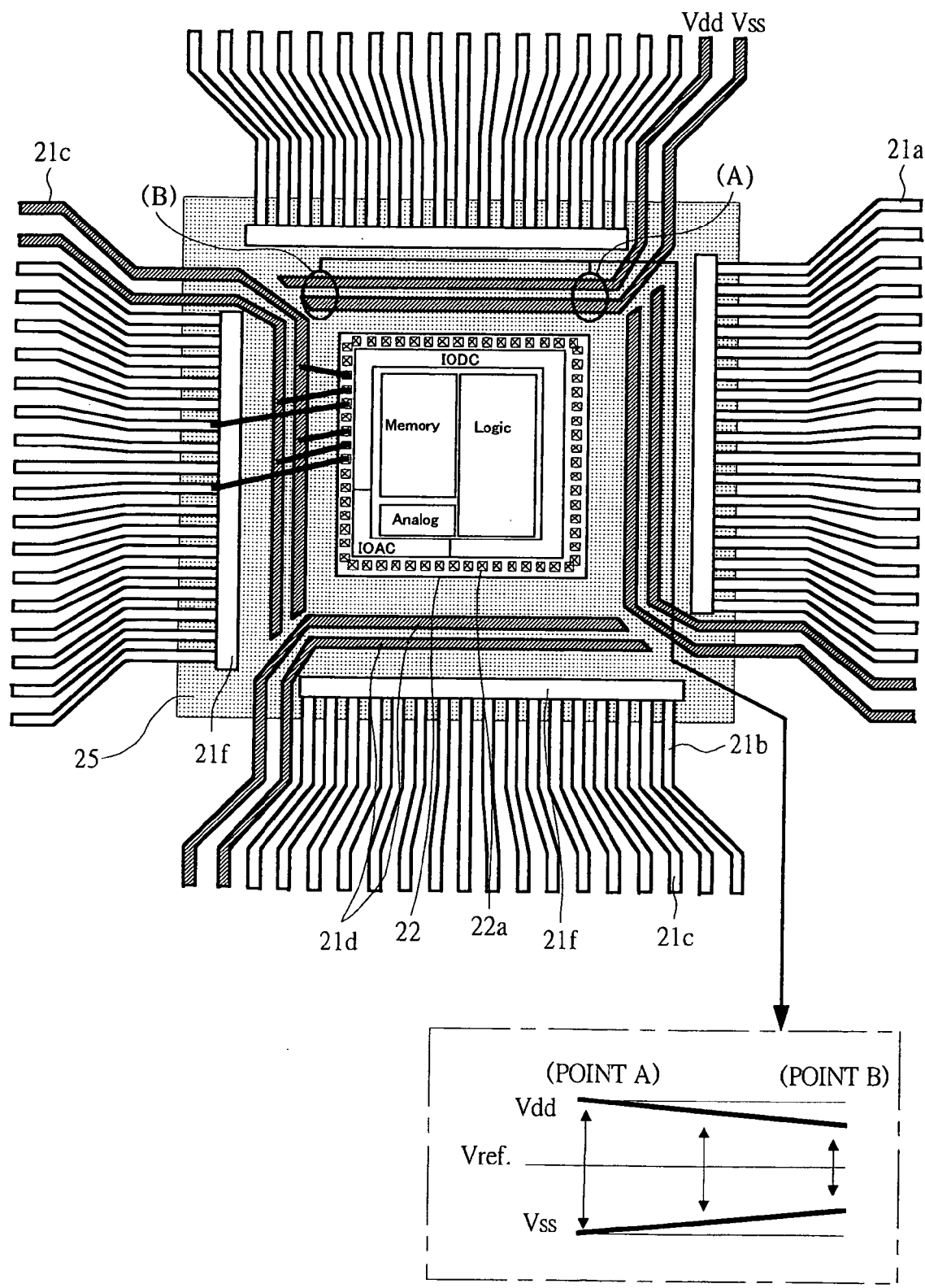
FIG. 91 is a plan view indicating a lead pattern and part of wiring condition in a semiconductor device of embodiment 19 according to the present invention and a power step-down diagram.

The lead pattern of the semiconductor device shown in FIG. 91 is of a construction in which a pair of power supplies (Vdd, Vss) are both supplied from four corners.

That is, it is a construction of arranging two outer leads 21c coupled to the bus-bars 21d of a pair of power supplies (Vdd, Vss) at four corners adjacent to each other and supplying a pair of power supplies (Vdd, Vss) from each of the four corners.

As shown in the power supply drop diagram of FIG. 91, supplying the power from one place causes Vss to rise and Vdd to lower and thereby narrows the potential width, but by supplying the power from four places as is the case of the lead pattern shown in FIG. 91, the drop rate of power supply can be reduced.

In such event, by entering the reference level from the outside such as the differential amplifier circuit (the comparison circuit 22r shown in FIG. 73) and others, the balance can be achieved against Vss/Vdd because the sense level of the input 0/1 judgment level is located at the center on the receiving side, and the circuit margin can be secured.

Embodiment 20

Figure 92:
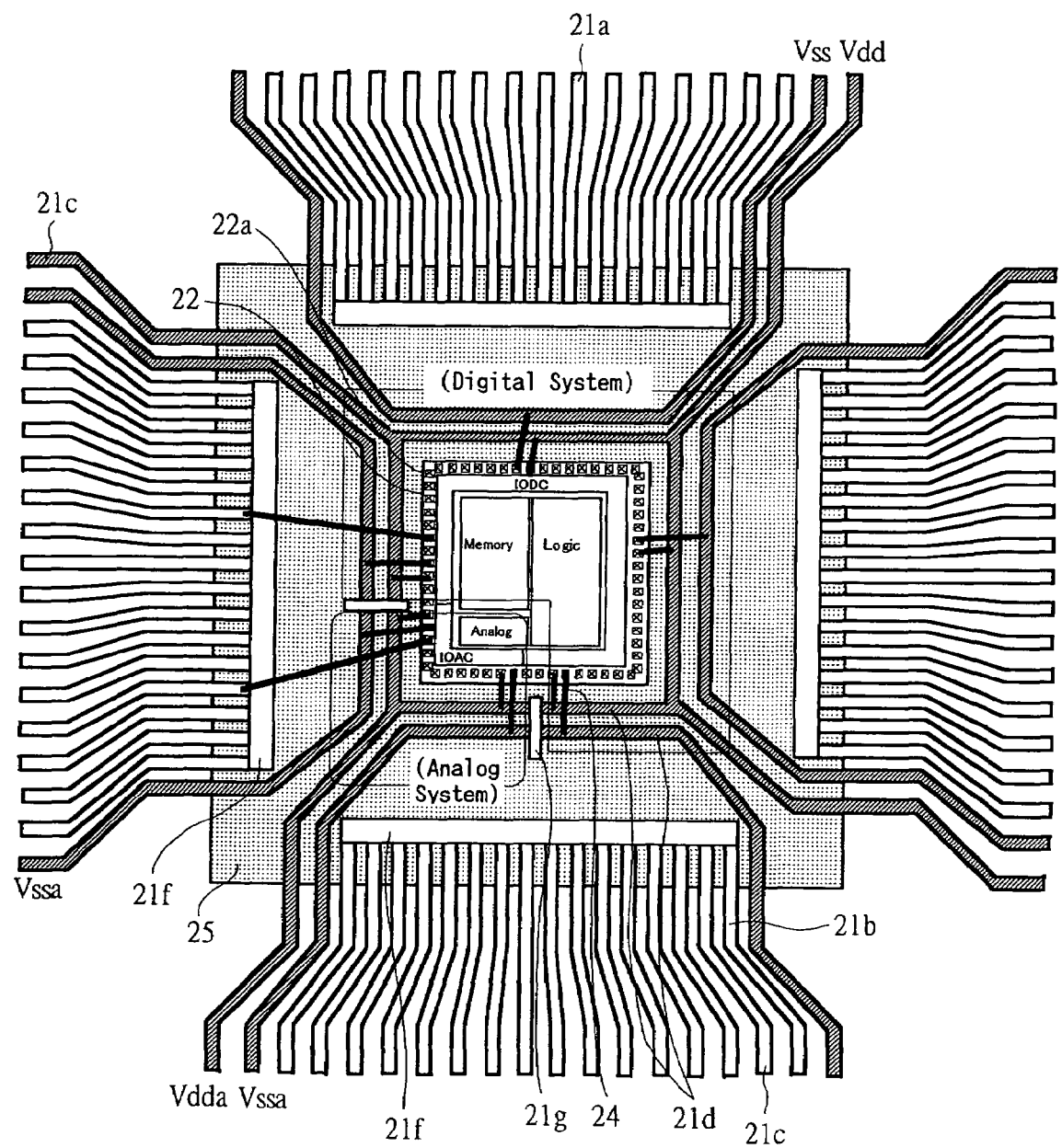
FIG. 92 is a plan view indicating a lead pattern and part of wiring condition in a semiconductor device of embodiment 20 according to the present invention.

The lead pattern of the semiconductor device shown in FIG. 92 is such that the bus-bar 21d for supplying a pair of power supply (Vdd, Vss) is separated and divided into the digital system and the analog system by the bus-bar cut section 21g and furthermore to each of four corners, plural outer leads 21c coupled to these bus-bars 21d are installed, respectively.

In FIG. 92, the outer leads 21c coupled to a pair of digital-based bus-bars 21d are arranged at three corners out of the four corners, while the outer leads 21c coupled to a pair of analog-based bus-bars 21d are arranged at the remaining one corner.

By this construction, analog signals are able to be prevented from picking up noises generated from digital signals and power supply crosstalk can be reduced.

Now, the invention made by the present inventor has been specifically described in accordance wit the embodiments of the invention, but it is understood that the present invention is not limited to the above-mentioned specific embodiments of the invention but various changes and modifications may be made in the invention without departing from the spirit and scope thereof.

In the embodiments 9 through 20, the invention was described referring to the cases of double, triple, and quadruple bus-bars 21d which surround the semiconductor chip 22 as examples, but any number of multiplication of bus-bars 21d may be acceptable as far as at least one pair of bus-bars 21d are included.

INDUSTRIAL APPLICABILITY

As described above, the semiconductor device according to the present invention is suited for a semiconductor package which has outer leads coupled to the bus-bar and in particular, suited for a semiconductor package in which outer leads extend in four directions.

What is claimed is:

1. A semiconductor device comprising:
   a first circuit section formed to be including a first transistor which has a current passage between the first potential and the second potential included;
   a second circuit section formed to be including a second transistor which has a current passage between the third potential and the fourth potential;
   a first pad that supplies the first potential to the first circuit section;
   a second pad that supplies the second potential to the first circuit section;
   a third pad that supplies the third potential to the second circuit section;
   a fourth pad that supplies the fourth potential to the second circuit section;
   a first bus-bar arranged along the direction where the first pad and the second pad are arranged, arranged between a plurality of inner leads and the first and second pads, connected to the first pad by a wire, and supplied with the first potential;
   a second bus-bar arranged along the direction where the first pad and the second pad are arranged, arranged between a plurality of inner leads and the first and second pads, connected to the second pad by a wire, and supplied with the second potential;
   a third bus-bar arranged along the direction where the third pad and the fourth pad are arranged, arranged between a plurality of inner leads and the third and fourth pads, connected to the third pad by a wire, and supplied with the third potential; and
   a fourth bus-bar arranged along the direction where the third pad and the fourth pad are arranged, arranged between a plurality of inner leads and the third and fourth pads, connected to the fourth pad by a wire, and supplied with the fourth potential.

2. The semiconductor device according to claim 1, wherein the first bus-bar has the first inner lead section supplied with the first potential and the third bus-bar has the third inner lead section supplied with the third potential.

3. The semiconductor device according to claim 2, wherein the second bus-bar has the second inner lead section supplied with the second potential and the fourth bus-bar has fourth inner lead section supplied with the fourth potential.

4. The semiconductor device according to claim 2, wherein the second bus-bar is connected to the inner lead by a wire, to which the second potential is supplied, and the fourth bus-bar is connected to the inner lead by a wire, to which the fourth potential is supplied.

5. The semiconductor device according to claim 1 further comprising:
   a fifth pad for supplying a fifth potential to the first circuit section; and
   a fifth bus-bar arranged along the direction where the first pad, the second pad, and the fifth pad are arranged, arranged between a plurality of inner leads and the fifth pad, connected to the fifth pad by a wire, and supplied with the fifth potential.

6. The semiconductor device according to claim 5 further comprising:
   a sixth pad for supplying a sixth potential to the second circuit section; and
   a sixth bus-bar arranged along the direction where the third pad, the fourth pad, and the sixth pad are arranged, arranged between a plurality of inner leads and the sixth pad, connected to the sixth pad by a wire, and supplied with the sixth potential.

7. The semiconductor device according to claim 6, wherein the fifth bus-bar is connected to the inner lead by a wire, to which the fifth potential is supplied, and the sixth bus-bar is connected to the inner lead by a wire, to which the sixth potential is supplied.

8. The semiconductor device according to claim 1, wherein the first circuit section is a digital circuit and the second circuit section is an analog circuit.

9. The semiconductor device according to claim 1, comprising a plurality of the first and the fourth pads.

10. The semiconductor device according to claim 1 wherein the semiconductor chip that contain the first and the second circuit sections and the first to fourth pads, the plurality of inner leads, the first to the fourth bus-bars, and the wire are encapsulated by resin.

11. The semiconductor device according to claim 1 wherein the second circuit section is arranged much more away from the first and the second bus-bars than the first circuit section and the third pad is contained in the second circuit section.

12. The semiconductor device according to claim 1 wherein the second circuit section is connected to the third pad by a wire, contains the fifth pad that supplies the third potential to the second circuit section, and is arranged much more away from the first and the second bus-bars than the first circuit section.

* * * * *